(12) United States Patent
Shin et al.

(10) Patent No.: US 10,973,135 B2
(45) Date of Patent: Apr. 6, 2021

(54) DISPLAY DEVICE

(71) Applicant: LG Display Co., Ltd., Seoul (KR)

(72) Inventors: Mi-Na Shin, Paju-si (KR); ChounSung Kang, Goyang-si (KR); SunBok Song, Ansan-si (KR); GeunChang Park, Goyang-si (KR); Moonsun Lee, Sejong-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/455,174

(22) Filed: Jun. 27, 2019

(65) Prior Publication Data

US 2020/0008308 A1 Jan. 2, 2020

(30) Foreign Application Priority Data

Jun. 28, 2018 (KR) ........................ 10-2018-0075054

(51) Int. Cl.
*H05K 5/00* (2006.01)
*H05K 5/02* (2006.01)
(Continued)

(52) U.S. Cl.
CPC ....... *H05K 5/0017* (2013.01); *H01L 51/5253* (2013.01); *H05K 5/0217* (2013.01); *H05K 5/03* (2013.01); *H01L 2251/5338* (2013.01)

(58) Field of Classification Search
CPC ............... H05K 5/0017; H05K 5/0217; H05K 2201/051; H05K 5/00; H05K 5/02;
(Continued)

(56) References Cited

U.S. PATENT DOCUMENTS 3,999,949 A * 12/1976 Andersson .......... B01L 3/50825
422/500
9,019,696 B2   4/2015 Hamers et al.
(Continued)

FOREIGN PATENT DOCUMENTS

CN    102239683 A   11/2011
CN    106816093 A    6/2017
(Continued)

OTHER PUBLICATIONS

Japanese Office Action dated Sep. 26, 2019, issued in a counterpart Japanese Patent Application No. 2019-121866.
(Continued)

*Primary Examiner* — Xiaoliang Chen
(74) *Attorney, Agent, or Firm* — Morgan, Lewis & Bockius LLP

(57) ABSTRACT

A display device includes a display panel including a display area on which a plurality of display elements is disposed and a non-display area on which one or more wires for driving the plurality of display elements are disposed. A back cover is attached to one surface of the display panel and has a plurality of openings. A roller unit winds or unwinds the back cover and the display panel, and a lifting unit moves the back cover and the display panel in a vertical direction. The plurality of openings overlaps the display panel, and each of the plurality of openings is disposed to be staggered with one or more of the openings in an adjacent row. A size of the back cover is larger than a size of the display panel.

39 Claims, 32 Drawing Sheets

(51) Int. Cl.
*H05K 5/03* (2006.01)
*H01L 51/00* (2006.01)
*H01L 51/52* (2006.01)
*H01L 27/32* (2006.01)
*G06F 1/16* (2006.01)
*G09F 9/30* (2006.01)

(58) Field of Classification Search
CPC .......... H05K 5/03; H01L 51/00; H01L 51/52; H01L 27/32; G06F 1/16; G09F 9/30
USPC ........ 174/66; 361/679.01, 697; 40/514, 517; 345/30, 204
See application file for complete search history.

(56) References Cited

U.S. PATENT DOCUMENTS

| | | | |
|---|---|---|---|
| 9,844,152 | B2 | 12/2017 | Heo et al. |
| 10,074,824 | B2 | 9/2018 | Han et al. |
| 10,274,995 | B2 | 4/2019 | Seo et al. |
| 10,299,391 | B2 | 5/2019 | Kim et al. |
| 10,586,475 | B2 | 3/2020 | Park et al. |
| 10,617,017 | B2 * | 4/2020 | Park ............... H05K 5/0217 |
| 2007/0180745 | A1 | 8/2007 | Ofuji et al. |
| 2008/0212271 | A1 * | 9/2008 | Misawa ............ G02F 1/133305 361/679.01 |
| 2011/0140995 | A1 | 6/2011 | Hamers et al. |
| 2012/0002357 | A1 * | 1/2012 | Auld ............... G09F 9/33 361/679.01 |
| 2012/0204453 | A1 * | 8/2012 | Jung ............... G09F 9/301 40/517 |
| 2016/0064685 | A1 * | 3/2016 | Kim ............... B32B 37/003 257/40 |
| 2016/0363960 | A1 * | 12/2016 | Park ............... G09F 9/301 |
| 2016/0374228 | A1 | 12/2016 | Park et al. |
| 2017/0141168 | A1 | 5/2017 | Choi |
| 2017/0156219 | A1 | 6/2017 | Heo et al. |
| 2017/0156220 | A1 | 6/2017 | Heo et al. |
| 2017/0258640 | A1 * | 9/2017 | Ahsani Ghahreman ............... A61F 13/02 |
| 2017/0278436 | A1 | 9/2017 | Chu |
| 2017/0294495 | A1 * | 10/2017 | Shyu ............... G06F 3/041 |
| 2017/0318689 | A1 * | 11/2017 | Kim ............... G03B 21/58 |
| 2017/0364122 | A1 | 12/2017 | Kim et al. |
| 2017/0367198 | A1 * | 12/2017 | Park ............... H01L 51/5237 |
| 2018/0027672 | A1 * | 1/2018 | Cho ............... H05K 5/0017 361/697 |
| 2018/0059727 | A1 | 3/2018 | Seo et al. |
| 2018/0070466 | A1 | 3/2018 | Kim et al. |
| 2018/0070467 | A1 * | 3/2018 | Kim ............... G06F 1/1652 |
| 2018/0097197 | A1 * | 4/2018 | Han ............... G06F 1/3265 |
| 2018/0114471 | A1 | 4/2018 | Park et al. |
| 2018/0341142 | A1 * | 11/2018 | Choi ............... G06F 1/1643 |
| 2019/0037710 | A1 | 1/2019 | Han |
| 2019/0141843 | A1 | 5/2019 | Park et al. |
| 2019/0150300 | A1 | 5/2019 | Kim et al. |
| 2019/0198783 | A1 | 6/2019 | Kim et al. |

FOREIGN PATENT DOCUMENTS

| | | |
|---|---|---|
| CN | 107527552 A | 12/2017 |
| CN | 107799010 A | 3/2018 |
| CN | 107886846 A | 4/2018 |
| CN | 107993574 A | 5/2018 |
| EP | 3301506 A1 | 4/2018 |
| EP | 3477424 A1 | 5/2019 |
| JP | H11-272205 A | 10/1999 |
| JP | H11272205 A | 10/1999 |
| JP | 2011522299 A | 7/2011 |
| JP | 2015-143843 A | 8/2015 |
| JP | 2017198970 A | 4/2016 |
| KR | 10-2017-0006013 A | 1/2017 |
| KR | 10-2017-0057913 A | 5/2017 |
| KR | 10-2017-0062343 A | 6/2017 |
| KR | 10-2017-0095636 A | 8/2017 |
| KR | 10-2017-0143081 A | 12/2017 |
| KR | 10-2018-0036904 A | 4/2018 |
| TW | I441118 B | 6/2014 |
| TW | I609833 B | 1/2018 |
| TW | M555067 U | 2/2018 |
| WO | 2019093626 A1 | 5/2019 |

OTHER PUBLICATIONS

Notice of Grounds for Rejection dated Aug. 29, 2018, issued in corresponding Korean Patent Application No. 10-2018-0075054.
Decision for Grant of Patent dated Jan. 21, 2019, issued in corresponding Korean Patent Application No. 10-2018-0075054.
Combined Search and Examination Report under Sections 17 and 18(3) dated Aug. 13, 2019 in connection with the counterpart UK Application No. GB1909367.3.
Office Action and Search Report from the China National Intellectual Property Administration (CNIPA) dated Mar. 11, 2020 in a corresponding Chinese application No. 201910576488.5.
Notice of Allowance dated Dec. 30, 2019 from the Taiwan Intellectual Property Office in a counterpart Taiwanese patent application.
Notice of Allowance from the Japanese Patent Office (JPO) dated Mar. 26, 2020 in connection with the counterpart Japanese Patent Application No. 2019-121866.
First Office Action from the DPMA dated Mar. 20, 2020 in connection with the counterpart DE Application No. 10 2019 117 391.4.
Second Office Action from the DPMA dated Sep. 28, 2020 in connection with the counterpart DE Application No. 10 2019 117 391.4 (partial translation included).
Examination Report from the UKIPO dated Dec. 21, 2020 in connection with the counterpart UK Application No. GB1918955.4.
Combined Search and Examination Report from the UKIPO dated Jan. 25, 2021 in connection with the counterpart UK Application No. GB2007352.4.

* cited by examiner

DISPLAY DEVICE

CROSS-REFERENCE TO RELATED APPLICATION(S)

This application claims the benefit and priority of Korean Patent Application No. 10-2018-0075054 filed on Jun. 28, 2018, in the Korean Intellectual Property Office, the disclosure of which is incorporated herein by reference as if fully set forth herein.

BACKGROUND

1. Technical Field

The present disclosure relates to a display device, and more particularly, to a rollable display device which is capable of displaying images even in a rolled state.

2. Description of the Related Art

Display devices used for a monitor of a computer, a television, or a cellular phone include an organic light emitting display device (OLED), which is a self-emitting device, and a liquid crystal display device (LCD), which requires a separate light source.

Display devices have a wide range of diverse applications, including personal digital assistants, as well as monitors of computers and televisions. A display device with a large display area, and reduced volume and weight is being studied.

Recently, a rollable display device manufactured by forming a display unit and a wiring line on a flexible substrate has been receiving attention as a next generation display device. The flexible substrate may be a substrate made with a plastic material which is a flexible material capable of displaying images even though the display device is rolled.

SUMMARY

An object of the present disclosure is to provide a display device which includes a back cover having high rigidity to protect and support a display panel.

Another object of the present disclosure is to provide a display device which includes a back cover having high flexibility and capable of being rolled together with a display panel.

Still another object of the present disclosure is to provide a display device capable of relieving a stress generated when the display device is rolled, thereby minimizing or mitigating potential breakage of a display panel.

Still another object of the present disclosure is to provide a display device capable of minimizing or reducing separation between a display panel and a back cover due to a stress generated when the display device is rolled.

Still another object of the present disclosure is to provide a display device with enhanced adhesiveness between a display panel and a back cover.

Still another object of the present disclosure is to provide a display device capable of minimizing or mitigating a potential problem of bending between a display panel and a surface of a back cover generated when the display panel and a back cover are fastened with a driving unit.

Still another object of the present disclosure is to provide a display device which reduces potential breakage of a driving IC by minimizing the bending of the driving IC when the display device is rolled.

Still another object of the present disclosure is to provide a display device with a side having enhanced rigidity to minimize or mitigate potential breakage of a display device due to an external impact applied to the side of the display device.

Still another object of the present disclosure is to provide a display device which minimizes a risk of an injury of a user by preventing or minimizing a sharp edge of a back cover.

Still another object of the present disclosure is to provide a display device with an improved reliability by minimizing permeation of moisture and oxygen into a display panel.

Still another object of the present disclosure is to provide a display device which minimizes interference of a rear surface of a display device by an edge of the display device when the display device is rolled.

Still another object to be achieved by the present disclosure is to provide a display device which guides a display device so as not to be deviated from a designed position when the display device is rolled.

Objects of the present disclosure are not limited to the specific objects expressed above. Additional features, objects, and advantages of the disclosure, even if not expressed above, will be set forth in the description which follows, and in part will be apparent from the description, or may be learned by practice of the disclosure. The objectives and other advantages of the disclosure may be be realized and attained by the structure particularly pointed out in the written description and claims hereof as well as the appended drawings.

To achieve these and other advantages and in accordance with the purpose of the present disclosure, as embodied and broadly described, a display device includes: a display panel including a display area on which a plurality of display elements is disposed and a non-display area on which one or more wires for driving the plurality of display elements are disposed; a back cover attached to one surface of the display panel and having a plurality of openings; a roller unit which winds or unwinds the back cover and the display panel; and a lifting unit which moves the back cover and the display panel in a vertical direction, wherein the plurality of openings overlaps the display panel, each of the plurality of openings is disposed to be staggered with one or more of the openings in an adjacent row, a size of the back cover is larger than a size of the display panel, and each of a plurality of edges of the back cover corresponds to a respective one of a plurality of edges of the display panel and protrudes outside of the respective one of the plurality of edges of the display panel.

According to another aspect of the present disclosure, a display device includes: a display panel including a display area on which a plurality of display elements is disposed and a non-display area on which one or more wires for driving the plurality of display elements are disposed; a back cover supporting the display panel and having a plurality of openings; a housing unit configured to accommodate the display panel and the back cover; a roller unit configured to wind or unwind the display panel and the back cover in a column direction; and a lifting unit configured to move the display panel and the back cover in or out of the housing unit, wherein a width of the plurality of openings in the column direction is smaller than a width of the plurality of openings in a row direction, a size of the back cover is larger than a size of the display panel, and each of a plurality of edges of the back cover corresponds to a respective one of a plurality of edges of the display panel and protrudes outside of the respective one of the plurality of edges of the display panel.

According to another aspect of the present disclosure, a rollable display device includes: a flexible display panel including a display area on which a plurality of display elements is disposed and a non-display area on which one or more wires for driving the plurality of display elements are disposed; a back cover which is larger than the flexible display panel and is attached to one surface of the flexible display panel; a roller unit which winds or unwinds the back cover and the flexible display panel; and a lifting unit which moves the back cover and the display panel in a vertical direction, wherein the back cover includes a first support area, a second support area, and a malleable area disposed between the first support area and the second support area and having a plurality of openings; the flexible display panel is disposed in the malleable area; and each of a plurality of edges of the back cover protrudes outside of the non-display area of the flexible display panel.

Additional details and features of the exemplary embodiments are included in or may be learned from the detailed description and the drawings.

According to an aspect of the present disclosure, a plurality of openings may be disposed in a back cover to provide a back cover having a high flexibility.

According to another aspect the present disclosure, a plurality of openings may be selectively disposed in a portion of a back cover such that a back cover having both high rigidity and high flexibility may be provided.

According to yet another aspect of the present disclosure, a stress generated when the display device is rolled may be relieved so as to prevent or mitigate potential breakage of the display panel.

According to still another aspect of the present disclosure, the adhesiveness between the display panel and the back cover may be improved to prevent or minimize separation between the display panel and the back cover when the display panel is rolled.

According to yet another aspect of the present disclosure, a flat state of the display panel and the surface of the back cover without being bent may be maintained.

According to still another aspect of the present disclosure, even with the display panel wound around a roller, the driving IC may maintain a flat state to minimize breakage of the driving IC.

According to yet another aspect of the present disclosure, a sharp edge of the back cover may be prevented or minimized to reduce risk of injury.

According to still another aspect of the present disclosure, the rigidity at the side of the back cover may be increased to minimize deformation of the back cover due to an external impact.

According to yet another aspect of the present disclosure, an edge of a display panel may be sealed to minimize moisture and oxygen permeating into the display panel, thereby improving the reliability of the display panel.

According to still another aspect of the present disclosure, the display device may be guided while being rolled or unrolled without deviating from a designed position.

It is to be understood that both the foregoing general description and the following detailed description of the present disclosure are exemplary and explanatory, and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1A:
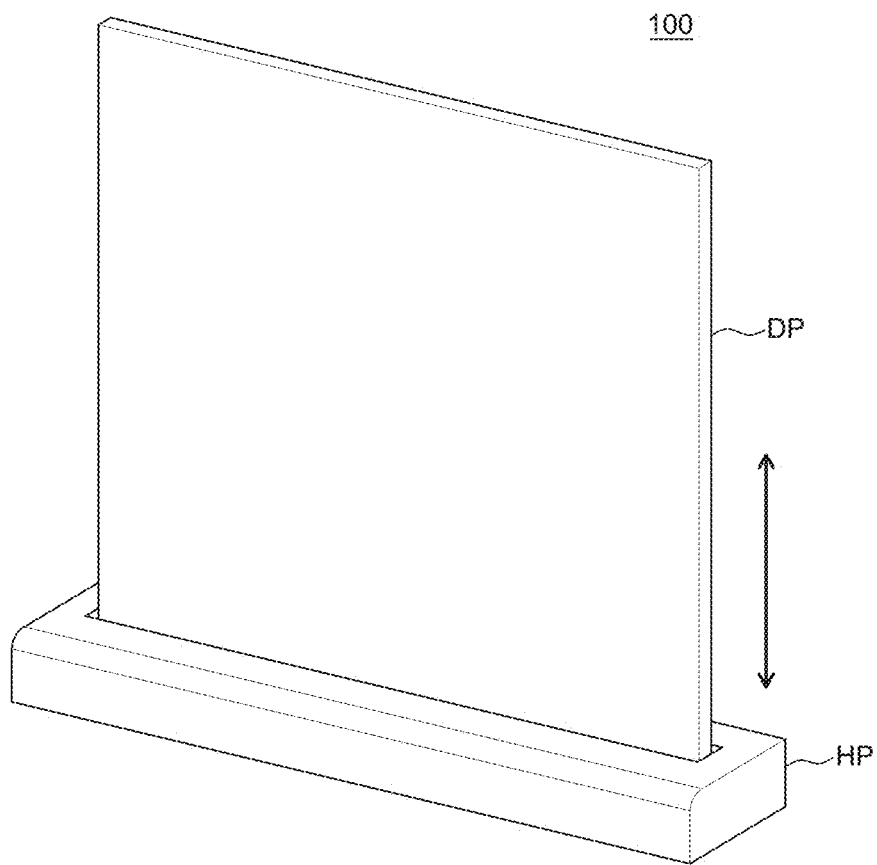
FIGS. 1A and 1B are perspective views of a display device according to an exemplary embodiment of the present disclosure.

Reference will now be made in detail to embodiments of the present disclosure, examples of which are illustrated in the accompanying drawings.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure are merely an example. Thus, the present disclosure is not limited to the illustrated details. Unless otherwise described, like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present specification are used, another part may be added unless a more limiting term, such as "only," is used. The terms of a singular form may include plural forms unless referred to the contrary.

In construing an element, the element is construed as including an error or tolerance range even where no explicit description of such an error or tolerance range is provided.

In describing a position relationship, when a position relation between two parts is described as, for example, "on," "over," "under," or "next," one or more other parts may be disposed between the two parts unless a more limiting term, such as "immediate(ly)" or "direct(ly)," is used. For example, when an element or layer is disposed "on" another element or layer, a third layer or element may be interposed therebetween.

Although the terms "first," "second," and the like may be used herein to describe various elements, these elements should not be limited by these terms as they are not used to define a particular order. These terms are used only to distinguish one element from another. For example, a first element could be termed a second element, and, similarly, a second element could be termed a first element, without departing from the scope of the present disclosure.

A size and a thickness of each component illustrated in the drawings are illustrated for convenience of description, and the present disclosure is not limited to the size and the thickness of the component illustrated, unless otherwise stated.

Features of various embodiments of the present disclosure may be partially or overall coupled to or combined with each other, and may be variously inter-operated with each other and driven technically, as those skilled in the art can sufficiently understand. Embodiments of the present disclosure may be carried out independently from each other, or may be carried out in association with each other.

Hereinafter, a display device according to exemplary embodiments of the present disclosure will be described in detail with reference to accompanying drawings.

<Display Device—Rollable Display Device>

A rollable display device may also be referred to as a display device capable of displaying images even though it is rolled. The rollable display device may have a higher flexibility as compared with a general display device of the related art. Depending on whether the rollable display device is in use, a shape of the rollable display device may be freely varied. Specifically, when the rollable display device is not in use, the rollable display device may be rolled to be stored with a reduced volume. On the other hand, when the rollable display device is in use, the rolled rollable display device may be unrolled to be used, e.g., to display images.

Figure 1B:
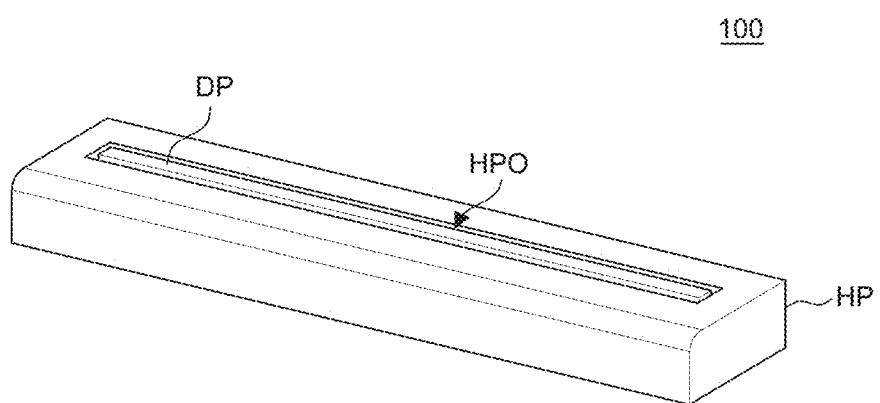

FIGS. 1A and 1B are perspective views of a display device according to an exemplary embodiment of the present disclosure. As shown in FIGS. 1A and 1B, a display device 100 according to an exemplary embodiment of the present disclosure includes a display unit DP and a housing unit HP.

The display unit DP is a structure for displaying images to a user. For example, the display unit DP may include a display element and a circuit, a wiring line, and a component for driving the display element. In this case, since the display device 100 according to an exemplary embodiment of the present disclosure is a rollable display device 100, the display unit DP may be configured to be wound and unwound. For example, the display unit DP may include a display panel and a back cover each having a flexibility to be wound or unwound. The display unit DP will be described below in more detail with reference to FIGS. 5 to 7B.

The housing unit HP is a case in which the display unit DP may be accommodated. The display unit DP may be wound to be accommodated in the housing unit HP, for example, as shown in FIG. 1B. The display unit DP may be unwound to be disposed outside the housing unit HP, for example, as shown in FIG. 1A.

The housing unit HP may have an opening HPO to allow the display unit DP to be wound into the housing unit HP and to be unwound out of the housing unit HP. The display unit DP may move through the opening HPO of the housing unit HP in a vertical direction.

The display unit DP of the display device 100 may be switched from a fully unwound state to a fully wound state or from a fully wound state to a fully unwound state.

FIG. 1A illustrates the display unit DP of the display device 100 in the fully unwound state. In the fully unwound state, the display unit DP of the display device 100 is disposed outside of the housing unit HP. That is, in order for a user to view images on the display device 100, the display unit DP may be unwound to be disposed outside of the housing unit HP as much as possible. When the display unit DP cannot be further unwound, it may be defined as a fully unwound state.

FIG. 1B illustrates the display unit DP of the display device 100 in the fully wound state. In the fully wound state, the display unit DP of the display device 100 is accommodated in the housing unit HP and cannot be further wound. That is, when the user is not watching the images through the display device 100, it may be more advantageous from the viewpoint of an outer appearance that the display unit DP is not disposed outside of the housing unit HP. Therefore, when the display unit DP is wound to be accommodated in the housing unit HP, it may be defined as a fully wound state. Further, when the display unit DP is in a fully wound state to be accommodated in the housing unit HP, the volume of the display device 100 is reduced and the display device 100 may be more easily carried.

In order to switch the display unit DP between a fully unwound state and a fully wound state, a driving unit is provided to wind or unwind the display unit DP.

<Driving Unit>

Figure 2:
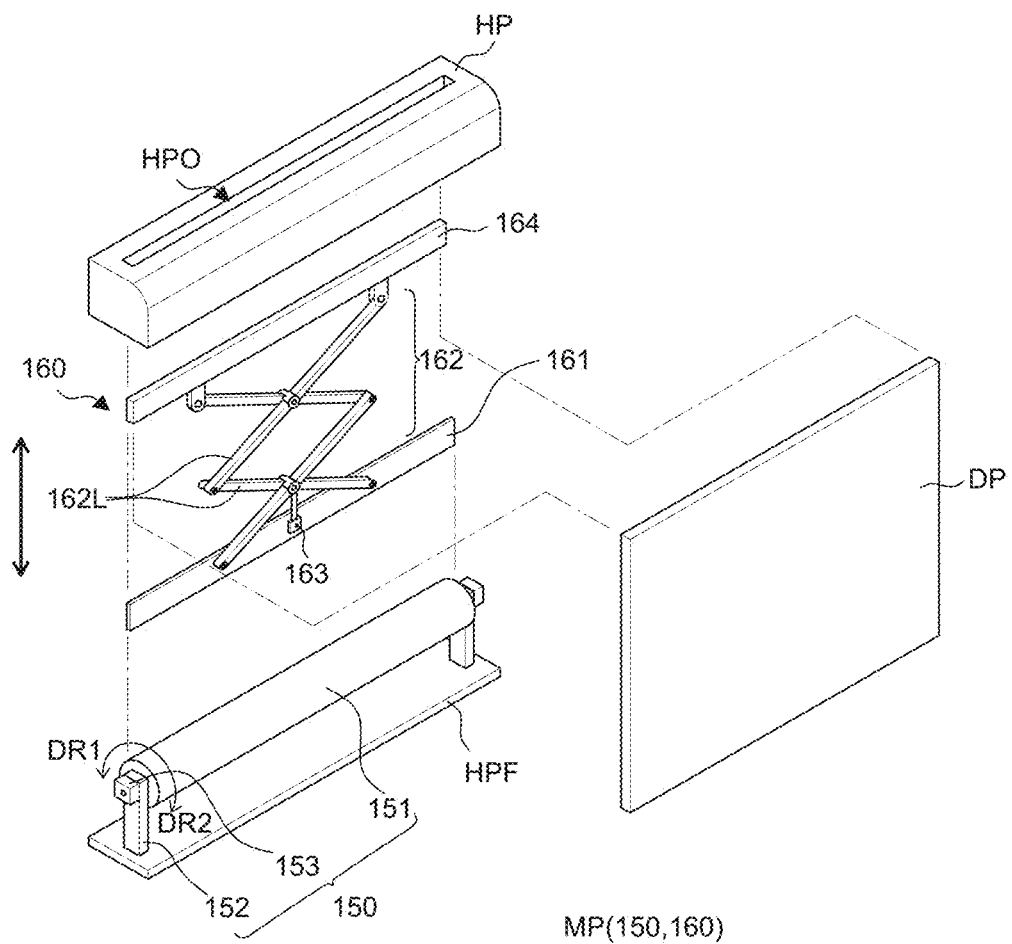
FIG. 2 is an exploded perspective view of a display device according to an exemplary embodiment of the present disclosure.
Figure 3:
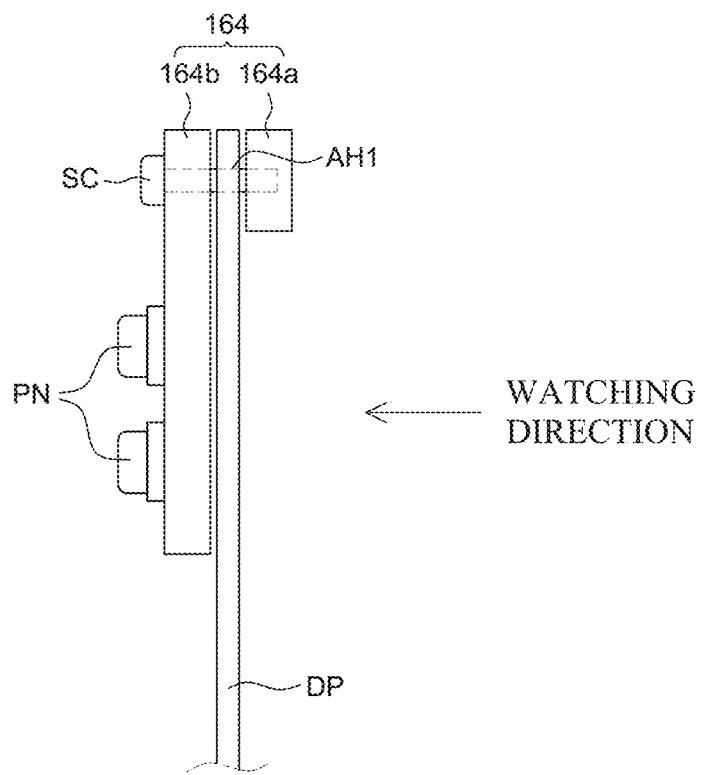
FIG. 3 is a schematic cross-sectional view for explaining a head bar and a display unit of a display device according to an exemplary embodiment of the present disclosure.
Figure 4:
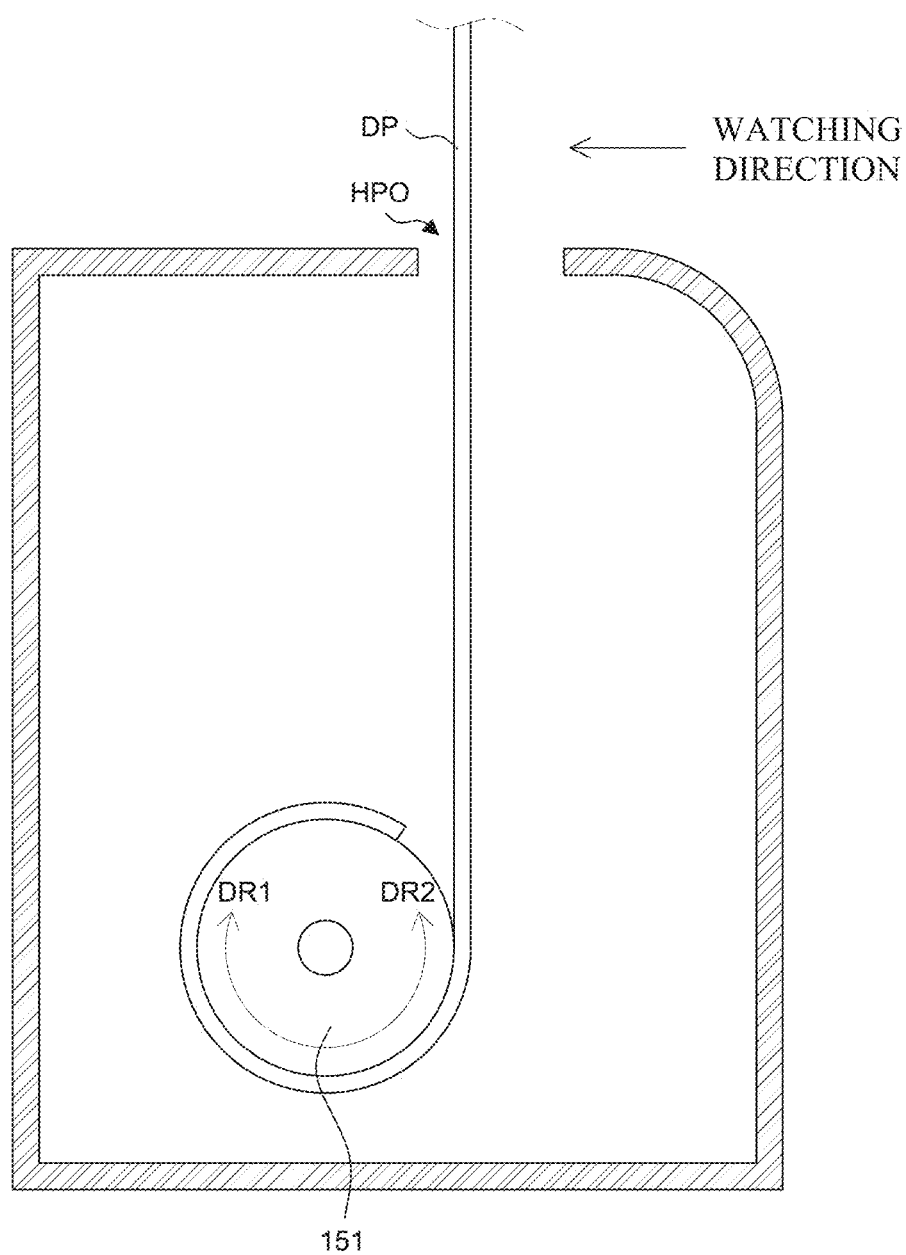
FIG. 4 is a cross-sectional view of a display device according to an exemplary embodiment of the present disclosure.

FIG. 2 is an exploded perspective view of a display device according to an exemplary embodiment of the present disclosure. FIG. 3 is a schematic cross-sectional view for explaining a head bar 164 and a display unit DP of a display device according to an exemplary embodiment of the present disclosure. FIG. 4 is a cross-sectional view of a display device according to an exemplary embodiment of the present disclosure. FIG. 4 is a schematic cross-sectional view for explaining a roller 151 and a display unit DP of a display device 100 according to an exemplary embodiment of the present disclosure. For the convenience of description, FIG. 3 illustrates only a head bar 164 and a display unit DP, and FIG. 4 illustrates only a housing unit HP, a roller 151, and a display unit DP.

First, as illustrated in FIG. 2, a driving unit MP includes a roller unit 150 and a lifting unit 160.

A roller unit 150 may wind or unwind the display unit DP connected to the roller unit 150 while rotating in a first direction DR1 or a second direction DR2. The roller unit 150 may include a roller 151, a roller support unit 152, and a roller rotating unit 153.

The roller 151 is a member around which the display unit DP may be wound. The roller 151 may, for example, have a cylindrical shape. A lower edge of the display unit DP may be fixed to the roller 151. When the roller 151 rotates, the display unit DP fixed to the roller 151 through the lower edge may be wound around the roller 151. On the other hand, when the roller 151 rotates in an opposite direction, the display unit DP which is wound around the roller 151 may be unwound from the roller 151.

The roller support units 152 may support the roller 151 at both sides of the roller 151. Specifically, the roller support units 152 may be disposed on a bottom plate HPF of the housing unit HP. Upper sides of the roller support units 152 may be coupled to both ends of the roller 151, respectively. Therefore, the roller support units 152 may support the roller 151 to be spaced apart from the bottom plate HPF of the housing unit HP. In this case, the roller 151 may be rotatably coupled to the roller support units 152.

The roller rotating units 153 may rotate the roller 151 in the first direction DR1 or the second direction DR2. The roller rotating units 153 may be disposed in a pair of roller support units 152, respectively. For example, the roller rotating units 153 may be rotary motors which transmit a torque to the roller 151, but are not limited thereto.

The lifting unit 160 may move the display unit DP in a vertical direction in accordance with the driving of the roller unit 150. The lifting unit 160 may include a link support unit 161, a link unit 162, a link lifting unit 163, and a head bar 164.

The link support unit 161 may support the link unit 162 and the link lifting unit 163. Specifically, the link support unit 161 may support the link unit 162 and the display unit DP which may move in the vertical direction so as not to collide with a boundary of the opening HPO of the housing unit HP. The link support unit 161 may support the link unit 162 and the display unit DP to move only in a vertical direction without moving in forward and backward directions.

The link unit 162 may include a plurality of links 162L hinged with each other. The plurality of links 162L may be rotatably hinged to each other to be moved in the vertical direction by the link lifting unit 163. When the link unit 162 moves in the vertical direction, the plurality of links 162L may rotate to be farther away from each other or closer to each other. Detailed description thereof will be made with reference to FIG. 4.

The link lifting unit 163 may move the link unit 162 in the vertical direction. The link lifting unit 163 may rotate the plurality of links 162L of the link unit 162 to be closer to each other or rotate the plurality of links 162L to be farther away from each other. The link lifting unit 163 may lift or lower the link unit 162 to lift or lower the display unit DP connected to the link unit 162.

In this case, the link lifting unit 163 may be driven in synchronization with the roller rotating unit 153 so that the roller unit 150 and the lifting unit 160 may simultaneously operate. For example, when the display unit DP is to be switched from a fully unwound state to a fully wound state, the roller unit 150 may operate to wind the display unit DP around the roller 151. Simultaneously with this, the lifting unit 160 may operate to rotate the plurality of links 162L of the link unit 162 to lower the display unit DP. Further, when the display unit DP is to be switched from a fully wound state to a fully unwound state, the roller unit 150 may operate to unwind the display unit DP from the roller 151. Simultaneously with this, the lifting unit 160 may operate to rotate the plurality of links 162L of the link unit 162 to lift the display unit DP.

The head bar 164 of the lifting unit 160 may be fixed to an uppermost end of the display unit DP. The head bar 164 may be coupled to the link unit 162 to move the display unit DP in the vertical direction in accordance with the rotation of the plurality of links 162L of the link unit 162. That is, the display unit DP may move in the vertical direction by the link unit 162 coupled to the head bar 164 and the link lifting unit 163.

As illustrated in FIG. 3, the head bar 164 may be disposed at the uppermost end of the display unit DP so as to cover a portion of a front surface and a portion of a rear surface of the display unit DP.

The head bar 164 may include a first head bar 164a and a second head bar 164b. The first head bar 164a may cover a portion of the front surface of the display unit DP. The first head bar 164a may cover only a part of the front surface adjacent to an uppermost edge of the display unit DP so as not to cover an image displayed on the front surface of the display unit DP.

The second head bar 164b may cover a portion of the rear surface of the display unit DP. The second head bar 164b may cover a part of the rear surface adjacent to the uppermost edge of the display unit DP. However, where no image is displayed on the rear surface of the display unit DP, the second head bar 164b may overlap a larger portion of the display unit DP than the first head bar 164a.

In order to fasten the display unit DP with the first head bar 164a and the second head bar 164b, a first fastening hole AH1 may be formed in the display unit DP. A screw SC may penetrate the first fastening hole AH1 to fasten the first head bar 164a, the display unit DP, and the second head bar 164b together.

Pem nuts PN may be disposed in the second head bar 164b and be connected to the link unit 162 of the lifting unit 160. The second head bar 164b and the link unit 162 of the lifting unit 160 may be fastened with each other by the pem nuts PN. Therefore, when the link unit 162 of the lifting unit 160 moves in the vertical direction, the second head bar 164b fastened with the link unit 162, and the first head bar 164a and the display unit DP fastened with the second head bar 164b may move together in the vertical direction.

Even though the first head bar 164a and the second head bar 164b are illustrated in FIG. 2 to have a linear shape, the shapes of the first head bar 164a and the second head bar 164b are not limited there to and may be changed in various forms.

Hereinafter, a driving operation of the driving unit MP will be described in detail with reference to FIG. 4.

As shown in FIG. 4, a lower edge of the display unit DP may be coupled to the roller 151. When the roller 151 is rotated in the first direction DR1, that is, a clockwise direction, by the roller rotating unit 153 (FIG. 2), the display unit DP may be wound around the roller 151 so that a rear surface of the display unit DP is in close contact with a surface of the roller 151.

On the other hand, when the roller 151 is rotated in the second direction DR2, that is, a counter clockwise direction, by the roller rotating unit 153, the display unit DP wound around the roller 151 may be unwound from the roller 151 to be disposed outside of the housing unit HP.

In some exemplary embodiments, the display device 100 may include a driving unit MP having a different structure than the above-described driving unit MP. That is, as long as the display unit DP can be wound and unwound, the above-described configuration of the roller unit 150 and the lifting unit 160 may be modified, some elements may be omitted, or other elements may be added.

<Display Unit>

Figure 5:
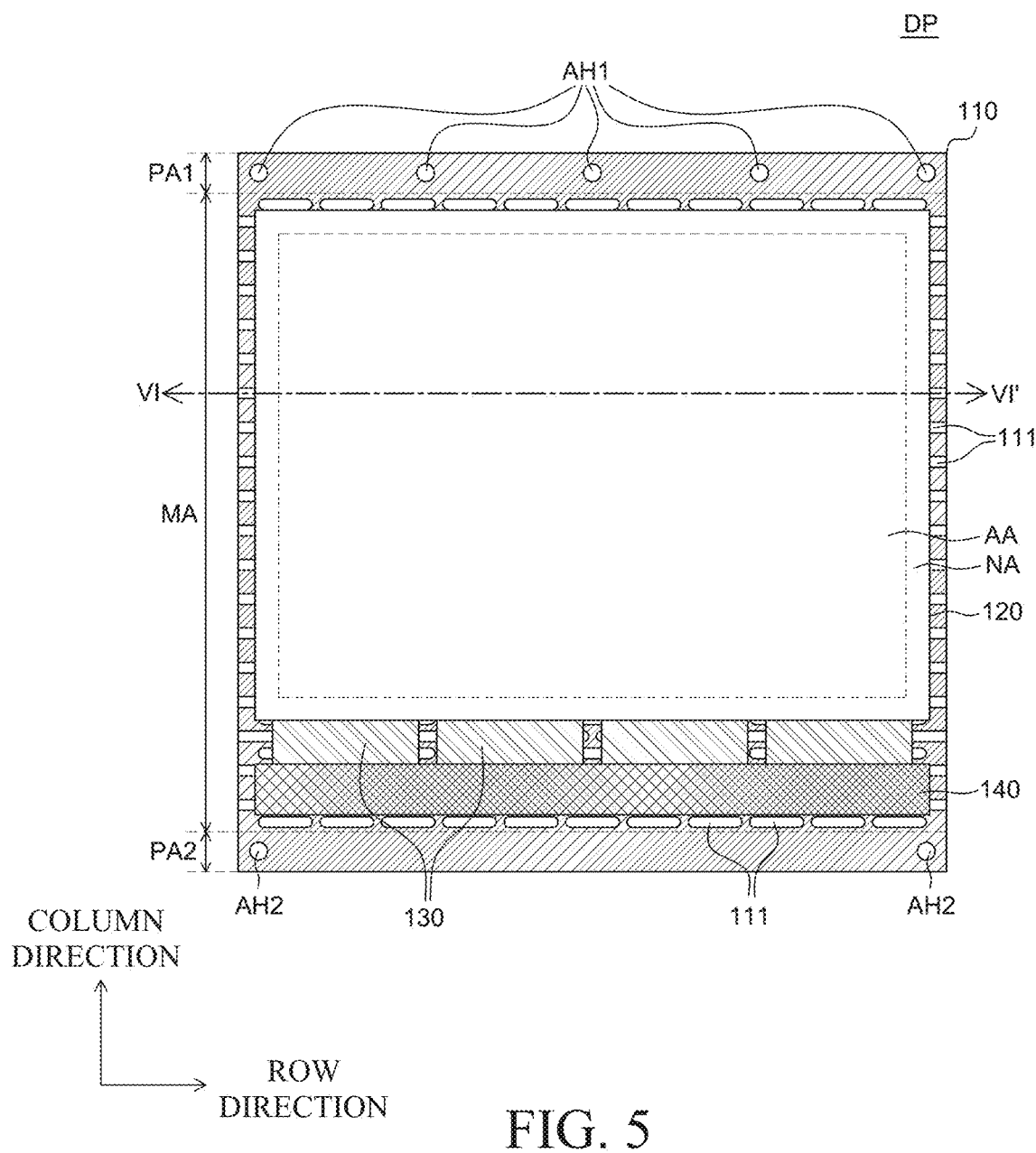
FIG. 5 is a plan view of a display unit of a display device according to an exemplary embodiment of the present disclosure.
Figure 6:
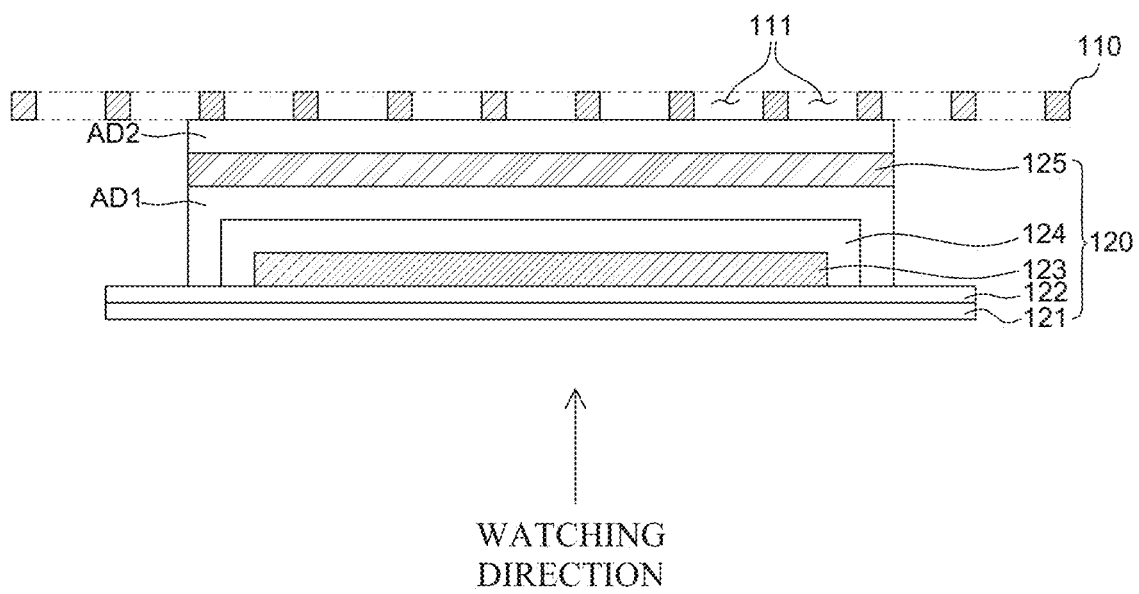
FIG. 6 is a cross-sectional view taken along the line VI-VI' of FIG. 5.

FIG. 5 is a plan view of a display unit DP of a display device according to an exemplary embodiment of the present disclosure. FIG. 6 is a cross-sectional view taken along the line VI-VI' of FIG. 5.

As illustrated in FIG. 5, the display unit DP may include a back cover 110, a display panel 120, a flexible film 130, and a printed circuit board 140.

The display panel 120 is a panel for displaying images, for example, to a user. The display panel 120 may include a display element to display images, a driving element to drive the display element, and wiring lines to transmit various signals to the display element and the driving element. The display element may be defined in different ways depending on a type of the display panel 120. For example, if the display panel 120 is an organic light emitting display panel, the display element may be an organic light emitting diode which includes an anode, an organic light emitting layer, and a cathode. For example, if the display panel 120 is a liquid crystal display panel, the display element may be a liquid crystal display element. Hereinafter, even though the display panel 120 may be described as an organic light emitting display panel as an example, the display panel 120 is not limited to the organic light emitting display panel. Further, since the display device 100 according to an exemplary embodiment of the present disclosure is a rollable display device, the display panel 120 may be implemented as a flexible display panel to be wound around or unwound from the roller 151.

The display panel 120 may include a display area AA and a non-display area NA.

The display area AA is an area where images may be displayed in the display panel 120. In the display area AA, a plurality of sub pixels and a circuit for driving the plurality of sub pixels may be disposed. The plurality of sub pixels represent minimum units which configure the display area AA, and a display element may be disposed in each of the plurality of sub pixels. For example, an organic light emitting diode including an anode, an organic light emitting layer, and a cathode may be disposed in each of the plurality of sub pixels, but it is not limited thereto. Further, a circuit for driving the plurality of sub pixels may include a driving element and a wiring line. For example, the circuit may be formed of a thin film transistor, a storage capacitor, a gate line, and a data line, but is not limited thereto.

The non-display area NA of the display panel 120 is an area where no image can be displayed. In the non-display area NA, various wiring lines and circuits for driving the organic light emitting diode of the display area AA may be disposed. For example, in the non-display area NA, a link line to transmit signals to the plurality of sub pixels and circuits of the display area AA, or a driving IC such as a gate driver IC or a data driver IC may be disposed, but the non-display area is not limited thereto.

The flexible film 130 may be a film in which various components are disposed on a base film having a malleability. The flexible film 130 may supply a signal to the plurality of sub pixels and the circuits of the display area AA, and may be electrically connected to the display panel 120. The flexible film 130 may be disposed at one end of the non-display area NA of the display panel 120 to supply a power voltage or a data voltage to the plurality of sub pixels and the circuits of the display area AA. Even though four flexible films 130 are illustrated in FIG. 5 as an example, the number of flexible films 130 may vary depending on the design and is not limited to the illustrated example.

A driving IC, such as a gate driver IC or a data driver IC, may be disposed on the flexible film 130. The driving IC may be a component to process data for displaying images and a driving signal for processing the data. The driving IC may be disposed by a chip on glass (COG), a chip on film (COF), or a tape carrier package (TCP) technique depending on a mounting method. However, for the convenience of description, the driving IC may be described, for example, as being mounted on the flexible film 130 by a chip on film technique, but is not limited thereto.

The printed circuit board 140 may be disposed at one end of the flexible film 130 to be connected to the flexible film 130. The printed circuit board 140 may be a component to supply signals to the driving IC. The printed circuit board 140 may supply various signals, such as a driving signal or a data signal, to the driving IC. Various components may be disposed on the printed circuit board 140. For example, a timing controller or a power source unit may be disposed on the printed circuit board 140. In the meantime, even though one printed circuit board 140 is illustrated in FIG. 5 as an example, the number of printed circuit boards 140 may vary depending on the design and is not limited thereto.

The back cover 110 may be disposed on rear surfaces of the display panel 120, the flexible film 130, and the printed circuit board 140 to support the display panel 120, the flexible film 130, and the printed circuit board 140. Therefore, a size of the back cover 110 may be larger than a size of the display panel 120. The back cover 110 may protect other components of the display unit DP from any external impact. Even though the back cover 110 may be formed of a material having a rigidity, at least a part of the back cover 110 may have a flexibility to be wound or unwound together with the display panel 120. For example, the back cover 110 may be formed of a metal material, such as steel use stainless (SUS) or invar, or a plastic material. However, if the material of the back cover 110 satisfies physical conditions such as a thermal strain amount, a radius of curvature, and rigidity, the material may be diversely changed, and is not limited thereto.

As shown in FIG. 6, the display panel 120 may include a substrate 121, a buffer layer 122, a pixel unit 123, an encapsulation layer 124, and an encapsulation substrate 125.

The substrate 121, which is a base member for supporting various components of the display panel 120, may be formed of an insulating material. The substrate 121 may be formed of a material having a flexibility to allow the display panel 120 to be wound or unwound and, for example, may be formed of a plastic material such as polyimide PI.

The buffer layer 122 may suppress moisture and/or oxygen permeating from the outside of the substrate 121 from being diffused. The buffer layer 122 may be formed of a single layer or a double layer of silicon oxide SiOx and silicon nitride SiNx, but is not limited thereto.

The pixel unit 123 may include a plurality of organic light emitting diodes and a circuit for driving the plurality of organic light emitting diodes. The pixel unit 123 may be in an area corresponding to the display area AA. The organic light emitting diode may include an anode, an organic light emitting layer, and a cathode.

The anode may supply holes to the organic light emitting layer and be formed of a conductive material having a high work function. For example, the anode may be formed of tin oxide (TO), indium tin oxide (ITO), indium zinc oxide (IZO), or indium zinc tin oxide (ITZO), but is not limited thereto.

The organic light emitting layer may be supplied with holes from the anode and supplied with electrons from the cathode to emit light. The organic light emitting layer may be formed of a red organic light emitting layer, a green organic light emitting layer, a blue organic light emitting layer, or a white organic light emitting layer depending on a color of light emitted from the organic light emitting layer. In this case, if the organic light emitting layer is a white organic light emitting layer, color filters having various colors may be additionally disposed.

The cathode may supply electrons to the organic light emitting layer and be formed of a conductive material having a low work function. For example, the cathode may be formed of any one or more selected from a group of metals, such as magnesium (Mg), silver (Ag), and aluminum (Al), and any alloy thereof, but is not limited thereto.

The display panel 120 may be a top emission type or a bottom emission type, depending on an emission direction of light emitted from the organic light emitting diode.

For the top emission type, light emitted from the organic light emitting diode may be emitted toward an upper portion of the substrate 121 on which the organic light emitting diode is formed. In the case of the top emission type, a reflective layer may be formed below the anode to allow the light emitted from the organic light emitting diode to travel to the upper portion of the substrate 121, that is, toward the cathode.

For the the bottom emission type, light emitted from the organic light emitting diode may be emitted toward a lower portion of the substrate 121 on which the organic light emitting diode is formed. In the case of the bottom emission type, the anode may be formed only of a transparent conductive material to allow the light emitted from the organic light emitting diode to travel toward the lower portion of the substrate 121, and the cathode may be formed of the metal material having a high reflectivity.

Hereinafter, for the convenience of description, the display device 100 according to an exemplary embodiment of the present disclosure may be described, for example, as a bottom emission type display device, but it is not limited thereto.

A circuit for driving the organic light emitting diode may be disposed in the pixel unit 123. The circuit may be formed of a thin film transistor, a storage capacitor, a gate line, a data line, and a power line, but the circuit may take various other forms depending on the design of the display device 100.

The encapsulation layer 124 may be disposed on the pixel unit 123 and cover the pixel unit 123. The encapsulation layer 124 may closely seal the organic light emitting diode of the pixel unit 123. The encapsulation layer 124 may protect the organic light emitting diode of the pixel unit 123 from external moisture, oxygen, and impacts. The encapsulation layer 124 may be formed by alternately laminating a plurality of inorganic layers and a plurality of organic layers. For example, the inorganic layer may be formed of an inorganic material, such as silicon nitride SiNx, silicon oxide SiOx, and aluminum oxide AlOx, and the organic layer may be formed of epoxy or acrylic polymer, but they are not limited thereto.

The encapsulation substrate 125 may be disposed on the encapsulation layer 124. The encapsulation substrate 125 may protect the organic light emitting diode of the pixel unit 123 together with the encapsulation layer 124. The encapsulation substrate 125 may protect the organic light emitting diode of the pixel unit 123 from external moisture, oxygen, and impacts. The encapsulation substrate 125 may be formed of a metal material, which has a high corrosion resistance and can be easily processed in the form of foil or thin film, such as aluminum (Al), nickel (Ni), chromium (Cr), and an alloy material of iron (Fe) and nickel. Therefore, if the encapsulation substrate 125 is formed of a metal material, the encapsulation substrate 125 may be implemented as an ultra-thin film and have a high resistance against external impacts and scratches.

A first adhesive layer AD1 may be disposed between the encapsulation layer 124 and the encapsulation substrate 125. The first adhesive layer AD1 may bond the encapsulation layer 124 and the encapsulation substrate 125 to each other. The first adhesive layer AD1 may be formed of a material having an adhesiveness and may be a thermosetting or natural curing adhesive. For example, the first adhesive layer AD1 may be formed of an optical clear adhesive (OCA) or a pressure sensitive adhesive (PSA), but is not limited thereto.

The first adhesive layer AD1 may be provided to enclose the encapsulation layer 124 and the pixel unit 123. That is, the pixel unit 123 may be sealed by the buffer layer 122 and the encapsulation layer 124, and the encapsulation layer 124 and the pixel unit 123 may be sealed by the buffer layer 122 and the first adhesive layer AD1. Together with the encapsulation layer 124 and the encapsulation substrate 125, the first adhesive layer AD1 may protect the organic light emitting diode of the pixel unit 123 from external moisture, oxygen, and impacts. In this case, the first adhesive layer AD1 may further include an absorbent. The absorbent may be particles having hygroscopicity and absorb external moisture and oxygen to minimize permeation of the moisture and oxygen into the pixel unit 123.

The back cover 110 may be disposed on the encapsulation substrate 125. The back cover 110 may be disposed to be in contact with the encapsulation substrate 125 of the display panel 120 to protect the display panel 120. In order to protect the display panel 120, the back cover 110 may be formed of a rigid metal or plastic material.

The back cover 110 may include a plurality of openings 111. The plurality of openings 111 may allow the back cover 110 to have flexibility. The plurality of openings 111 may be flexibly deformed and allow the back cover 110 to be wound around the roller 151 or unwound from the roller 151 together with the display panel 120. Detailed description thereof will be provided below with reference to FIGS. 7A and 7B.

A second adhesive layer AD2 may be disposed between the encapsulation substrate 125 and the back cover 110. The second adhesive layer AD2 may bond the encapsulation substrate 125 and the back cover 110 to each other. The second adhesive layer AD2 may be formed of a material having an adhesiveness and may be a thermosetting or natural curing adhesive. For example, the second adhesive layer AD2 may be formed of an optical clear adhesive (OCA) or a pressure sensitive adhesive (PSA), but is not limited thereto.

Even though the plurality of openings 111 of the back cover 110 is illustrated in FIG. 6 as not being filled with the second adhesive layer AD2, some or all of the plurality of openings 111 may be filled with the second adhesive layer AD2. If the plurality of openings 111 of the back cover 110 is filled with the second adhesive layer AD2, a contact area between the second adhesive layer AD2 and the back cover 110 is increased so as to prevent or mitigate a separation phenomenon.

Even though not illustrated in FIG. 6, a translucent film may be further disposed on an outer surface of the substrate 121 (i.e., a lower surface of the substrate 121 as shown in FIG. 6). The translucent film may perform a function of protecting a front surface or a viewing surface of the display panel 120 or minimizing the reflection of external light incident onto the display panel 120. For example, the translucent film may be at least one of a polyethyleneterephthalate (PET) film, an anti-reflection film, a polarizer film, and a transmittance controllable film, but is not limited thereto.

Hereinafter, the back cover 110 will be described in more detail with reference to FIGS. 7A and 7B.

<Detailed Configuration of an Example Back Cover>

Figure 7A:
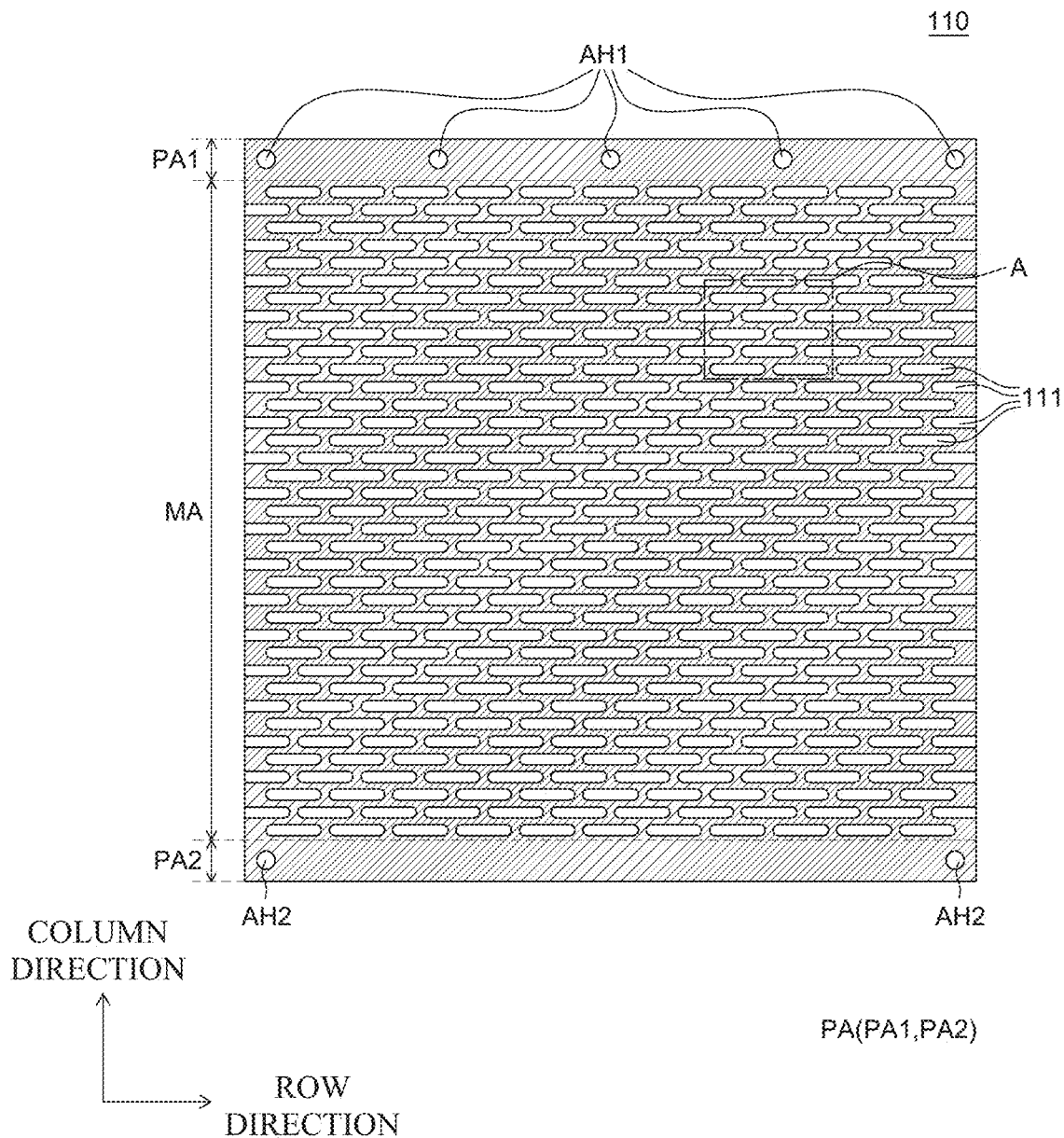
FIG. 7A is a plan view of a back cover of a display device according to an exemplary embodiment of the present disclosure.

FIG. 7A is a plan view of a back cover of a display device according to an exemplary embodiment of the present disclosure. FIG. 7B is an enlarged view of a region A of FIG. 7A.

As illustrated in FIG. 7A, the back cover 110 may include a support area PA and a malleable area MA. More specifically, the back cover 110 may include a first support area PA1 of an uppermost end of the back cover 110, a second support area PA2 of a lowermost end of the back cover 110, and the malleable area MA between the first support area PA1 and the second support area PA2.

The first support area PA1 of the back cover 110 may be an uppermost area of the back cover 110 and may be fastened with the head bar 164. The first support area PA1 may include first fastening holes AH1 to be fastened with the head bar 164. As described in detail with reference to FIG. 3, screws SC may be provided to pass through the head bar 164 and the first fastening holes AH1 to fasten the head bar 164 with the first support area PA1 of the back cover 110. If the first support area PA1 is fastened with the head bar 164, when the link unit 162 fastened with the head bar 164 is lifted or lowered, the back cover 110 may also be lifted and lowered together with the display panel 120 attached to the back cover 110. Even though FIG. 7 illustrates, for example, five first fastening holes AH1, the number of first fastening holes AH1 is not limited thereto. Further, even though the back cover 110 is illustrated in FIG. 7A as being fastened with the head bar 164 using the first fastening holes AH1, it is not limited thereto. The back cover 110 and the head bar 164 may be fastened with each other without using a separate fastening hole.

The second support area PA2 of the back cover 110 may be a lowermost area of the back cover 110 and may be fastened with the roller 151. The second support area PA2 may include second fastening holes AH2 to be fastened with the roller 151. For example, screws SC may be provided to pass through the roller 151 and the second fastening holes AH2 to fasten the roller 151 and the second support area PA2 of the back cover 110 with each other. If the second support area PA2 is fastened with the roller 151, the back cover 110 may be wound around or unwound from the roller 151 by the rotation of the roller 151. Even though FIG. 7A illustrates, for example, two second fastening holes AH2, the number of second fastening holes AH2 is not limited thereto.

The malleable area MA of the back cover 110 may be an area which is wound around or unwound from the roller 151 together with the display panel 120. The malleable area MA may overlap at least the display panel 120 among other components of the display unit DP.

A plurality of openings 111 may be disposed in the malleable area MA of the back cover 110. When the display unit DP is wound or unwound, the plurality of openings 111 may be deformed by a stress applied to the display unit DP. Specifically, when the display unit DP is wound or unwound, the malleable area MA of the back cover 110 may be deformed as the plurality of openings 111 contracts or expands. Further, as the plurality of openings 111 contracts or expands, a slip phenomenon of the display panel 120 disposed on the malleable area MA of the back cover 110 may be minimized so that the stress applied to the display panel 120 may be minimized.

When the display panel 120 and the back cover 110 are wound, a difference between a length of the display panel 120 wound around the roller 151 and a length of the back cover 110 wound around the roller 151 may be caused due to the difference in respective radii of curvature of the display panel 120 and the back cover 110. For example, when the back cover 110 and the display panel 120 are wound around the roller 151, a length of the back cover 110 required for being wound around the roller 151 once may be different from a length of the display panel 120 required for being wound around the roller 151 once. That is, since the display panel 120 is disposed outside the back cover 110 with respect to the roller 151, a length of the display panel 120 required to be wound around the roller 151 once may be larger than a length of the back cover 110 required to be wound around the roller 151 once. As described above, the winding lengths of the back cover 110 and the display panel 120 may be different from each other due to the difference in respective radii of curvature at the time of winding the display unit DP, and the display panel 120 attached to the back cover 110 may slide to move from its original position. In this case, a phenomenon that the display panel 120 slides from the back cover 110 due to the stress and the difference in radii of curvature caused by the winding may be defined as a slip phenomenon. When the slip phenomenon is excessively increased, the display panel 120 may be detached from the back cover 110, or failures such as cracks may be caused.

In this case, in the display device 100 according to an exemplary embodiment of the present disclosure, even when the display unit DP is wound or unwound and a stress is applied to the display unit DP, the plurality of openings 111 of the back cover 110 may be flexibly deformed to relieve the stress applied to the back cover 110 and the display panel 120. For example, when the back cover 110 and the display panel 120 are wound around the roller 151, a stress which deforms the back cover 110 and the display panel 120 in a vertical direction may be applied. In this case, the plurality of openings 111 of the back cover 110 may extend in a vertical direction of the back cover 110, and the length of the back cover 110 may be flexibly deformed. Therefore, the difference in the respective lengths of the back cover 110 and the display panel 120 caused by the difference in respective radii of curvature during the process of winding the back cover 110 and the display panel 120 may be compensated by the plurality of openings 111 of the back cover 110. Further, the plurality of openings 111 may be deformed during the process of winding the back cover 110 and the display panel 120 so that a stress which is applied to the display panel 120 from the back cover 110 may also be relieved.

Figure 7B:
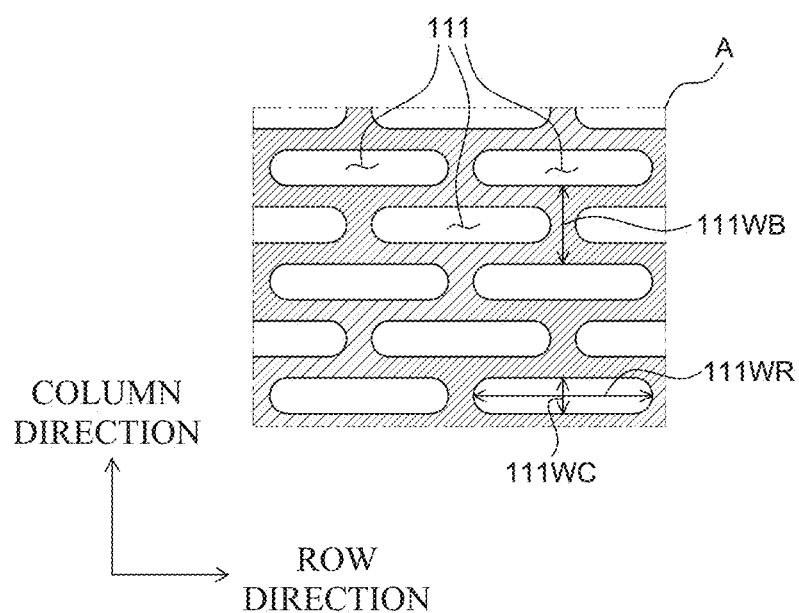
FIG. 7B is an enlarged view of a region A of FIG. 7A.

As shown in FIGS. 7A and 7B, the plurality of openings 111 may be staggered from a plurality of openings 111 in adjacent rows. For example, a plurality of openings 111 disposed in one row may be staggered from a plurality of openings 111 disposed in a row adjacent to the one row. Specifically, respective centers of the plurality of openings 111 disposed in an odd-numbered row may be staggered from respective centers of the plurality of openings 111 disposed in an even-numbered row. For example, the respective centers of the plurality of openings 111 disposed in an odd-numbered row may be staggered by a half of width 111WR of the openings 11 in a row direction from the respective center of the plurality of openings 111 disposed in an even-numbered row. However, the arrangement of the plurality of openings 111 illustrated in FIG. 7A is just an example, and is not limited thereto.

Due to the openings 111 being staggered, a distance 111WB (see, e.g., FIG. 7B) between two adjacent openings 111 with their centers aligned in a column direction may be minimized. Specifically, an area between the openings 111 with their centers aligned in a column direction in the malleable area MA may have a relatively high rigidity. When the back cover 110 is wound, the back cover 110 is to be bent in a column direction. Therefore, as the distance 111WB between two adjacent openings 111 with their centers aligned in the column is increased, it may be harder to bend the back cover 110 in the column direction. In this case, since the openings 111 are staggered from row to row, the distance 111WB between two adjacent openings 111 with their centers aligned in the column direction may be minimized or reduced, and the area between the openings 111 may also be minimized or reduced, as compared to a configuration in which the openings are not staggered. Accordingly, the distance 111WB between two adjacent openings 111 with their centers aligned in the column direction may be reduced, and the malleable area MA may be filled with more openings 111 in the column direction to remove or reduce an area without openings 111. Therefore, because the distance 111WB of the rigid area between the plurality of openings 111 in the column direction is minimized or reduced, the overall rigidity of the back cover 110 may be enhanced without interfering the winding or unwinding of the back cover 110.

As shown in FIG. 7B, a maximum width 111WR of the plurality of openings 111 in the row direction may be larger than a maximum width 111WC in the column direction. That is, as illustrated in FIG. 7B, the maximum width 111WR of the plurality of openings 111 in a horizontal direction may be larger than the maximum width 111WC of the plurality of openings 111 in a vertical direction.

As the width 111WR of the plurality of openings 111 in the row direction is increased, the malleable area MA of the back cover 110 may be more flexibly deformed. Specifically, when the back cover 110 is wound, the back cover 110 may be bent in the column direction of the back cover 110, and the stress may be applied so that the plurality of openings 111 extends in the column direction. In this case, if the width 111WR of the plurality of openings 111 in the row direction is increased, when the plurality of openings 111 is stretched in the column direction, the width 111WC of the plurality of openings 111 in the column direction may be increased. Further, as the plurality of openings 111 extends in the column direction, the stress applied to the malleable area MA may be relieved. Therefore, the malleable area MA of the back cover 110 may be more easily wound or unwound by increasing the width 111WR of the plurality of openings 111 in the row direction, and the stress applied to the malleable area MA may be relieved.

The larger the width 111WC of the plurality of openings 111 in the column direction, the easier it is to form the plurality of openings 111. However, when the width 111WC of the plurality of openings 111 in the column direction is increased, an aperture ratio of the plurality of openings 111 may be increased in the malleable area MA. When the width 111WC of the plurality of openings 111 in the column direction is increased, a contact area between the display panel 120 and the back cover 110 which are attached to the malleable area MA may be reduced. In this case, if the overlapping area of the display panel 120 and the back cover 110, that is, the contact area between the back cover 110 and the second adhesive layer AD2 is reduced, the back cover 110 and the second adhesive layer AD2 may be separated. Therefore, the adhesiveness between the display panel 120 and the back cover 110 may be controlled by adjusting the width 111WC of the plurality of openings 111 in the column direction so that the display panel 120 and the back cover 110 are not separated. Further, the back cover 110 may be designed to have a high flexibility by adjusting the width 111WR of the plurality of openings 111 in the row direction.

In this case, in contrast to the malleable area MA, openings 111 are not formed in the first support area PA1 and the second support area PA2. That is, in the first support area PA1 and the second support area PA2, the first fastening holes AH1 and the second fastening holes AH2 are respectively formed, but the plurality of openings 111, such as those formed in the malleable area MA, are not formed. Further, the first fastening holes AH1 and the second fastening holes AH2 may have different shapes from that of the plurality of openings 111. The first support area PA1 and the second support area PA2, which are to be fixed to the head bar 164 and the roller 151, respectively, may be more rigid than the malleable area MA. Specifically, as the first support area PA1 and the second support area PA2 have a higher rigidity, the first support area PA1 and the second support area PA2 may be more firmly fixed to the head bar 164 and the roller 151. Therefore, the display unit DP may be fixed to the roller 151 and the head bar 164 of the driving unit MP to be moved in and out of the housing unit HP in accordance with the operation of the driving unit MP.

In the display device 100 according to an exemplary embodiment of the present disclosure, the back cover 110 with the plurality of openings 111 formed therein may be disposed on the rear surface of the display panel 120 to support and protect the display panel 120. The back cover 110 may be formed of a metal or plastic material to have rigidity. The plurality of openings 111 may be formed in the malleable area MA of the back cover 110 where the display panel 120 is disposed to enhance the flexibility of the back cover 110. Therefore, in a fully unwound state in which the display unit DP of the display device 100 is disposed outside the housing unit HP, the back cover 110 formed of a rigid material to have a high rigidity may support the display panel 120 to be spread flat. In contrast, in a fully wound state in which the display unit DP of the display device 100 is accommodated in the housing unit HP, the back cover 110 having a high flexibility due to the plurality of openings 111 may be wound around the roller 151 together with the display panel 120 to be accommodated.

Further, in the display device 100 according to an exemplary embodiment of the present disclosure, the width 111WR of the plurality of openings 111 in the row direction may be adjusted so that the back cover 110 has a higher flexibility to relieve the stress applied when the back cover 110 is wound. Specifically, when the back cover 110 and the display panel 120 are wound around the roller, the back cover 110 may be bent in the column direction, and the stress may be applied such that the plurality of openings 111 extends in the column direction. The plurality of openings 111 may be formed to have a large width 111WR in the row direction so that when the back cover 110 and the display panel 120 are wound around the roller 151, the plurality of openings 111 may be easily stretched in the column direction to relieve the stress applied to the back cover 110. Therefore, in the display device 100 according to an exemplary embodiment of the present disclosure, the width 111WR of the plurality of openings 111 in the row direction may be adjusted to enhance the flexibility of the back cover 110, and the back cover 110 and the display panel 120 may be easily wound around the roller 151. Further, the plurality of openings 111 may expand in the column direction to relieve the stress applied to the back cover 110 and the display panel 120 so that the breakage of the display panel 120 may be reduced or prevented.

Further, in the display device 100 according to an exemplary embodiment of the present disclosure, the width 111WC of the plurality of openings 111 in the column direction may be adjusted to adjust the adhesiveness between the back cover 110 and the display panel 120. Specifically, the display panel 120 may be attached to the malleable area MA of the back cover 110. In this case, the larger the aperture ratio of the plurality of openings 111 disposed in the malleable area MA, the smaller the contact area between the display panel 120 and the back cover 110. Therefore, the adhesiveness between the display panel 120 and the back cover 110 may be reduced. However, in the display device 100 according to an exemplary embodiment of the present disclosure, the width 111WC of the plurality of openings 111 of the back cover 110 in the column direction may be formed to be small to reduce the aperture ratio of the plurality of openings 111 and increase the contact area between the display panel 120 and the back cover 110. As the contact area between the display panel 120 and the back cover 110 is increased, the adhesiveness between the display panel 120 and the back cover 110 may be enhanced. Further, in the display device 100 according to an exemplary embodiment of the present disclosure, the width 111WC of the plurality of openings 111 in the column direction may be adjusted to ensure a predetermined level or higher of the adhesiveness between the back cover 110 and the display panel 120 to prevent or mitigate a potential separation between the back cover 110 and the display panel 120.

<A plurality of Malleable Areas and a Plurality of Support Areas of Back Cover>

Figure 8A:
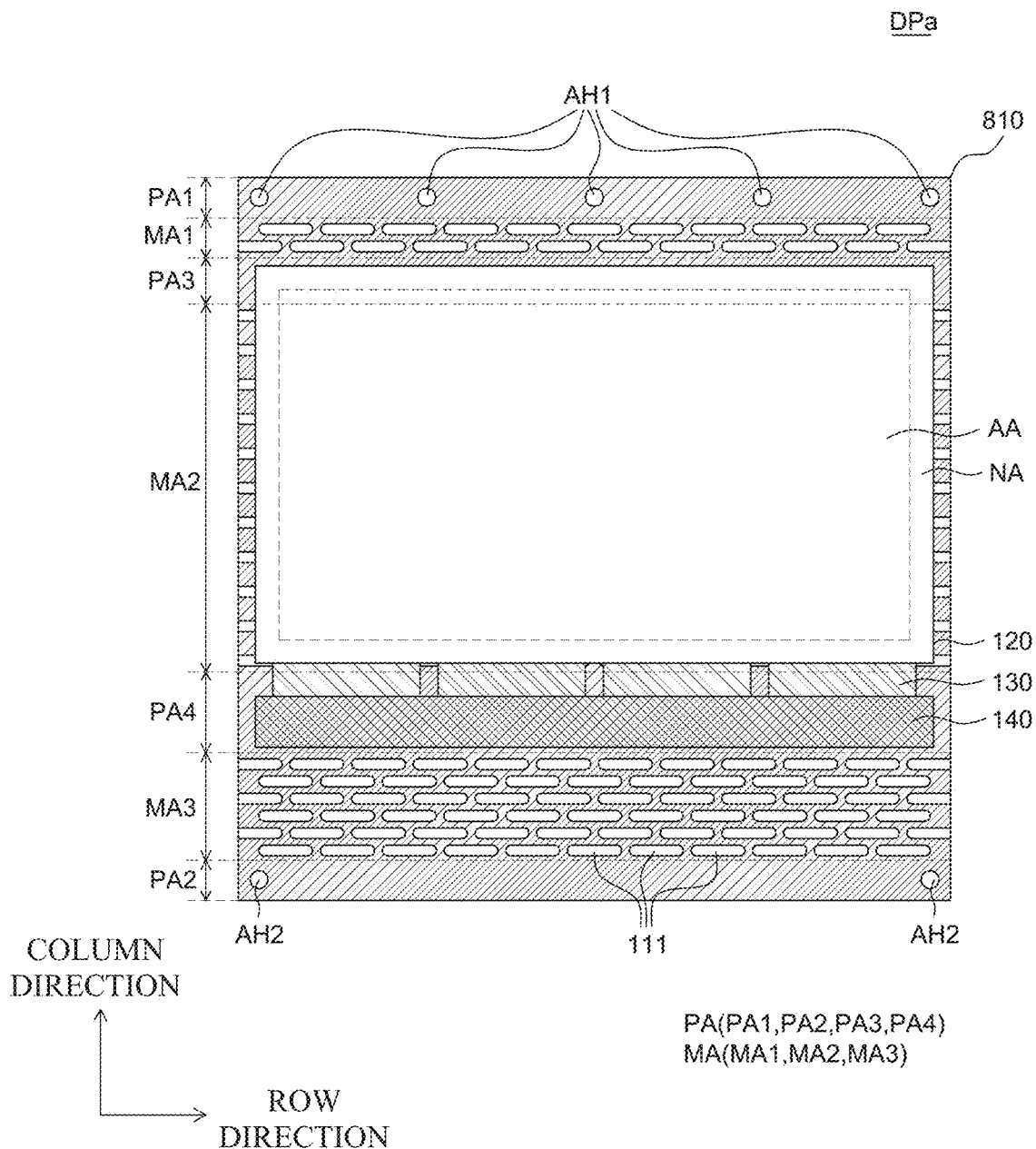
FIG. 8A is a plan view of a display unit of a display device according to another exemplary embodiment of the present disclosure.
Figure 8B:
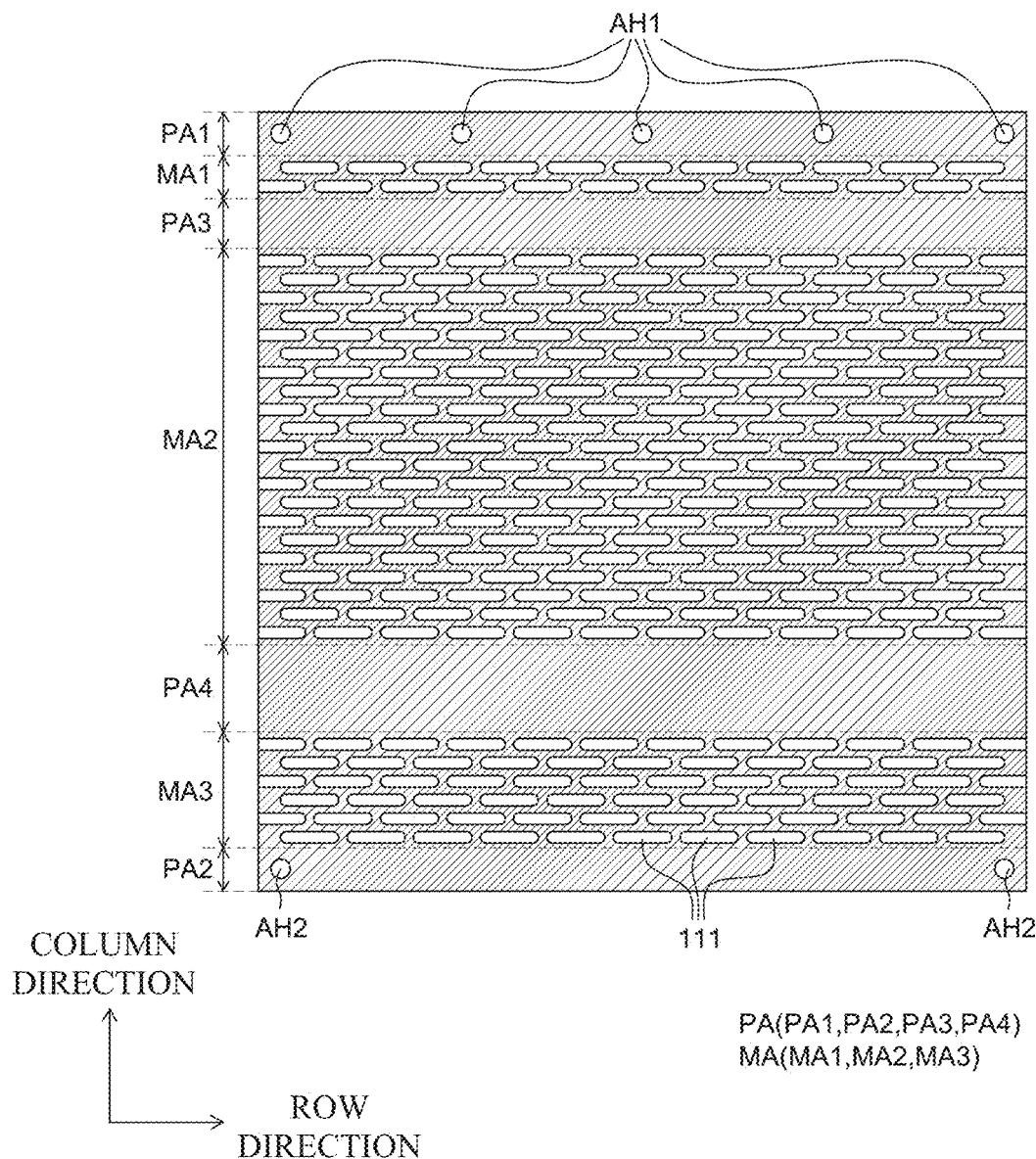
FIG. 8B is a plan view of a back cover of a display device according to another exemplary embodiment of the present disclosure.
Figure 9A:
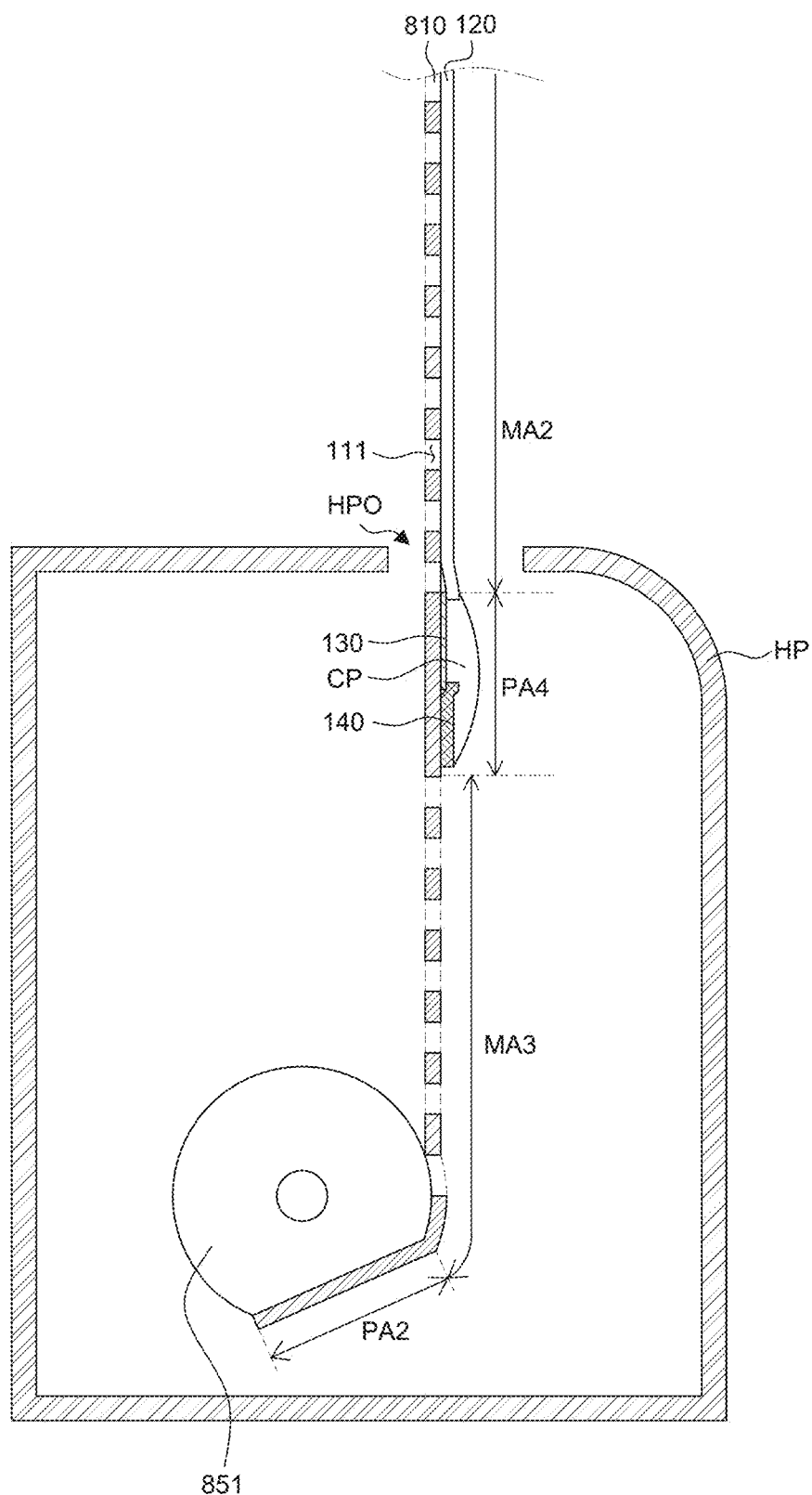
FIGS. 9A to 9C are cross-sectional views of a display device according to another exemplary embodiment of the present disclosure.
Figure 9B:
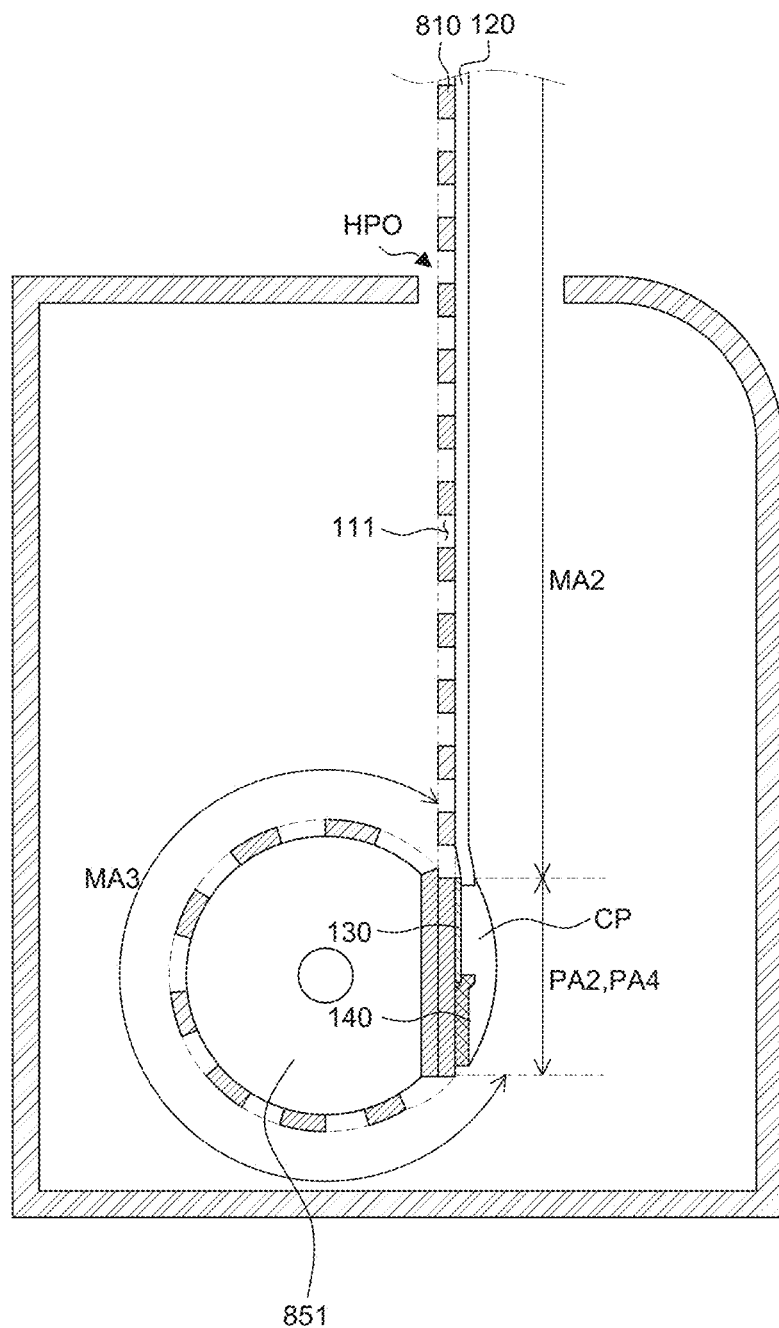
Figure 9C:
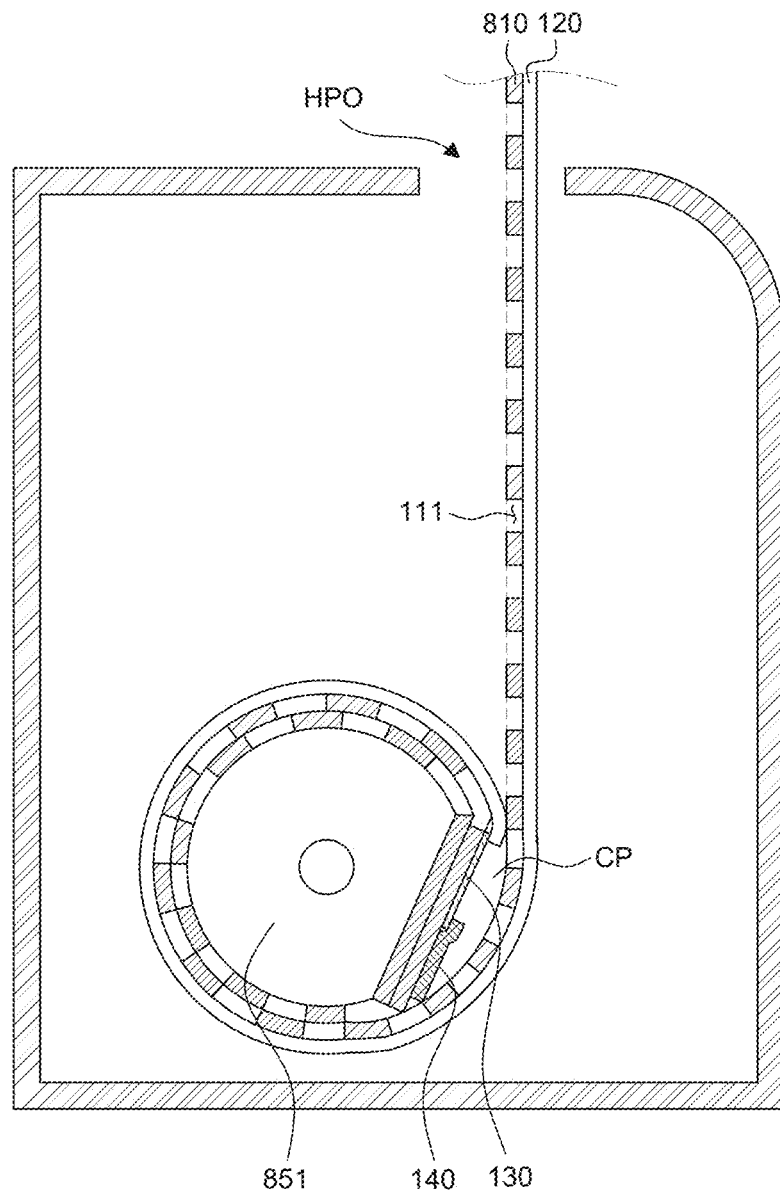

FIG. 8A is a plan view of a display unit of a display device according to another exemplary embodiment of the present disclosure. FIG. 8B is a plan view of a back cover of a display device according to another exemplary embodiment of the present disclosure. FIGS. 9A to 9C are cross-sectional views of a display device according to another exemplary embodiment of the present disclosure. Shapes of a back cover 810 and a roller 851 are different, but other components of a display device according to an example embodiment of FIGS. 8A to 9C are substantially the same as the display device 100 of FIGS. 1 to 7B so that a redundant description will be omitted. Further, for the convenience of description, in FIGS. 9A to 9C, only a housing unit HP, a roller 851, a flexible film 130, a printed circuit board 140, and a back cover 810 are illustrated.

First, as illustrated in FIGS. 8A and 8B, the back cover 810 may include a plurality of support areas PA and a plurality of malleable areas MA. In the plurality of support areas PA, a plurality of openings 111 is not disposed. In the plurality of malleable areas MA, a plurality of openings 111 is disposed. Specifically, a first support area PA1, a first malleable area MA1, a third support area PA3, a second malleable area MA2, a fourth support area PA4, a third malleable area MA3, and a second support area PA2 may be sequentially disposed from the uppermost end to the lowermost end of the back cover 810.

As described above in detail with reference to FIGS. 1 to 7B, the first support area PA1 may be an uppermost area of the back cover 810. The first support area PA1 is an area which may be fastened with the head bar 164 via a first fastening hole AH1 provided in the first support area PA1. A screw SC may pass through a first fastening hole AH1 to fasten the first support area PA1 with the head bar 164.

The first malleable area MA1 may be an area extending from the first support area PA1 to a lower side of the back cover 810. The first malleable area MA1 may suppress a wrinkle phenomenon, in which a surface of the back cover 810 is bent as the head bar 164 and the first support area PA1 are fastened with each other, from spreading to the entire surface of the back cover 810.

Specifically, when the first support area PA1 and the head bar 164 are fastened with each other, a stress from the screw SC may be concentrated on a part of the first support area PA1 in which the first fastening hole AH1 is formed. Further, there may be a difference in stress between the part of the first support area PA1 in which the first fastening hole AH1 is formed and the remaining part of the first support area PA1 in which the first fastening hole AH1 is not formed so that the surface of the back cover 810 may be bent. However, since the plurality of openings 111 is disposed in the first malleable area MA1 extending from the first support area PA1, the first malleable area MA1 may have a relatively higher flexibility than the first support area PA1. Therefore, the first malleable area MA1 may be flexibly deformed to relieve the stress concentrated on the first fastening hole AH1 of the first support area PA1. Therefore, even though the wrinkle phenomenon may be generated in the first support area PA1, the first malleable area MA1 may suppress the wrinkle phenomenon from propagating to the entire surface of the back cover 810.

The third support area PA3 may be an area extending from the first malleable area MA1 to a lower side of the back cover 810. The third support area PA3 is an area to which the display panel 120 may be attached. Specifically, a part of an upper end of the display panel 120 may be attached to the third support area PA3.

When the back cover 810 is fully wound, the third support area PA3 may be an area which is disposed in the housing unit HP, but is not wound around the roller 851. For example, in the fully wound state, the first support area PA1 of the back cover 810 may be disposed in the opening HPO of the housing unit HP and the second support area PA2, the third malleable area MP3, the fourth support area PA4, and the second malleable area MA2 of the back cover 810 may be wound around the roller 851. The third support area PA3 and the first malleable area MA1 disposed between the second malleable area MA2 wound around the roller 851 and the first support area PA1 disposed in the opening HPO of the housing unit HP may maintain a flat state. Therefore, even in the fully wound state, the third support area PA3 may maintain a flat state in the housing unit HP without being wound around or unwound from the roller 851, so that there may not be a need to ensure the flexibility of the third support area PA3 by forming the plurality of openings 111.

Therefore, since the plurality of openings 111 is not formed in the third support area PA3, the adhesiveness between the third support area PA3 and the display panel 120 may be enhanced. Specifically, the contact area between the third support area PA3 and the second adhesive layer AD2 may be increased so that the adhesiveness may be enhanced. Therefore, the adhesiveness between the third support area PA3, the second adhesive layer AD2, and the display panel 120 may be enhanced, so that the display panel 120 and the third support area PA3 may be firmly fixed to each other. Therefore, the adhesiveness between the back cover 810 and the display panel 120 may be enhanced in the third support area PA3. In addition, when the back cover 810 and the display panel 120 are wound, the separation of the back cover 810 and the display panel 120 due to the resulting stress may be minimized or prevented.

Moreover, since the plurality of openings 111 is not formed in the third support area PA3, the rigidity in the third support area PA3 of the back cover 810 may be enhanced. The plurality of openings 111 may flexibly expand or contact with respect to the stress and enhance the flexibility of the back cover 810. However, the plurality of openings 111 for enhancing the flexibility is not disposed in the third support area PA3, and the third support area PA3 may be formed of a rigid material so that the third support area PA3 may have a higher rigidity as compared with the plurality of malleable areas MA. Therefore, the third support area PA3 with an enhanced rigidity may protect the display panel 120 from the external impact and maintain the display panel 120 to be flat.

The second malleable area MA2 may be an area extending from the third support area PA3 to a lower side of the back cover 810. The second malleable area MA2 is an area in which a plurality of openings 111 may be disposed and to which the display panel 120 may be attached. Specifically, the remaining part of the display panel 120 other than the part of the display panel 120 is attached to the third support area PA3 may be attached to the second malleable area MA2. Therefore, the display panel 120 may be attached to the third support area PA3 and the second malleable area MA2.

When the display unit DPa is wound around the roller 851 (see, e.g., FIGS. 9A to 9C) so that the display unit DPa is accommodated in the housing unit HP, the second malleable area MA2 of the back cover 810 and the lower end and portions of the display panel 120 attached to the second malleable area MA2 may be wound around the roller 851. In this case, in the second malleable area MA2 of the back cover 810, the plurality of openings 111 may be formed so that the second malleable area MA2 may have a high flexibility and may be easily wound around the roller 851 together with the display panel 120. The second malleable area MA2 may perform the substantially same function as the example malleable area MA described above with reference to FIGS. 1 to 7B.

The fourth support area PA4 may be an area extending from the second malleable area MA2 to the lower side of the back cover 810. A flexible film 130 which may be connected to one end of the display panel 120 and a printed circuit board 140 may be attached to the fourth support area PA4.

To protect the flexible film 130 and the printed circuit board 140, the fourth support area PA4 may allow the flexible film 130 and the printed circuit board 140 to be wound around the roller 851 in a planar shape, rather than a curved shape. Further, a part of the roller 851 may be formed to have a planar shape, corresponding to the fourth support area PA4. Detailed description of this example configuration is provided below with reference to FIGS. 9A to 9C.

The third malleable area MA3 may be an area extending from the fourth support area PA4 to a lower side of the back cover 810. A plurality of openings 111 may be disposed in the third malleable area MA3. The third malleable area MA3, when unwound, may extend to dispose the display area AA of the display panel 120 outside of the housing unit HP. For example, when the back cover 810 and the display panel 120 are fully unwound, the second support area PA2 of the back cover 810 connected to the roller 851 to the fourth support area PA4, to which the flexible film 130 and the printed circuit board 140 are attached, may remain disposed in the housing unit HP. When the back cover 810 and the display panel 120 are fully unwound, the second malleable area MA2 and the third support area PA3, to which the display panel 120 is attached, may be disposed outside the housing unit HP. In this case, if a combined length of the second support area PA2 fixed to the roller 851, the third malleable area MA3, and the fourth support area PA4 is smaller than a length from the second support area PA2 to the opening HPO of the housing unit HP, a part of the second malleable area MA2 to which the display panel 120 is attached may remain disposed in the housing unit HP. If a part of the lower end of the display area AA of the display panel 120 is disposed in the housing unit HP, it may be difficult to view displayed images. Therefore, the combined length of the second support area PA2 fixed to the roller 851, the third malleable area MA3, and the fourth support area PA4 may be designed to be at least equal to the length from the second support area PA2 fixed to the roller 851 to the opening HPO of the housing unit HP.

The second support area PA2 may extend from the third malleable area MA3 to the lower side of the back cover 810. As described above in detail with reference to FIGS. 1 to 7B, the second support area PA2 may be a lowermost area of the back cover 810. The second support area PA2 may be fastened with the roller 851 via second fastening holes AH2.

FIG. 9A is a cross-sectional view in a state in which the back cover 810 is fully unwound from the roller 851. FIG. 9B is a cross-sectional view in a state in which the second support area PA2, the third malleable area MA3, and the fourth support area PA4 of the back cover 810 are wound around the roller 851. FIG. 9C is a cross-sectional view in a state in which the second support area PA2, the third malleable area MA3, the fourth support area PA4, and the second malleable area MA2 of the back cover 810 are wound around the roller 851.

As shown in FIG. 9A, the roller 851 may be generally cylindrical, but a part thereof may be flat. That is, a part of an outer circumferential surface of the roller 851 may be formed to be flat, and the remaining part of the outer circumferential surface may be formed to be curved.

The second support area PA2 may be fastened with the flat portion of the roller 851. When the back cover 810 is in the fully unwound state, except for the second support area PA2 fastened with the roller 851, the remaining portion of the back cover 810 extending from the second support area PA2 may be flat.

A cover unit CP may be further disposed on the flexible film 130 and the printed circuit board 140 disposed in the third support area PA3. The cover unit CP may be disposed to cover the flexible film 130 and the printed circuit board 140, and may be formed to have a convex shape. The cover unit CP may protect the flexible film 130 and the printed circuit board 140, and may be formed of an insulating material, such as resin, but is not limited thereto.

As described above in detail with reference to FIGS. 8A and 8B, when the back cover 810 is in the fully unwound state, the third malleable area MA3 and the fourth support area PA4 of the back cover 810 are disposed in the housing unit HP, and the second malleable area MA2 may be disposed outside the housing unit HP.

Next, as shown in to FIG. 9B, the second support area PA2, the third malleable area MA3, and the fourth support area PA4 of the back cover 810 may be wound around the roller 851, and the second malleable area MA2 extending from the fourth support area PA4 may be unwound.

The second support area PA2 and the fourth support area PA4 may be disposed on the flat portion of the roller 851, and the third malleable area MA3 is disposed on the curved portion.

The fourth support area PA4 to which the printed circuit board 140 and the flexible film 130 are attached may be wound on the flat portion of the roller 851 so that the fourth support area PA4, the printed circuit board 140, and the flexible film 130 maintain a flat state without being bent. Therefore, the flexible film 130 and the printed circuit board 140 may always maintain a flat state regardless of the winding or unwinding of the display unit DPa, thereby preventing or mitigating any damage that may be caused by the flexible film 130 and the printed circuit board 140 being bent.

Next, as illustrated in FIG. 9C, a part of the second malleable area MA2 may be further wound around the roller 851 in addition to the second support area PA2, the third malleable area MA3, and the fourth support area PA4 of the back cover 810 being wound around the roller 851.

A part of the second malleable area MA2 may be wound to overlap a curved portion of the roller 851. That is, the part of the second malleable area MA2 may be wound on the third malleable area MA3 that is wound in the curved portion of the roller 851, and may be bent along the curved shape of the roller 851.

Another part of the second malleable area MA2 may be wound to overlap a flat portion of the roller 851. This part of the second malleable area MA2 may be wound on the second support area PA2 and the fourth support area PA4 that are wound in the flat portion of the roller 851, and may be bent like the part of the second malleable area MA2 wound on the third malleable area MA3.

Specifically, the second malleable area MA2 may be wound around the roller 851 to cover the fourth support area PA4. In this case, the cover unit CP may be disposed between the second malleable area MA2 and the fourth support area PA4. Therefore, the second malleable area MA2 may be wound to cover the cover unit CP of the fourth support area PA4 and may be bent along the shape of the cover unit CP. The cover unit CP may have a curved surface so that the second malleable area MA2 may also be bent along the curved surface. Specifically, the curved shape of an upper surface of the cover unit CP may have a curved shape corresponding to the roller 851, so that a cross-section of the second malleable area MA2 wound around the roller 851 may have a substantially circular shape.

In the display device according to another exemplary embodiment of the present disclosure, a wrinkle phenomenon due to the fastening of the first support area PA1 and the head bar 164 may be minimized. The first support area PA1 of the back cover 810 may have the first fastening holes AH1 formed therein, and may be fastened with the head bar 164. Screws SC may pass through the first fastening holes AH1 of the first support area PA1 to be fastened with the head bar 164. Stress may be concentrated on or around the first fastening holes AH1. There may be a difference in the amount of stress between the part of the first support area PA1 in which the first fastening holes AH1 are formed and the remaining part of the first support area PA1 in which no first fastening hole AH1 is formed. This may result in a wrinkle phenomenon in which the surface of the first support area PA1 may be bent. Therefore, in the display device according to another exemplary embodiment of the present disclosure, the first malleable area MA1 in which the plurality of openings 111 is formed may be disposed at a lower end of the first support area PA1 of the back cover 810 to prevent or suppress the wrinkle phenomenon that may be generated in the first support area PA1 from spreading to the entire surface of the back cover 810. That is, the first malleable area MA1 has a plurality of openings 111 disposed therein so that it has a higher flexibility than the first support area PA1. Therefore, the plurality of openings 111 in the first malleable area MA1 may be flexibly deformed to relieve the stress concentrated on the first fastening holes AH1 of the first support area PA1. Therefore, the propagation of the wrinkle phenomenon generated in the first support area PA1 to the remaining area of the back cover 810 may be minimized.

Further, in the display device according to another exemplary embodiment of the present disclosure, the adhesiveness between the back cover 810 and the display panel 120 may be enhanced by the third support area PA3. Specifically, the third support area PA3 may always maintain a flat state regardless of whether the back cover 810 is in a fully wound or fully unwound state. Therefore, the third support area PA3 may be an area which is not wound around the roller 851 and may not need to include the plurality of openings 111 to ensure the flexibility. With no openings 111 formed thereon, a contact area of the third support area PA3 with the second adhesive layer AD2 may be increased, and the adhesiveness with the second adhesive layer AD2 may be enhanced. If the adhesiveness between the second adhesive layer AD2 and the back cover 810 is weak, the back cover 810 and the display panel 120 may slide due to the slip phenomenon and the back cover 810 may be separated from the display panel 120 when the back cover 810 and the display panel 120 are wound. Therefore, in the display device according to another exemplary embodiment of the present disclosure, the plurality of openings 111 is not formed in the third support area PA3 which may always maintain a flat state so that the contact area and the adhesiveness between the third support area PA3 and the second adhesive layer AD2 may be enhanced. Since the adhesiveness between the third support area PA3 and the second adhesive layer AD2 is enhanced, the adhesiveness between the third support area PA3 and the display panel 120 is also enhanced. Therefore, excessive slip due to the stress applied, e.g., when the display panel 120 and the back cover 810 are wound, and the resulting separation of the display panel 120 from the back cover 810 may be prevented or minimized.

Further, in the display device according to another exemplary embodiment of the present disclosure, when the display unit DPa is fully unwound, the back cover 810 may maintain a flat state due to the third support area PA3, and the rigidity may be ensured. That is, when the display unit DPa is fully unwound, the third support area PA3 allows the display panel 120 to maintain a flat state. The third support area PA3 may have a high rigidity as compared with the plurality of malleable areas MA in which the plurality of openings 111 is formed. Thus, the third support area PA3 may allow the display panel 120 to maintain a flat state in the fully unwound state. Further, the third support area PA3 may have a high impact resistance against the impact from the outside of the display unit DPa to protect the back cover 810 and the display panel 120 attached to the back cover 810.

Further, in the display device according to another exemplary embodiment of the present disclosure, the fourth support area PA4 may always maintain a flat state to prevent or minimize any damage to the flexible film 130 and the printed circuit board 140 which are attached to the fourth support area PA4. The fourth support area PA4 is an area to which the flexible film 130 and the printed circuit board 140 may be attached and which may always maintain a flat state. Therefore, since the fourth support area PA4 maintains a flat state, like the third support area PA3, the plurality of openings 111 does not need to be formed therein. Specifically, when the back cover 810 is wound around the roller 851, the back cover 810 may be wound while being bent along the shape of the roller 851. Therefore, in the display device according to another exemplary embodiment of the present disclosure, a part of the roller 851 around which the fourth support area PA4 is to be wound may be formed to be flat so that the fourth support area PA4 may be wound flat around the roller 851. Even though the fourth support area PA4 may be wound around the roller 851, the fourth support area PA4 may always maintain a flat state, so that the flexible film 130 and the printed circuit board 140 attached to the fourth support area PA4 may also maintain a flat state. For example, when the display unit DPa is fully unwound, the flexible film 130 and the printed circuit board 140 may maintain the flat state due to the fourth support area PA4 having a high rigidity. On the other hand, when the display unit DPa is fully wound, the flexible film 130 and the printed circuit board 140 may be seated in a flat portion of the roller 851 to maintain the flat state. Therefore, in the display device according to another exemplary embodiment of the present disclosure, the flexible film 130 and the printed circuit board 140 are not repeatedly bent so that the damage of the flexible film 130 and the printed circuit board 140 may be minimized.

<"Inverted L" Shaped Head Bar>

Figure 10:
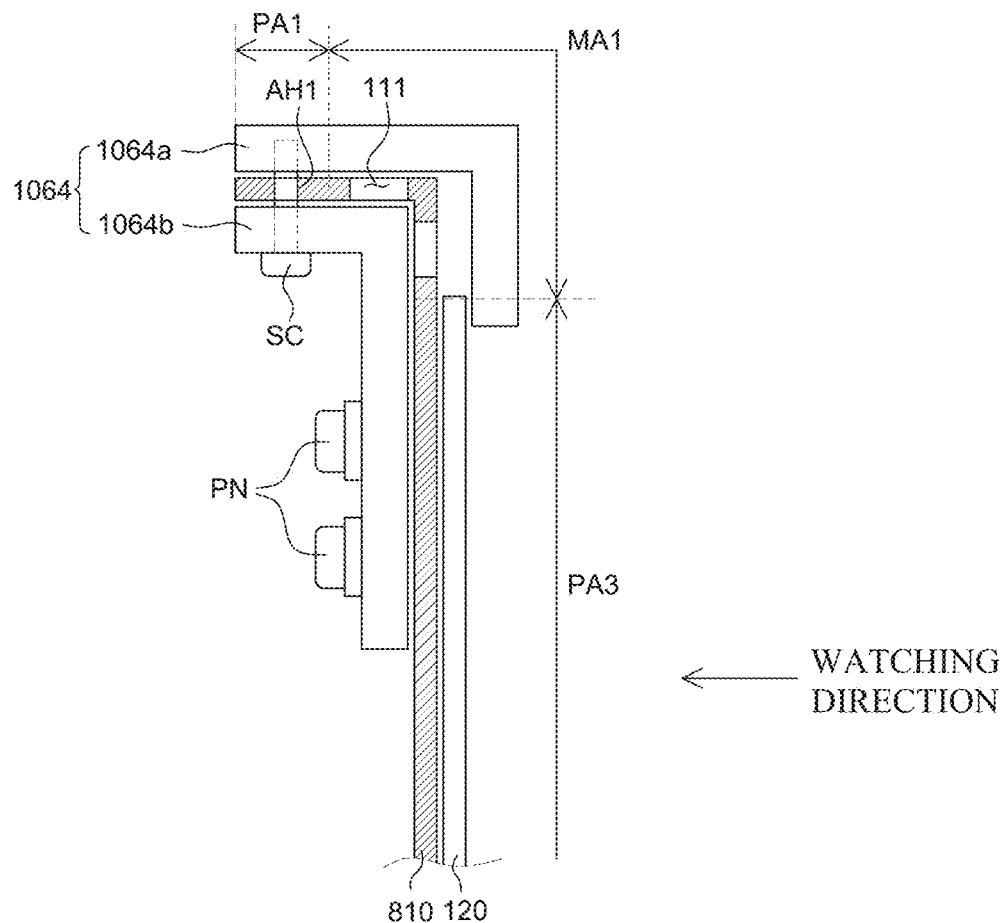
FIG. 10 is a schematic cross-sectional view for explaining a head bar and a display unit of a display device according to another exemplary embodiment of the present disclosure.

FIG. 10 is a schematic cross-sectional view for explaining a head bar and a display unit of a display device according to another exemplary embodiment of the present disclosure. A shape of a head bar 1064 of the display device may be different from that in the other example embodiments described above, but other components of the example display device of FIG. 10 may be substantially the same as the example display device of FIGS. 8A to 9C. Thus, a redundant description will be omitted.

As illustrated in FIG. 10, a head bar 1064 may be disposed at an uppermost end of the display unit DPa to enclose a portion of a front surface and a portion of a rear surface of the display unit DPa. The head bar 1064 may be partially bent to have an "inverted L" shape.

The head bar 1064 may include a first head bar 1064a and a second head bar 1064b. The first head bar 1064a may cover a portion of the front surface of the display unit DPa. The first head bar 1064a may be disposed on the front surface of the display unit DPa so as to cover a first support area PA1 and a first malleable area MA1 of a back cover 810. A part of the first head bar 1064a which overlaps the first support area PA1 may extend in a direction perpendicular to the rear surface of the display panel 120. The remaining portion of the first head bar 1064a which overlaps the first malleable area MA1 may extend in a direction parallel to the front surface of the display panel 120. Therefore, the part of the first head bar 1064a overlapping the first support area PA1 and the remaining portion overlapping the first malleable area MA1 may form an approximately 90 degree angle and have an "inverted L" shape. Therefore, the first support area PA1 and the first malleable area MA1 of the back cover 810 overlapping the first head bar 1064a may also be bent to have an "inverted L" shape. Even though he first head bar 1064a is illustrated, for example in FIG. 10, to cover the first support area PA1 and the first malleable area MA1, the first head bar 1064a may further extend from the first malleable area MA1 to cover the third support area PA3, depending on the design, and is not limited to these examples.

The second head bar 1064b may cover the rear surface of the display unit DPa. The second head bar 1064b may be disposed in the display unit DPa so as to cover the first support area PA1, the first malleable area MA1, and a portion of the third support area PA3 of the back cover 810. A part of the second head bar 1064b which overlaps the first support area PA1 may extend in a direction perpendicular to the rear surface of the display panel 120. The remaining portion of the second head bar 1064b which overlaps the first malleable area MA1 and the third support area PA3 may extend in a direction parallel to the rear surface of the display panel 120. Therefore, the part of the second head bar 1064b overlapping the first support area PA1 and the remaining portion overlapping the first malleable area MA1 and the third support area PA3 may form an approximately 90 degree angle and have an "inverted L" shape. Therefore, the first support area PA1, the first malleable area MA1, and the third support area PA3 of the back cover 810 overlapping the second head bar 1064b may also be bent to have an "inverted L" shape.

Therefore, with the head bar 1064 bent to have a "inverted L" shape, the wrinkle phenomenon may be relieved. Specifically, with the first support area PA1 and the head bar 1064 are fastened with each other, a stress from the screw SC is concentrated on a part of the first support area PA1 in which the first fastening hole AH1 is formed. Therefore, the wrinkle phenomenon may be generated in the first support area PA1 due to the generated stress. In this case, as the first support area PA1 and the first malleable area MA1 may be fastened with the head bar 1064 which is partially bent, the first malleable area MA1 may also be bent to have the "inverted L" shape as does the head bar 1064. Therefore, the stress concentrated on the first fastening holes AH1 of the first support area PA1 may be relieved, thereby preventing or minimizing any wrinkle phenomenon generated in the first support area PA1 from propagating to the entire surface of the back cover 810.

Further, in the display device according to another exemplary embodiment of the present disclosure, the head bar 1064 may include the first head bar 1064*a* and the second head bar 1064*b*. The first head bar 1064*a* and the second head bar 1064*b* may be partially bent to have an "inverted L" shape. Parts of the first head bar 1064*a* and the second head bar 1064*b* which overlap the first support area PA1 may extend in a direction perpendicular to the rear surface of the display panel 120. The remaining parts of the first and second head bars 1064*a*, 1064*b* which overlap the first malleable area MA1 may extend in a direction parallel to the front surface and the rear surface of the display panel 120. Therefore, as the parts and the remaining part of the first head bar 1064*a* and the second head bar 1064*b* extend in different directions, the first head bar 1064*a* and the second head bar 1064*b* may have an "inverted L" shape. The first support area PA1 and the first malleable area MA1 of the back cover 810 disposed between the first head bar 1064*a* and the second head bar 1064*b* may also be bent to have an "inverted L" shape in accordance with the shapes of the first head bar 1064*a* and the second head bar 1064*b*. Therefore, as the first support area PA1 and the first malleable area MA1 are bent, the stress concentrated on the first fastening holes AH1 in the first support area PA1 may be relieved. Therefore, the first support area PA1 and the first malleable area MA1 may be bent in the "inverted L" shaped head bar 1064, and the propagation of any wrinkle phenomenon generated in the first support area PA1 to the remaining area of the back cover 810 may be minimized.

<Various Shapes of Plurality of Openings of Back Cover>

Figure 11A:
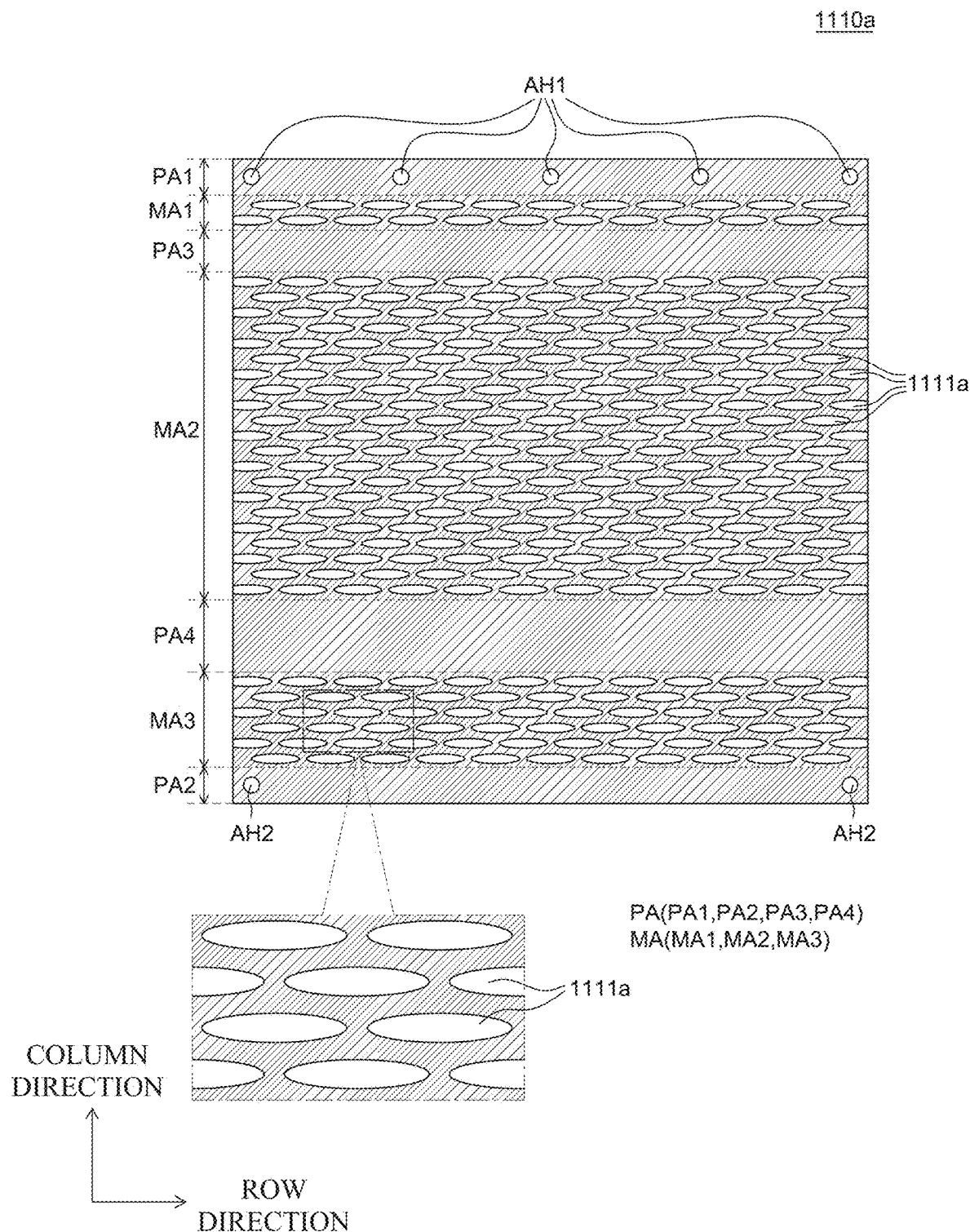
FIGS. 11A to 11C are plan views of back covers of a display device according to various exemplary embodiments of the present disclosure.
Figure 11B:
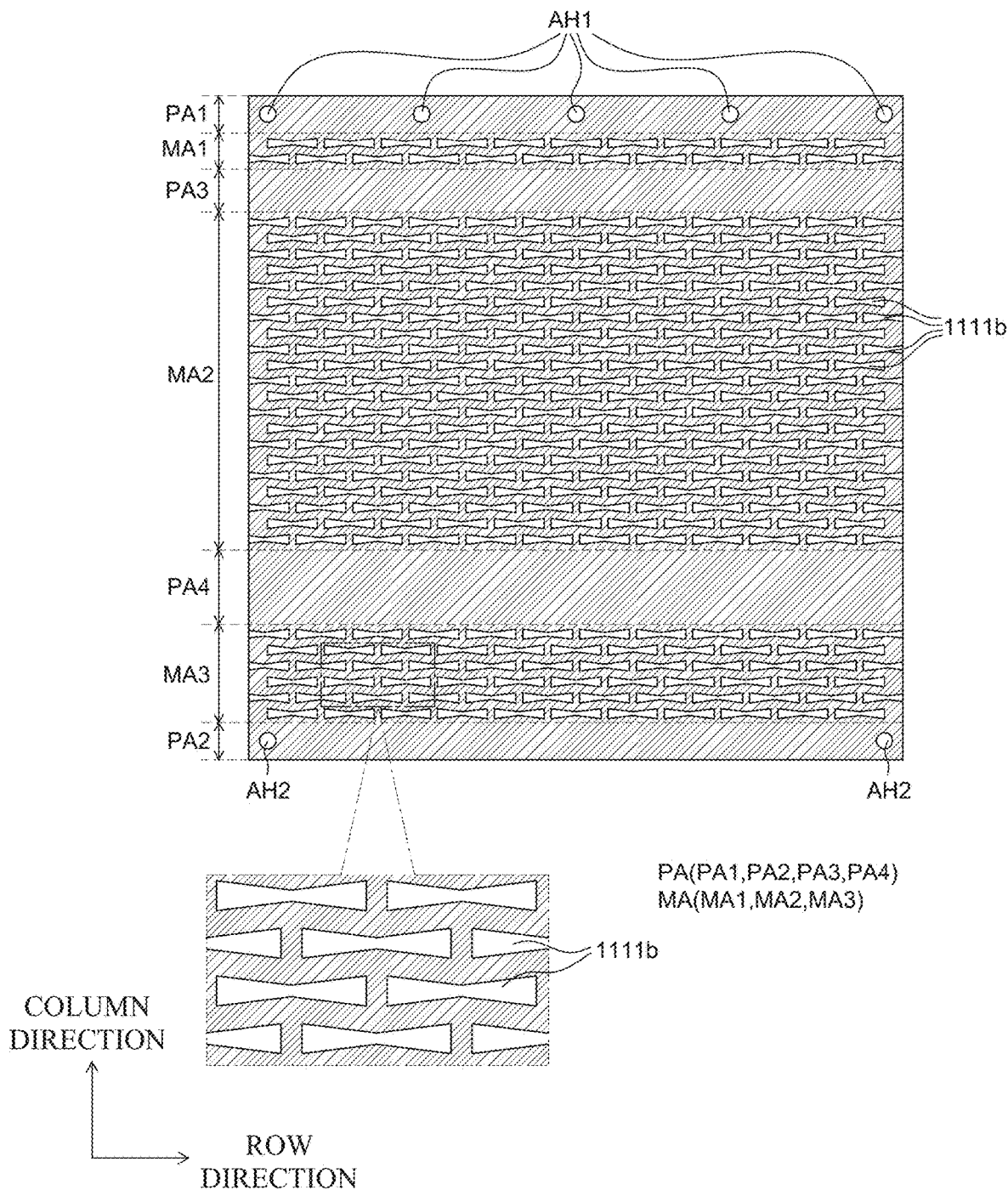
Figure 11C:
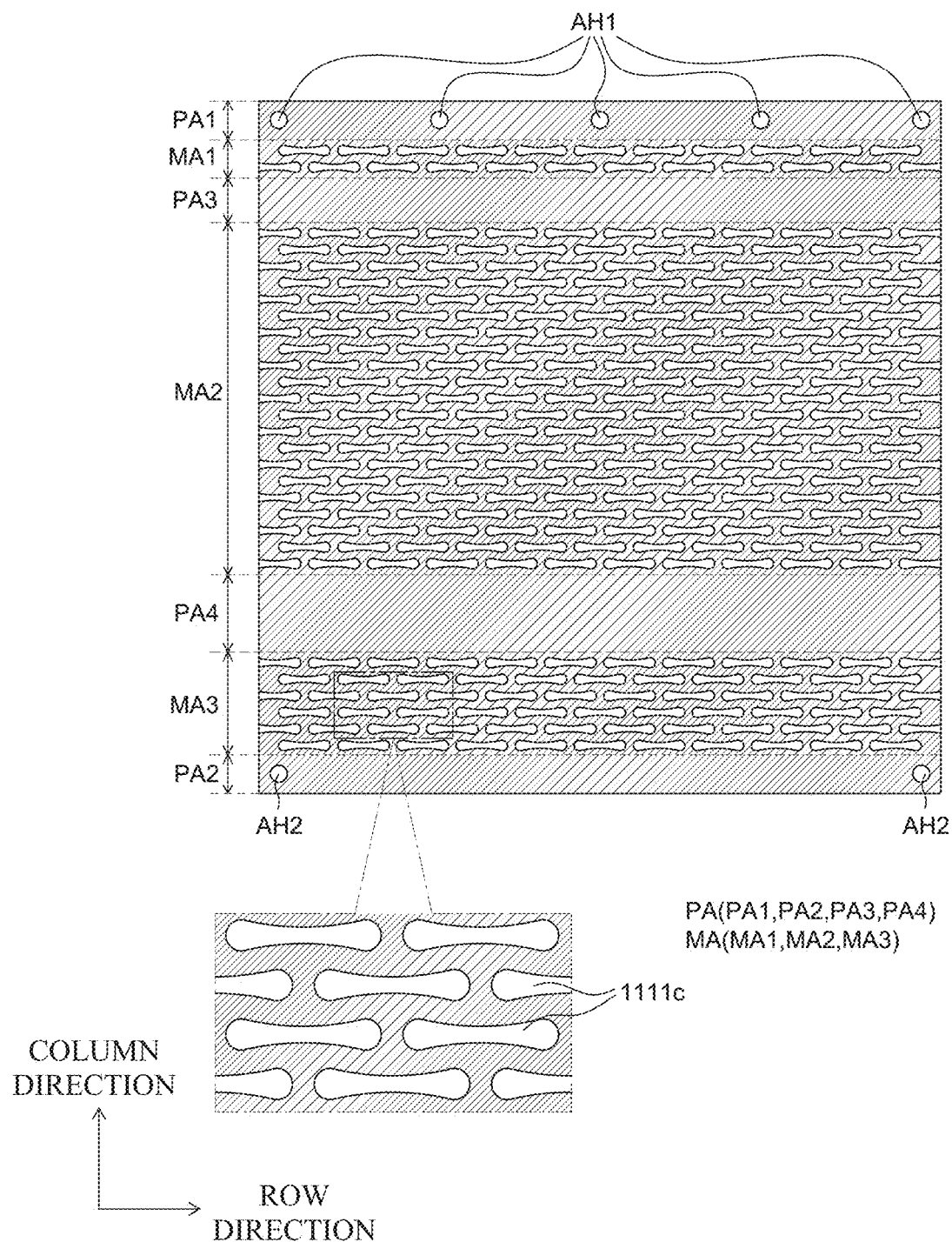

FIGS. 11A to 11C are plan views of back covers of a display device according to various exemplary embodiments of the present disclosure. The shapes of a plurality of openings 1111*a*, 1111*b*, and 1111*c* are different from those in other example embodiments above, but other configurations of the example back covers 1110*a*, 1110*b*, and 1110*c* of FIGS. 11A to 11C may be substantially the same as the example back cover 810 of FIGS. 8A to 9C. Thus, a redundant description will be omitted.

As shown in FIG. 11A, a plurality of openings 1111*a* may be disposed in a plurality of malleable areas MA of a back cover 1110*a*. The plurality of openings 1111*a* may have an oval shape. Specifically, the plurality of openings 1111*a* may be formed to have an oval shape having a major axis in a row direction and a minor axis in a column direction.

As illustrated in FIG. 11B, a plurality of openings 1111*b* may be disposed in a plurality of malleable areas MA of a back cover 1110*b*. The plurality of openings 1111*b* may have a ribbon shape. Specifically, a width of the plurality of openings 1111*b* in a column direction may decrease from both ends of the plurality of openings 1111*b* to the center of the plurality of openings 1111*b*. Therefore, the plurality of openings 1111*b* may have a ribbon-like shape.

As shown in FIG. 11C, a plurality of openings 1111*c* may be disposed in a plurality of malleable areas MA of a back cover 1110*c*. The plurality of openings 1111*c* may have a dumbbell shape. Specifically, the width of the plurality of openings 1111*c* in the column direction may decrease toward the center of the plurality of openings 1111*c*. The width of the plurality of openings 1111*c* in the column direction may increase farther away from the center of the plurality of openings 1111*c*. In this case, both ends of the plurality of openings 1111*c* in the row direction may have a round shape. Therefore, the plurality of openings 1111*c* may have a dumbbell-like shape.

FIGS. 11A to 11C illustrate the plurality of example openings 1111*a*, 1111*b*, and 1111*c* with an oval shape, a ribbon shape, and a dumbbell shape. However, if a width of the plurality of openings 1111*a*, 1111*b*, and 1111*c* in the row direction is larger than a width in the column direction, the shape of the openings is not limited to these specific examples. For example, the plurality of openings 1111*a*, 1111*b*, and 1111*c* may be designed to have various other shapes, such as a rectangular shape or a rhombus shape.

Even though FIGS. 11A to 11C illustrate various shapes of the plurality of example openings 1111*a*, 1111*b*, and 1111*c* in the configuration of the example back cover 810 illustrated in FIG. 8B, the plurality of example openings 1111*a*, 1111*b*, and 1111*c* of FIGS. 11A to 11C may also be applied to the example back cover 110 illustrated in FIG. 7A, and embodiments are not limited thereto.

Further, even though FIGS. 11A to 11C illustrate that the plurality of example openings 1111*a*, 1111*b*, and 1111*c* of the back covers 1110*a*, 1110*b*, and 1110*c* has the same respective shapes, the plurality of openings 1111*a*, 1111*b*, and 1111*c* of the back covers 1110*a*, 1110*b*, and 1110*c* may have different shapes.

In display devices according to still another exemplary embodiment of the present disclosure, the respective shapes of the plurality of openings 1111*a*, 1111*b*, and 1111*c* of the back covers 1110*a*, 1110*b*, and 1110*c* may vary to minimize the stress applied to the display panel 120 and flexibly deform the back covers 1110*a*, 1110*b*, and 1110*c*. Specifically, as the plurality of openings 1111*a*, 1111*b*, and 1111*c* is formed in the back covers 1110*a*, 1110*b*, and 1110*c*, when the back covers 1110*a*, 1110*b*, and 1110*c* are wound or unwound, the back covers 1110*a*, 1110*b*, and 1110*c* may be flexibly deformed. The plurality of openings 1111*a*, 1111*b*, and 1111*c* may be flexibly deformed so that the stress generated at the time of winding the back covers 1110*a*, 1110*b*, and 1110*c* may be dispersed, and the stress applied to the display panel 120 disposed in the plurality of malleable areas MA of the back covers 1110*a*, 1110*b*, and 1110*c* may also be minimized. In this case, the plurality of openings 1111*a*, 1111*b*, and 1111*c* may be formed such that their boundaries are not parallel to each other in the row direction to disperse the stress. Specifically, when the back covers 1110*a*, 1110*b*, and 1110*c* are wound in the column direction of the plurality of openings 1111*a*, 1111*b*, and 1111*c*, the stress may be applied in a direction of vertically extending the plurality of openings 1111*a*, 1111*b*, and 1111*c*, that is, in a column direction. The stress may be concentrated on the boundaries of the plurality of openings 1111*a*, 1111*b*, and 1111*c* extending in a direction parallel to the row direction. In this case, if the boundaries of the plurality of openings 1111*a*, 1111*b*, and 1111*c* in the row direction are not parallel to the row direction, that is, if the boundaries of the plurality of openings 1111*a*, 1111*b*, and 1111*c* extend in a direction different from the row direction, normal directions of the plurality of openings 1111*a*, 1111*b*, and 1111*c* in the boundaries may be defined in various directions, and the stress may also be dispersed in various directions.

For example, if the plurality of openings 1111*a* has an oval shape as in the example back cover 1110*a* of FIG. 11A, the boundaries of the plurality of openings 1111*a* have a curved surface with respect to the row direction. Therefore, when the stress is applied to the plurality of openings 1111*a* having an oval shape, the stress may be dispersed in various directions along the normal direction of the curved surface which is the boundary of the plurality of openings 1111a.

Next, if the plurality of openings 1111b has a ribbon shape as in the example back cover 1110b of FIG. 11B, the boundaries of the plurality of openings 1111b in the row direction have inclined surfaces. Therefore, when the stress is applied to the plurality of openings 1111b having a ribbon shape, the stress may be dispersed along the inclined surfaces which are the boundaries of the plurality of openings 1111b.

Finally, if the plurality of openings 1111c has a dumbbell shape as in the example back cover 1110c of FIG. 11C, the boundaries of the plurality of openings 1111c in the row direction have curved surfaces. Therefore, when the stress is applied to the plurality of openings 1111c having a dumbbell shape, the stress may be dispersed along a normal direction of the curved surfaces which are the boundaries of the plurality of openings 1111c. If both ends of the plurality of openings 1111c are relatively narrow and angled, the stress may be concentrated on both ends of the plurality of openings 1111c. In this case, the plurality of openings 1111c having a dumbbell shape may be formed such that both ends have curved surfaces, and both ends of the plurality of openings 1111c may have a larger width in the column direction than the center portion of the plurality of openings 1111c. Therefore, in the plurality of openings 1111c having a dumbbell shape, widths of both ends in the column direction may be formed to be relatively large and to have a curved surface so that the concentration of the stress on both ends of the plurality of openings 1111c may be minimized.

Therefore, in the display device according to still another exemplary embodiment of the present disclosure, the plurality of openings 1111a, 1111b, and 1111c of the back covers 1110a, 1110b, and 1110c may be formed such that the boundaries of the plurality of openings 1111a, 1111b, and 1111c in the row direction are not parallel to the row direction. Therefore, the stress which is applied to expand the plurality of openings 1111a, 1111b, and 1111c in the column direction at the time of winding the back covers 1110a, 1110b, and 1110c may be dispersed.

<ReinforCement Area for Reinforcing Rigidity of Back Cover>

Figure 12:
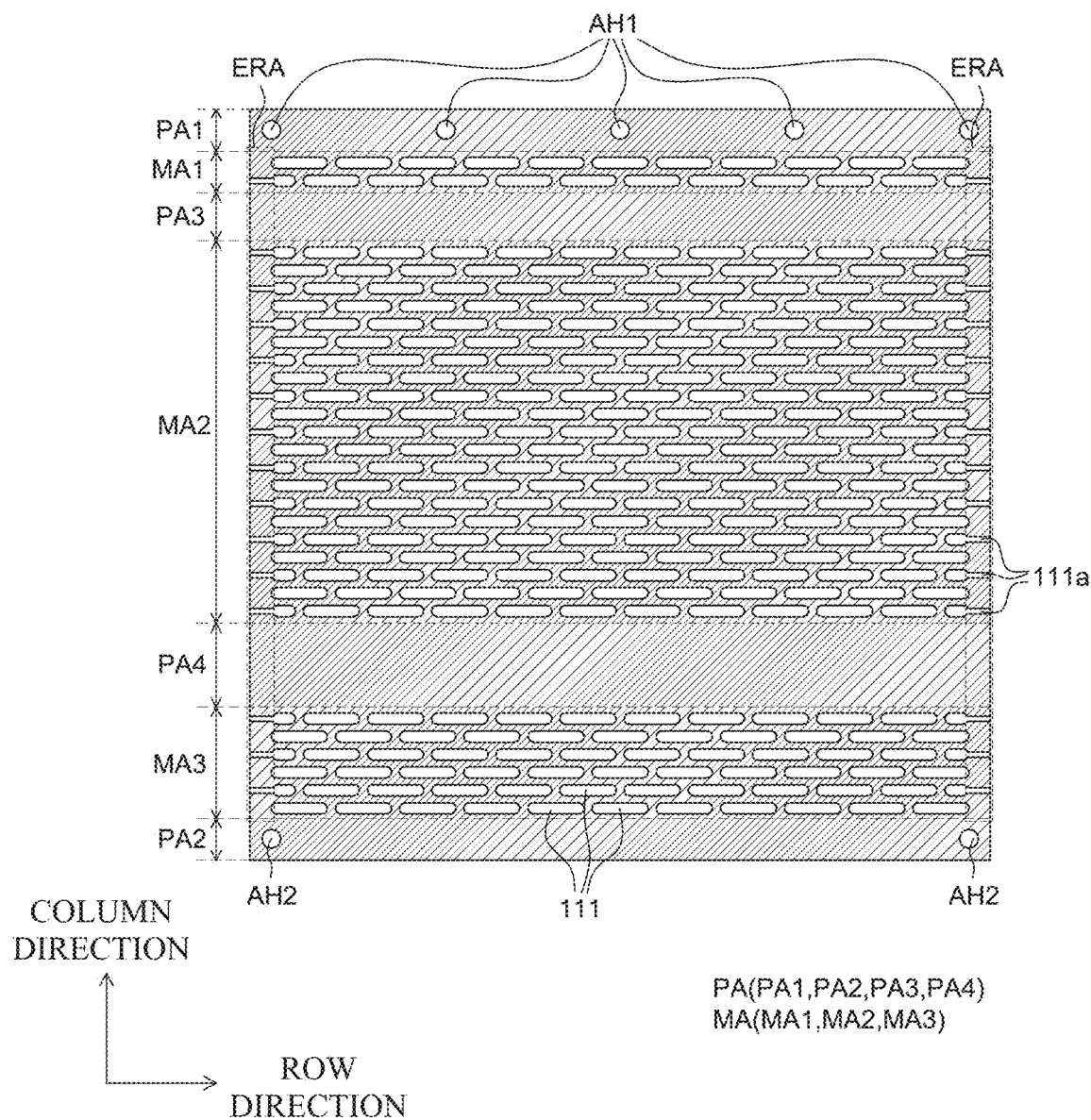
FIG. 12 is a plan view of a back cover of a display device according to still another exemplary embodiment of the present disclosure.

FIG. 12 is a plan view of a back cover of a display device according to still another exemplary embodiment of the present disclosure. With the exception of an edge reinforcement area ERA being added, other configurations of an example back cover 1210 of FIG. 12 may be substantially the same as those of the example back covers 810 of FIGS. 8A to 9C. Thus, a redundant description will be omitted.

As illustrated in FIG. 12, in a back cover 1210, edge reinforcement areas ERA may be disposed in a left edge and a right edge of the plurality of malleable areas MA. The edge reinforcement areas ERA may have a plurality of openings 111a with a smaller width in a column direction than the plurality of openings 111 in the plurality of malleable areas MA. The edge reinforcement area ERA may have a higher rigidity than the plurality of malleable areas MA. Therefore, the edge reinforcement area ERA may be disposed in the back cover 1210 so that the rigidity at the left edge and the right edge of the back cover 1210 may be enhanced.

A plurality of openings 111a disposed in the edge reinforcement areas ERA may be formed to extend from a plurality of openings 111 closest to the edge reinforcement areas ERA among the plurality of openings 111 disposed in the plurality of malleable areas MA. The plurality of openings 111a of the edge reinforcement areas ERA may have a smaller width in the column direction than the plurality of openings 111 of the malleable area MA. Therefore, an aperture ratio of the edge reinforcement areas ERA may be lower than an aperture ratio of the plurality of malleable areas MA. Therefore, the rigidity of the back cover 1210 may be further enhanced in the edge reinforcement areas ERA.

In the back cover 1210 according to another exemplary embodiment of the present disclosure, an edge reinforcement areas ERA may have a lower aperture ratio than the plurality of malleable areas MA. The edge reinforcement areas ERA may be disposed at the left edge and the right edge of the plurality of malleable areas MA, respectively, to enhance the rigidity at the sides of the back cover 1210. The plurality of openings 111a disposed in the edge reinforcement areas ERA disposed at the left edge and the right edge of the plurality of malleable areas MA may have a smaller width in the column direction than the plurality of openings 111 in the plurality of malleable area MA. Therefore, an aperture ratio of the edge reinforcement areas ERA may be lower than an aperture ratio of the plurality of malleable areas MA, and the rigidity of the edge reinforcement areas ERA may be enhanced. Accordingly, the edge reinforcement areas ERA may enhance the rigidity at the left edge and the right edge of the back cover 1210, thus helping to maintain the back cover 1210 flat without being bent even when external impacts are applied to the left edge and the right edge of the back cover 1210. Therefore, in the display device according to another exemplary embodiment of the present disclosure, the edge reinforcement areas ERA may be disposed at the left edge and the right edge of the back cover 1210 to enhance the overall rigidity of the back cover 1210 and protect the display panel 120 from the external impacts.

Figure 13:
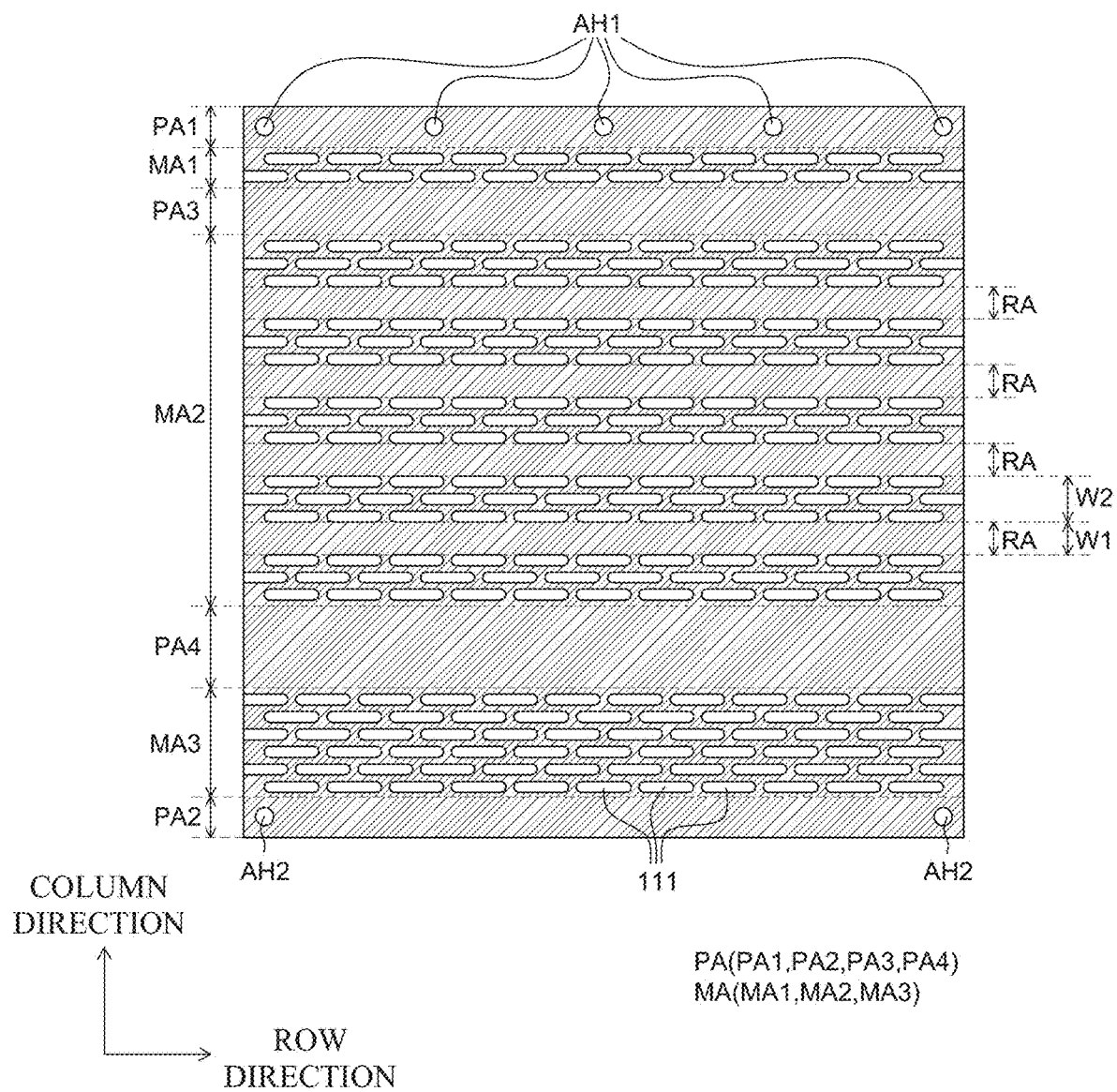
FIG. 13 is a plan view of a back cover of a display device according to still another exemplary embodiment of the present disclosure.

FIG. 13 is a plan view of a back cover of a display device according to still another exemplary embodiment of the present disclosure. With the exception of a plurality of reinforcement areas RA being added, other configurations of the example back cover 1310 of FIG. 13 may be substantially the same as that of the example back cover 810 of FIGS. 8A to 9C. Thus, a redundant description will be omitted.

As shown in FIG. 13, a plurality of reinforcement areas RA may be provided in the second malleable area MA2 of the back cover 1310. The plurality of reinforcement areas RA may be spaced apart from each other in the second malleable area MA. Specifically, the plurality of reinforcement areas RA may extend in a row direction in the second malleable area MA2, that is, in a length direction of the plurality of openings 111. The plurality of reinforcement areas RA may be spaced apart from each other in the column direction.

The plurality of openings 111 may be disposed in the remaining areas of the second malleable area MA2 except the plurality of reinforcement areas RA. That is, the plurality of openings 111 may be disposed between the plurality of reinforcement areas RA. The plurality of openings 111 may be disposed between the third support area PA3 and a reinforcement area RA closest to the third support area PA3 among the plurality of reinforcement areas RA. The plurality of openings 111 may also be disposed between the fourth support area PA4 and a reinforcement area RA closest to the fourth support area PA4 among the plurality of reinforcement areas RA.

In this case, a first width W1 of the plurality of reinforcement areas RA in the column direction may be smaller than a second width W2 which is a distance between the plurality of reinforcement areas RA in the column direction. Specifically, the plurality of reinforcement areas RA may be areas in which the plurality of openings 111 is not disposed and which have a higher rigidity than parts of the second malleable area MA2 in which the plurality of openings 111 is disposed. Therefore, the larger the first width W1 of the plurality of reinforcement areas RA in the column direction, the higher the rigidity of the back cover 1310. On the other hand, parts of the second malleable area MA2 between the plurality of reinforcement areas RA in which the plurality of openings 111 is disposed may have a higher flexibility than the plurality of reinforcement areas RA. Therefore, the larger the second width W2 between the plurality of reinforcement areas RA, the higher the flexibility of the back cover 1310, so that the back cover 1310 may be more easily wound or unwound. In summary, the larger the first width W1, the higher the rigidity of the back cover 1310 and the lower the flexibility. Further, the larger the second width W2, the higher the flexibility of the back cover 1310 and the lower the rigidity.

However, the second malleable area MA2 may be a portion to which a center portion or a lower end portion of the display panel 120 may be attached and which is wound around or unwound from the roller 851 to be disposed inside or outside the housing unit HP. Therefore, in order to more easily wind or unwind the second malleable area MA2 around the roller 851, the second width W2 between the plurality of reinforcement areas RA may be formed to be larger than the first width W1 of the plurality of reinforcement areas RA in the column direction to ensure the flexibility of the second malleable area MA2. Further, since the plurality of reinforcement areas RA may be further disposed in the second malleable area MA2, the rigidity of the second malleable area MA2 may be enhanced. Simultaneously, the first width W1 of the plurality of reinforcement areas RA in the column direction may be formed to be smaller than the second width W2 between the plurality of reinforcement areas RA to ensure the flexibility of the second malleable area MA2.

In the back cover 1310 according to still another exemplary embodiment of the present disclosure, the plurality of reinforcement areas RA may be disposed in the second malleable area MA2 of the back cover 1310, to simultaneously ensure the flexibility and the rigidity of the back cover 1310. Specifically, the plurality of reinforcement areas RA may be disposed in the second malleable area MA2 of the back cover 1310. The plurality of reinforcement areas RA may be areas where the plurality of openings 111 is not disposed. The plurality of reinforcement areas RA may have a higher rigidity than the second malleable area MA2 in which the plurality of openings 111 is disposed. Further, the plurality of openings 111 may be disposed between the third support areas PA3 and the adjacent reinforcement area RA, between the plurality of reinforcement areas RA, and between the fourth support area PA4 and the adjacent reinforcement area RA. Parts of the second malleable area MA2 in which the plurality of openings 111 is disposed may have a high flexibility. The second malleable area MA2 is an area which may be wound around or unwound from the roller 851 so that a predetermined level of flexibility may need to be ensured. Therefore, the first width W1 of the plurality of reinforcement areas RA having a low flexibility in the column direction may be formed to be smaller than the second width W2 in the column direction of the areas of the second malleable area MA2 in which the plurality of openings 111 is disposed, to enhance the flexibility of the second malleable area MA2. Further, in the second malleable area MA2, the plurality of reinforcement areas RA having a high rigidity is disposed so that the rigidity of the second malleable area MA2 may also be enhanced. Therefore, in the back cover 1310 according to another exemplary embodiment of the present disclosure, the plurality of reinforcement areas RA is disposed in the second malleable area MA2 to enhance the rigidity of the back cover 1310 and to protect the back cover 1310 and the display panel 120 from the external impacts. Further, the first width W1 of the plurality of reinforcement areas RA in the column direction may be formed to be smaller than the second width W2 between the plurality of reinforcement areas RA to ensure the flexibility of the back cover 1310.

If the first width W1 of the plurality of reinforcement areas RA in the column direction is excessively increased, the plurality of reinforcement areas RA may interfere with the winding or unwinding of the back cover 1310 around the roller 851 and may break the display panel 120. Specifically, even though the plurality of reinforcement areas RA may be wound around the roller 851, the flexibility thereof may be lower than that of the other parts of the malleable area MA2 or of other malleable areas MA so that it may be more difficult for the plurality of reinforcement areas RA to be flexibly deformed along the shape of the roller 851. Therefore, there may be a limit to how much the plurality of reinforcement areas RA may be bent. Further, if the first width W1 of the plurality of reinforcement areas RA in the column direction is excessively increased, an upper corner of the plurality of reinforcement areas RA may interfere with the display panel 120 on the plurality of reinforcement areas RA and may break the display panel 120. Therefore, the first width W1 of the plurality of reinforcement areas RA in the column direction may be appropriately determined based on a radius of the roller 851, and respective thicknesses of the display panel 120 and the back cover 1310.

Hereinafter, designing of the width of the plurality of reinforcement areas RA will be described with reference to FIG. 14.

Figure 14:
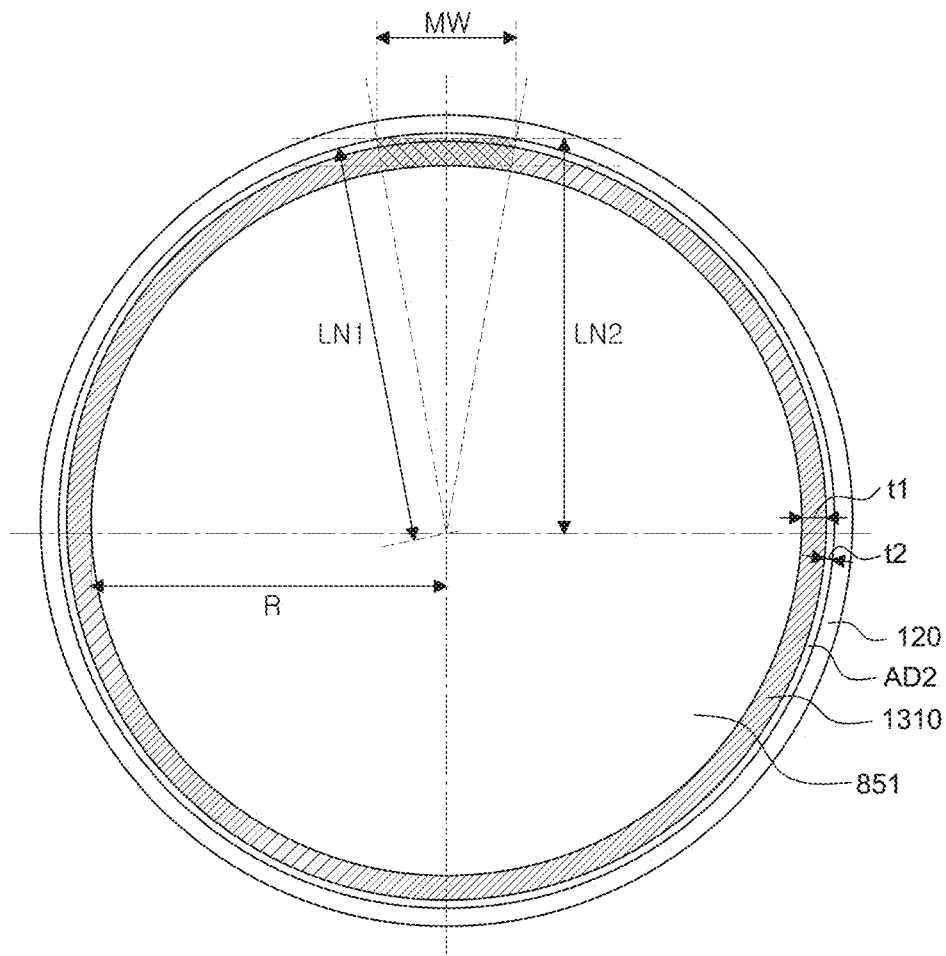
FIG. 14 is a schematic cross-sectional view for explaining a width of a reinforcement area of a back cover of a display device according to still another exemplary embodiment of the present disclosure.

FIG. 14 is a schematic cross-sectional view for explaining a width of a reinforcement area of a back cover of a display device according to still another exemplary embodiment of the present disclosure. For the convenience of description, in FIG. 14, only a roller 851, a display panel 120, a second adhesive layer AD2, and a back cover 1310 are schematically illustrated. Further, for the purpose of this description, cross-sections of the display panel 120, the second adhesive layer AD2, and the back cover 1310 are assumed to have a circular shape, and the back cover 1310, the second adhesive layer AD2, and the display panel 120 are assumed to be sequentially disposed on an outer circumferential surface of the roller 851.

As illustrated in FIG. 14, a maximum width MW of the plurality of reinforcement areas RA may be determined based on a radius R of the roller 851, a thickness t1 of the back cover 1310, a thickness t2 of the second adhesive layer AD2, and a compressibility a of the second adhesive layer AD2.

Here, a straight-line length from the center of the roller 851 to the outer circumferential surface of the roller 851 may be defined as a radius R of the roller 851. Further, a straight-line length from the center of the roller 851 to an outer circumferential surface of the second adhesive layer AD2 which is wound around the roller 851 may be defined as a first length LN1. In this case, the first length LN1 may be calculated by adding the radius R of the roller 851, the thickness t1 of the back cover 1310, and a value obtained by multiplying a compressibility "a" with the thickness t2 of the second adhesive layer AD2. In addition, a straight-line length from the center of the roller 851 to an outer circumferential surface of the back cover 1310 which is wound around the roller 851 may be defined as a second length LN2. In this case, the second length LN2 may be calculated by adding the radius R of the roller 851 and the thickness t1 of the back cover 1310.

Next, the maximum width MW of the plurality of reinforcement areas RA may be calculated based on the first length LN1 and the second length LN2. Specifically, the maximum width MW of the plurality of reinforcement areas RA may be calculated by the following Equation 1:

$$\text{Maximum width of reinforcement area} = 2 \times [\sqrt{\{(LN1)^2 - (LN2)^2\}}] = 2 \times [\sqrt{\{(R+t1+t2 \times a)^2 - (R+t1)^2\}}] \quad [\text{Equation 1}]$$

Based on Equation 1, the maximum width MW of the reinforcement area RA may be obtained by doubling the square root of a value obtained by subtracting the square of the second length LN2 from the square of the first length LN1.

With the back cover 1310 already in a state of being wound around the roller 851 once, a different radius R of the roller 851 may be defined to determine a maximum width MW of the plurality of reinforcement areas RA in a part of the back cover 1310 which is wound a second turn around the roller 851. In this case, the radius R of the roller 851 may be defined as a radius of an entire member around which the back cover 1310 is wound the second turn. For example, in Equation 1, the radius R of the roller 851 may be defined differently as a value obtained by adding the radius R of the roller 851 and the thickness t1 of the back cover 1310 to calculate the maximum width MW of the reinforcement area RA in the part of the back cover 1310 wound the second turn around the roller 851.

When the maximum width MW of the plurality of reinforcement areas RA exceeds the value calculated by Equation 1, an upper corner of the plurality of reinforcement areas RA may interfere with the display panel 120 on the second adhesive layer AD2. Specifically, because the plurality of reinforcement areas RA may have a lower flexibility than that of the plurality of malleable areas MA, the plurality of reinforcement areas RA may not be flexibly bent along the shape of the roller 851 in a similar manner as the plurality of malleable areas MA and may have a limit as to how much it may be bent. If the width of the plurality of reinforcement areas RA is excessively large, when the back cover 1310 is wound around the roller 851, the upper corner of the plurality of reinforcement areas RA may not be bent along the shape of the roller 851, but may protrude to the second adhesive layer AD2 and to the display panel 120 from the outer circumferential surface of the roller 851. Therefore, the upper corner of the plurality of reinforcement areas RA may apply excessive stress to the second adhesive layer AD2 and the display panel 120 so that the display panel 120 may be damaged. Further, the upper corner of the plurality of reinforcement areas RA may penetrate the second adhesive layer AD2 to be in direct contact with the display panel 120 so that the display panel 120 may be damaged.

In a display device according to still another exemplary embodiment of the present disclosure, in order to ensure the rigidity of the back cover 1310, a plurality of reinforcement areas RA may be disposed in the back cover 1310. Further, the maximum width MW of the plurality of reinforcement areas RA may be designed in consideration of a radius R of the roller 851, a thickness t1 of the back cover 1310, a thickness t2 of the second adhesive layer AD2, and a compressibility "a" of the second adhesive layer AD2. First, the plurality of reinforcement areas RA may be areas where the plurality of openings 111 is not disposed and may have a rigidity higher than that of the malleable areas MA. Therefore, the plurality of reinforcement areas RA may be disposed in a malleable area MA, e.g., the second malleable area MA2, with a constant interval to enhance the rigidity of the back cover 1310 in the malleable area MA, and stably support and protect the display panel 120.

In a display device according to still another exemplary embodiment of the present disclosure, the maximum widths MW of the plurality of reinforcement areas RA may be designed such that the upper corner of the plurality of reinforcement areas RA does not interfere with the display panel 120. Specifically, the maximum width MW of the plurality of reinforcement areas RA may be designed in consideration of a radius R of the roller 851, a thickness t1 of the back cover 1310, a thickness t2 of the second adhesive layer AD2, and a compressibility "a" of the second adhesive layer AD2. Since the plurality of reinforcement areas RA has a low flexibility due to a high rigidity, when the back cover 1310 is wound around the roller 851, it may be difficult to bend the back cover 1310 along the shape of the roller 851 and the back cover 1310 may have a limit as to how much it may be bent. Therefore, when the back cover 1310 including the plurality of reinforcement areas RA is wound around the roller 851, the plurality of reinforcement areas RA may not be completely bent along the shape of the roller 851, and the upper corner of the plurality of reinforcement areas RA may protrude from the outer circumferential surface of the roller 851 to apply excessive pressure on the second adhesive layer AD2. In this case, if the width of the plurality of reinforcement areas RA is excessively large, the upper corner of the plurality of reinforcement areas RA may apply excessive pressure on the second adhesive layer AD2 to reach a rear surface of the display panel 120. If the corner of the plurality of reinforcement areas RA comes in contact with the display panel 120, the display panel 120 may be damaged. Therefore, in the display device according to still another exemplary embodiment of the present disclosure, the maximum width MW of the plurality of reinforcement areas RA may be designed in consideration of the radius R of the roller 851, the thickness t1 of the back cover 1310, the thickness t2 of the second adhesive layer AD2, and the compressibility "a" of the second adhesive layer AD2. Further, any damage of the display panel 120 caused by the plurality of reinforcement areas RA may be prevented or minimized while the plurality of reinforcement areas RA enhances the rigidity of the back cover 1310.

<Protrusion for Reinforcing Rigidity of Back Cover>

Figure 15A:
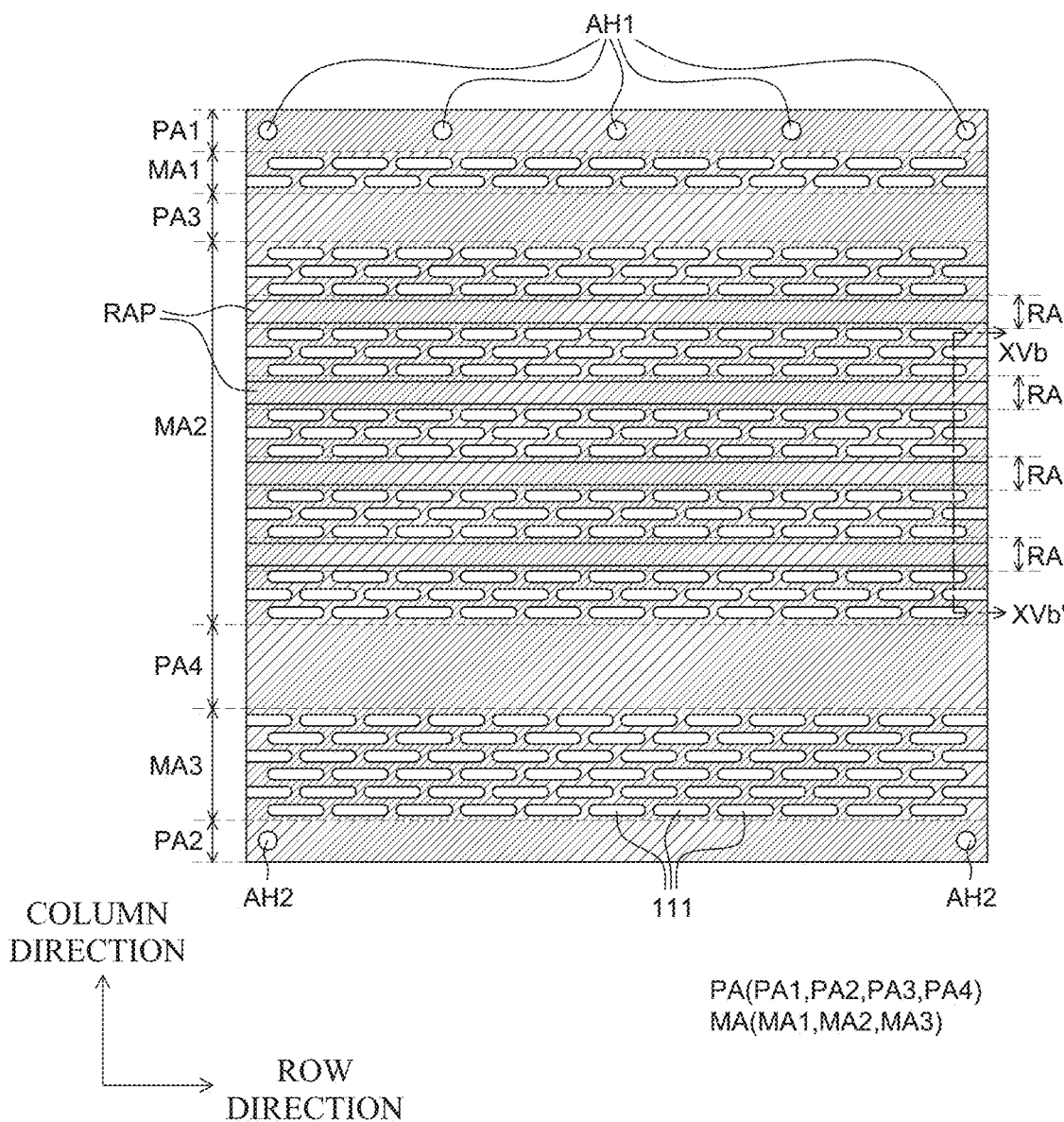
FIG. 15A is a plan view of a back cover of a display device according to still another exemplary embodiment of the present disclosure.
Figure 15B:
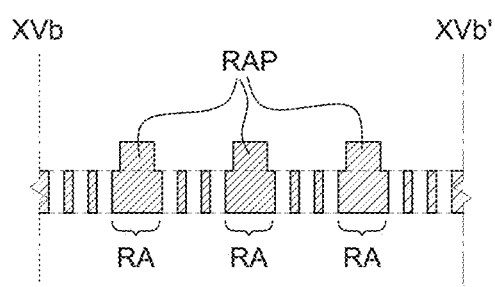
FIG. 15B is a cross-sectional view taken along the line XVb-XVb' of FIG. 15A.

FIG. 15A is a plan view of a back cover of a display device according to still another exemplary embodiment of the present disclosure. FIG. 15B is a cross-sectional view taken along the line XV-XV' of FIG. 15A. With the exception of protrusions RAP being further provided, other configurations of the example back cover 1510 of FIGS. 15A and 15B are substantially the same as the example back cover 1310 of FIG. 13. Thus, a redundant description will be omitted.

As illustrated in FIGS. 15A and 15B, a plurality of protrusions RAP may be further disposed in the plurality of reinforcement areas RA of the back cover 1510. Specifically, each of the plurality of protrusions RAP may be disposed to overlap each of the plurality of reinforcement areas RA, respectively, and may extend in a row direction along the plurality of reinforcement areas RA.

The protrusions RAP may be located on a rear surface of the back cover 1510 to which the display panel 120 is not attached. If the protrusions RAP are located on a front surface of the back cover 1510 to which the display panel 120 is attached, the surface of the display panel 120 may not be even and may have unevenness due to the protrusions RAP. Therefore, the protrusions RAP may be located on the rear surface of the back cover 1510 to which the display panel 120 is not attached so as not to be in contact with the display panel 120. That is, the protrusions RAP may be disposed on the rear surface 1510, which is an opposite surface of the front surface of the back cover 1510 facing the display panel 120 in the plurality of reinforcement areas RA.

The protrusions RAP may be formed to be integrated with the plurality of reinforcement areas RA. For example, the front surface and the rear surface of the back cover 1510 may be simultaneously etched to form the plurality of openings 111, the plurality of reinforcement areas RA, and the protrusions RAP in the back cover 1510. Specifically, at the same time that the plurality of openings 111 in the back cover 1510 is formed, the remaining regions other than the protrusions RAP may be etched to form the protrusions RAP in the area overlapping the plurality of reinforcement areas RA on the rear surface of the back cover 1510. By doing this, the plurality of reinforcement areas RA and the protrusions RAP may be integrally formed. Alternatively, the protrusions RAP may be separately attached to the plurality of reinforcement areas RA, but are not limited thereto.

As described above in detail with reference to FIG. 14, the width of the protrusions RAP in the column direction may be designed to be equal to the maximum width MW of the plurality of reinforcement areas RA. If the width of the protrusions RAP in the column direction is larger than the maximum width MW of the plurality of reinforcement areas RA, the protrusions RAP may interfere with the winding or unwinding of the back cover 1510, and corners of the protrusions RAP may interfere with the display panel 120. Therefore, the maximum width of the protrusions RAP in the column direction may be smaller than or equal to the maximum width MW of the plurality of reinforcement areas RA in the column direction.

In the display device according to another exemplary embodiment of the present disclosure, the plurality of reinforcement areas RA and protrusions RAP may be disposed in the back cover 1510 to enhance the rigidity of the back cover 1510. Specifically, the plurality of reinforcement areas RA and the protrusions RAP protruding out of the rear surface of the back cover 1510 from the plurality of reinforcement areas RA may be located in the second malleable area MA2 of the back cover 1510. The plurality of reinforcement areas RA and the protrusions RAP may be areas where the plurality of openings 111 is not disposed and may have a rigidity higher than that of the plurality of malleable areas MA. Therefore, the plurality of reinforcement areas RA and the protrusions RAP may enhance the rigidity of the back cover 1510 to protect the back cover 1510 and the display panel 120 attached to the back cover 1510 from external impacts.

Further, in the display device according to still another exemplary embodiment of the present disclosure, even if external impacts are applied to the left edge and the right edge of the back cover 1510, the protrusions RAP may support the plurality of reinforcement areas RA so that the back cover 1510 may be maintained flat without being bent. Therefore, in the display device according to another exemplary embodiment of the present disclosure, the protrusions RAP may be further provided in the plurality of reinforcement areas RA of the back cover 1510 to enhance the rigidity at both edges of the back cover 1510.

Figure 16:
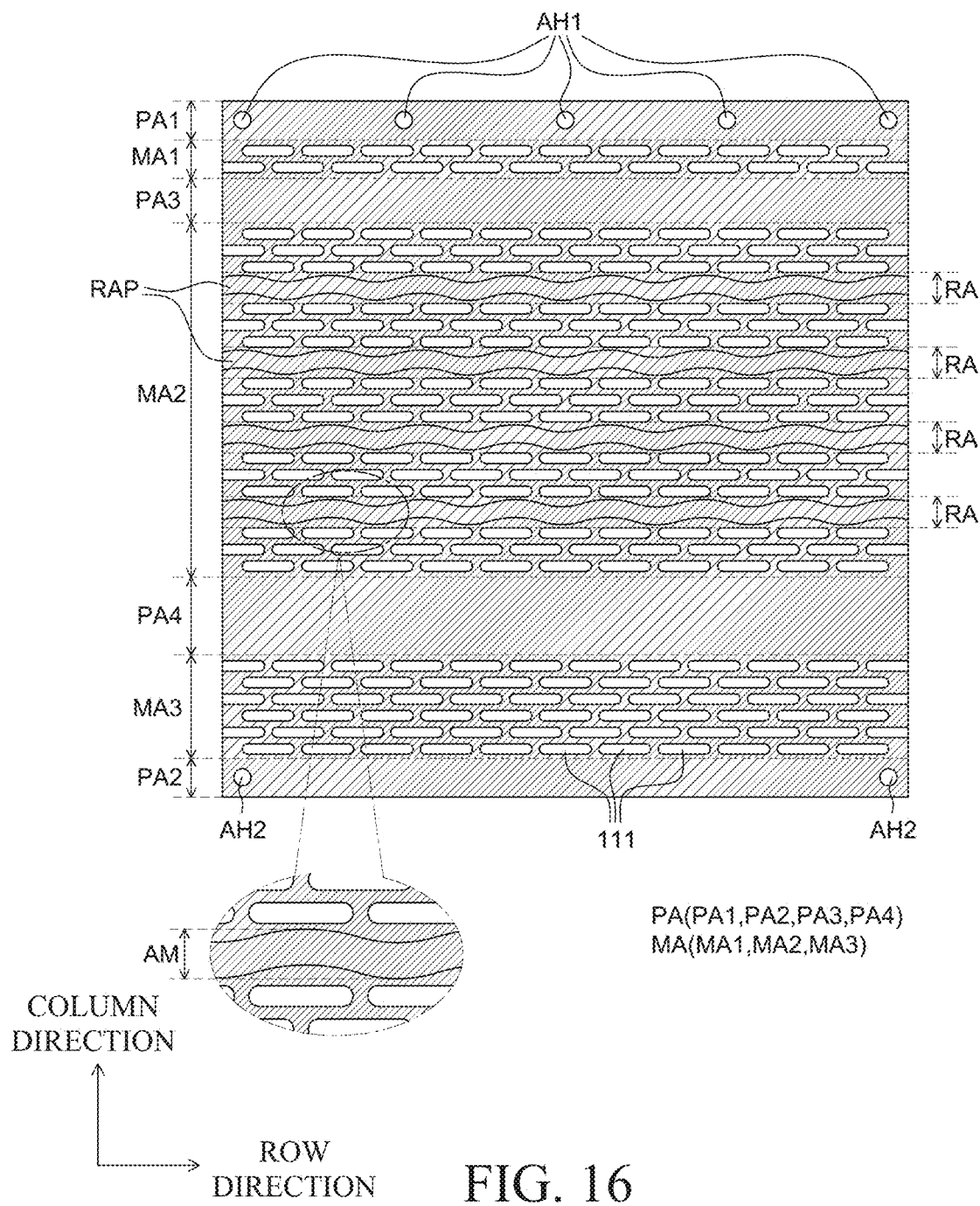
FIG. 16 is a plan view of a back cover of a display device according to still another exemplary embodiment of the present disclosure.

FIG. 16 is a plan view of a back cover of a display device according to still another exemplary embodiment of the present disclosure. With the exception of a shape of protrusions RAP being different, other configurations of the example back cover 1610 of FIG. 16 may be substantially the same as the example back cover 1510 of FIGS. 15A and 15B. Thus, a redundant description will be omitted.

As shown in FIG. 16, the plurality of protrusions RAP may extend in a row direction and may have a sine wave shape. That is, the protrusions RAP may have a curved shape rather than a straight-line shape. Further, a distance AM between an uppermost portion and a lowermost portion of the plurality of protrusions RAP in a column direction may not exceed the maximum width MW of the plurality of reinforcement areas RA, which has been described above with reference to FIG. 14. Here, the distance AM between the uppermost portion and the lowermost portion of the protrusions RAP may be defined as a width in the column direction between a maximum protruding point at the uppermost position and a maximum protruding point at the lowermost position.

Even though, in FIG. 16, the plurality of protrusions RAP is illustrated to have a sine wave shape and the plurality of reinforcement areas RA a linear shape, so long as the distance AM between the uppermost portion and the lowermost portion of the protrusions RAP does not exceed the maximum width MW of the reinforcement area RA, the shapes of the plurality of reinforcement areas RA and of the protrusions RAP may be modified in various shapes and are not limited to the illustrated example. For example, the protrusions RAP may have a zigzag pattern or a pulse wave shape. Furthermore, the shape of the protrusions RAP may be a periodic pattern or aperiodic pattern.

In the display device according to another exemplary embodiment of the present disclosure, the plurality of protrusions RAP having various shapes may be disposed in the back cover 1610 to enhance the rigidity of the back cover 1610. Specifically, the plurality of reinforcement areas RA and the protrusions RAP protruding out of the rear surface of the back cover 1610 from the plurality of reinforcement areas RA may be disposed in the second malleable area MA2 of the back cover 1610. The plurality of protrusions RAP may extend in a row direction and may have a sine wave shape or another shape. In this case, the distance AM between the uppermost portion and the lowermost portion of the protrusions RAP in the column direction may be within the maximum width MW of the reinforcement area RA determined by the radius R of the roller 851, the thickness t1 of the back cover 1610, the thickness t2 of the second adhesive layer AD2, and the compressibility "a" of the second adhesive layer AD2. Therefore, when the back cover 1610 is wound, the plurality of protrusions RAP and the plurality of reinforcement areas RA may enhance the rigidity of the back cover 1610 without interfering with the display panel 120 to protect the back cover 1610 and the display panel 120 attached to the back cover 1610 from impacts from the outside of the back cover 1610. Therefore, in the display device according to another exemplary embodiment of the present disclosure, the plurality of reinforcement areas RA and protrusions RAP of the back cover 1610 may be designed to have various shapes and may enhance the rigidity of the back cover 1610.

<Protection of Edge of Back Cover and Mitigation of Risk>

Figure 17:
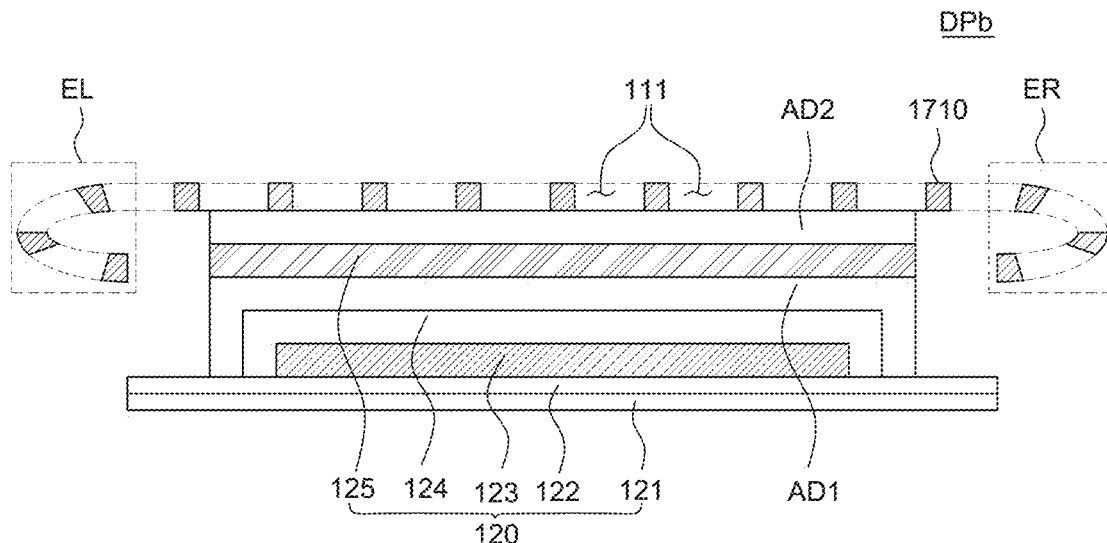
FIG. 17 is an enlarged cross-sectional view of a display unit of a display device according to still another exemplary embodiment of the present disclosure.

FIG. 17 is an enlarged cross-sectional view of a display unit of a display device according to still another exemplary embodiment of the present disclosure. With the exception of the back cover 1710 being different, other configurations of the example display unit DPb of FIG. 17 may be substantially the same as the example display unit DPa of FIGS. 8A to 9C. Thus, a redundant description will be omitted.

As illustrated in FIG. 17, a left edge and a right edge of the back cover 1710 may be bent. Specifically, the left edge and the right edge of the back cover 1710 may be bent toward the display panel 120 so that the left edge and the right edge of the back cover 1710 may be disposed so as to face the respective side of the display panel 120. The left edge and the right edge of the back cover 1710 may be bent to be spaced apart from the respective side of the display panel 120 and to face the respective side of the display panel 120. As the left edge and the right edge of the back cover 1710 are bent, a leftmost portion EL and a rightmost portion ER of the bent back cover 1710 may have a round shape.

In this case, even though the left edge and the right edge of the back cover 1710 are bent, the left edge and the right edge may be spaced apart from the display panel 120. Specifically, the left edge and the right edge of the back cover 1710 may be bent so as not to be in contact with the substrate 121, the buffer layer 122, the pixel unit 123, the encapsulation layer 124, and the encapsulation substrate 125 of the display panel 120.

Even though, in FIG. 17, the left edge and the right edge of the back cover 1710 are illustrated as not being in contact with the front surface of the back cover 1710, they are not limited to the illustrated example. For example, the left edge and the right edge of the back cover 1710 may be bent to be in contact with the front surface of the back cover 1710. Specifically, the left edge and the right edge of the back cover 1710 may be bent to be in contact with one surface of the back cover 1710 facing the display panel 120.

Since the back cover 1710 may be formed of a metal material or a plastic material having a high rigidity, the left edge and the right edge of the back cover 1710 may be very sharp. Further, if the back cover 1710 is thick, much stress may be generated by winding and unwinding of the display panel 120 and the back cover 1710. The back cover 1710 itself may undergo plastic deformation so that the back cover 1710 may be formed to have a very small thickness, e.g., approximately 200 μm. Therefore, a thin and sharp edge of the back cover 1710 may be vulnerable to external impacts to be easily deformed, posing a potential risk that the user may be injured by the sharp edge.

Therefore, in a display device according to still another exemplary embodiment of the present disclosure, the left edge and the right edge of the back cover 1710 may be bent to prevent or mitigate a sharp edge. Specifically, the left edge and the right edge of the back cover 1710 may be bent so that the leftmost portion EL and the rightmost portion ER of the bent back cover 1710 have a round shape. Therefore, a potential risk of the user being injured by the leftmost portion EL or the rightmost portion ER of the bent back cover 1710 may be prevented or mitigated.

Further, in the display device according to another exemplary embodiment of the present disclosure, the thickness of the leftmost portion EL and the rightmost portion ER of the back cover 1710 may be larger than that of other portions of the back cover 1710. Therefore, the rigidity in the leftmost portion EL and the rightmost portion ER of the bent back cover 1710 may be enhanced. Further, even if the external force is applied to the left and right of the back cover 1710, deformation of the back cover 1710 may be minimized. Further, a sharp edge of the back cover 1710 may be prevented or mitigated, and the rigidity of the back cover 1710 may be enhanced by a process of bending the edges of the back cover 1710 without incorporating an additional component.

<Suppression of Side Permeation Using Back Cover and Adhesive Layer>

Figure 18:
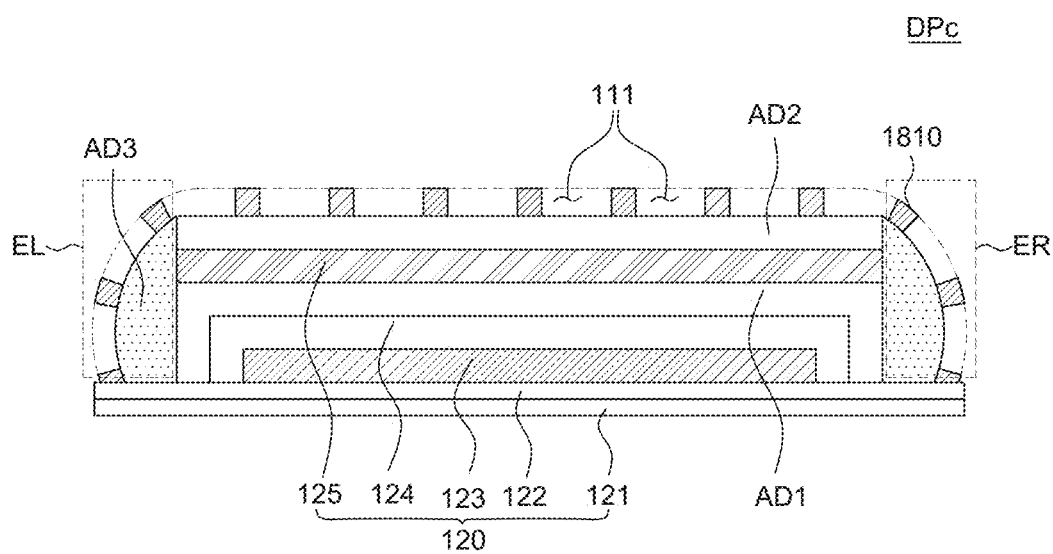
FIGS. 18 to 20 are enlarged cross-sectional views of a display unit of a display device according to various exemplary embodiments of the present disclosure.
Figure 19:
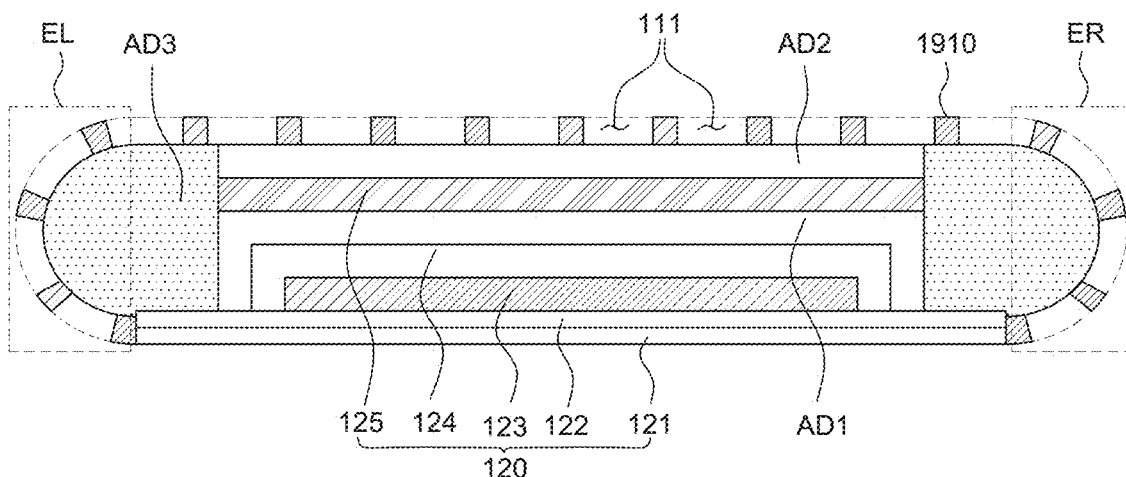
Figure 20:
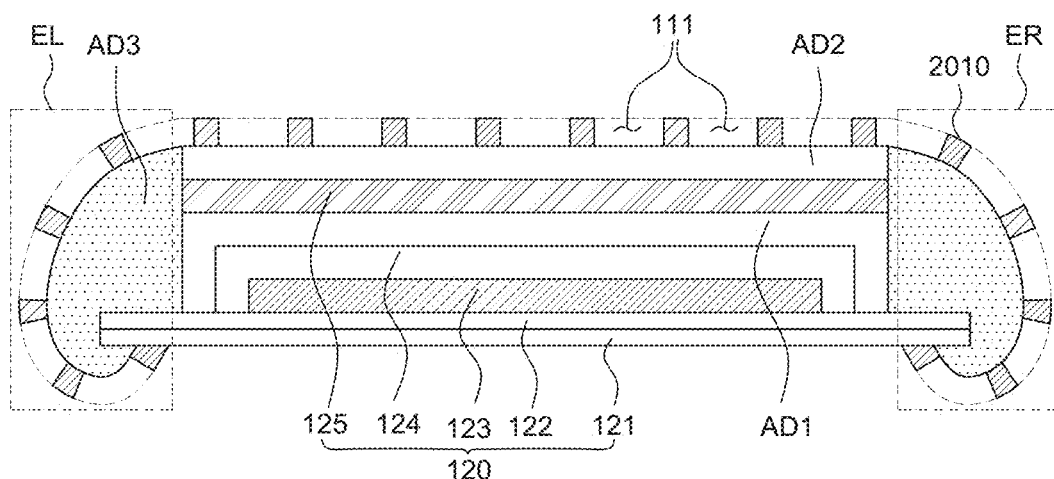

FIGS. 18 to 20 are enlarged cross-sectional views of a display unit of a display device according to various exemplary embodiments of the present disclosure. FIG. 18 is an enlarged cross-sectional view of a display unit DPc of a display device according to still another exemplary embodiment of the present disclosure. FIG. 19 is an enlarged cross-sectional view of a display unit DPd of a display device according to yet another exemplary embodiment of the present disclosure. FIG. 20 is an enlarged cross-sectional view of a display unit DPe of a display device according to still another exemplary embodiment of the present disclosure. With the exception of the back covers 1810, 1910, and 2010 being different and the third adhesive layer AD3 being added, other configurations of the example display units DPc, DPd, and DPe of FIGS. 18 to 20 may be substantially the same as the example display unit DPb of FIG. 17. Thus, a redundant description will be omitted.

As illustrated in FIGS. 18 to 20, the left edge and the right edge of the back covers 1810, 1910, and 2010 may be bent to be in contact with the display panel 120. For example, as shown in FIG. 18, the left edge and the right edge of the back cover 1810 may be bent to be in contact with the rear surface of the display panel 120. That is, as illustrated in FIG, 18, the left edge and the right edge of the back cover 1810 may be in contact with the rear surface of the buffer layer 122. However, embodiments not limited thereto, and the left edge and the right edge of the back cover 1810 may be bent to be in contact, for example, with the rear surface of the substrate 121 of the display panel 120. Further, the left edge and the right edge of the back cover 1810 may be in contact with a rear surface of a plurality of insulating layers disposed between the substrate 121 and the pixel unit 123 of the display panel 120, for example, a rear surface of at least one of various insulating layers, such as the buffer layer 122, a gate insulating layer, an interlayer insulating layer, a planarization layer, and a passivation layer.

Further, as shown in FIG. 19, the left edge and the right edge of the back cover 1910 may be bent to be in contact with the respective sides of the display panel 120. That is, as illustrated in FIG. 19, the left edge and the right edge of the back cover 1910 may be in contact with the respective sides of the substrate 121 and the buffer layer 122. However, embodiments are not limited thereto, and the left edge and the right edge of the back cover 1910 may be bent to be in contact, for example, with respective sides of any one of the substrate 121 and the buffer layer 122. Further, the left edge and the right edge of the back cover 1910 may be in contact with sides of at least one of the plurality of insulating layers disposed between the substrate 121 and the pixel unit 123 and the substrate 121.

Further, as shown in FIG. 20, the left edge and the right edge of the back cover 2010 may be bent to be in contact with the front surface of the display panel 120. That is, the left edge and the right edge of the back cover 2010 may be in contact with the front surface of the substrate 121. However, embodiments are not limited thereto, and if a polarizer or a protective film is disposed on the front surface of the substrate 121 of the display panel 120, the left edge and the right edge of the back cover 2010 may be bent to be in contact with any of the components disposed on the front surface of the substrate 121 of the display panel 120.

As illustrated in FIGS. 18 to 20, a third adhesive layer AD3 may be disposed in a space between the left edge and the right edge of the back covers 1810, 1910, and 2010 and the display panel 120. The third adhesive layer AD3 may fill at least a portion of a space between the back covers 1810, 1910, and 2010 and the side of the display panel 120. Specifically, the third adhesive layer AD3 may fill at least a portion of a space between one surface of the back covers 1810, 1910, and 2010 adjacent to the left edge and the right edge and the respective side of the display panel 120. For example, as shown in FIG. 18, the third adhesive layer AD3 may fill a space formed by the back cover 1810, the first adhesive layer AD1, the encapsulation substrate 125, the second adhesive layer AD2, and the buffer layer 122. Further, as shown in FIG. 19, the third adhesive layer AD3 may fill a space formed by the back cover 1910, the first adhesive layer AD1, the encapsulation substrate 125, the second adhesive layer AD2, the buffer layer 122, and the side of the substrate 121. Further, as shown in FIG. 20, the third adhesive layer AD3 may fill a space formed by the back cover 2010, the first adhesive layer AD1, the encapsulation substrate 125, the second adhesive layer AD2, the buffer layer 122, and the respective side and the respective front surface of the substrate 121.

The third adhesive layer AD3 may fix the back covers 1810, 1910, and 2010 and the display panel 120 to each other so that the left edge and the right edge of the back covers 1810, 1910, and 2010 maintain a contact state with the display panel 120. The third adhesive layer AD3 may be, for example, an epoxy non-conductive adhesive, but is not limited thereto.

Further, the third adhesive layer AD3 may be a material having a soft property. Therefore, even though an external impact is applied to the third adhesive layer AD3 having a soft property, the third adhesive layer AD3 may absorb or cushion the impact and protect the display panel 120 and the back covers 1810, 1910, and 2010. The third adhesive layer AD3 may be a material having a low modulus and, for example, may be a material having a modulus of 0.05 MPa to 5 MPa, but is not limited thereto.

In addition, the third adhesive layer AD3 may minimize moisture and oxygen permeating into the side of the display panel 120. As the third adhesive layer AD3 fills spaces to enclose the sides of the display panel 120, permeation paths of the moisture and oxygen at the side of the display panel 120 may increase. Accordingly, the third adhesive layer AD3 may be disposed to protect the display panel 120 from the moisture and oxygen to improve the reliability of the display panel 120.

Further, the third adhesive layer AD3 may include an absorbent. The absorbent included in the third adhesive layer AD3 may be particles having hygroscopicity. The absorbent may minimize the permeation of external moisture and oxygen into the display panel 120.

In the display device according to various exemplary embodiments of the present disclosure, the left edge and the right edge of the back covers 1810, 1910, and 2010 may be bent to prevent or mitigate sharp edges. Specifically, the left edge and the right edge of the back covers 1810, 1910, and 2010 may otherwise be very thin and sharp to be dangerous, and be vulnerable to external impacts to be easily deformed. The left edge and the right edge of the back covers 1810, 1910, and 2010 may be bent to be in contact with the display panel 120 so that the leftmost portion EL and the rightmost portion ER of the back covers 1810, 1910, and 2010 may have a round shape. For example, as shown in FIG. 18, the left edge and the right edge of the back cover 1810 may be bent to be in contact with the rear surface of the display panel 120. As shown in FIG. 19, the left edge and the right edge of the back cover 1910 may be bent to be in contact with the respective side of the display panel 120. As shown in FIG. 20, the left edge and the right edge of the back cover 2010 may be bent to be in contact with the front surface of the substrate 121 of the display panel 120. The left edge and the right edge of the back covers 1810, 1910, and 2010 of FIGS. 18 to 20 may be bent to be in contact with the display panel 120 so that the leftmost portion EL and the rightmost portion ER of the back covers 1810, 1910, and 2010 may have a round shape. Therefore, in the display device according to various exemplary embodiments of the present disclosure, the left edge and the right edge of the back covers 1810, 1910, and 2010 may be bent to allow the leftmost portion and the rightmost portion of the back covers 1810, 1910, and 2010 to have a round shape. Therefore, sharp edges may be prevented, and a potential injury of the user caused by a sharp edge may be prevented or minimized.

Further, in the display device according to various exemplary embodiments of the present disclosure, the third adhesive layer AD3 may fill the space between the back covers 1810, 1910, and 2010 and the respective sides of the display panel 120 to enhance a side rigidity of the display units DPc, DPd, and DPe. Specifically, the third adhesive layer AD3 may be formed of a material having a soft property having a low modulus to absorb and cushion impacts. The third adhesive layer AD3 may fill the space between the back covers 1810, 1910, and 2010 and the respective sides of the display panel 120 to absorb and cushion the impacts at the side of the display units DPc, DPd, and DPe. For example, as shown in FIG. 18, the left edge and the right edge of the back cover 1810 may be bent to be in contact with the rear surface of the display panel 120, and the third adhesive layer AD3 may fill the space between the back cover 1810 and the rear surface of the display panel 120. As shown in FIG. 19, the left edge and the right edge of the back cover 1910 may be bent to be in contact with the respective sides of the display panel 120, and the third adhesive layer AD3 may fill the space between the back cover 1910 and the rear surface and the respective sides of the display panel 120. Finally, as shown in FIG. 20, the left edge and the right edge of the back cover 2010 may be bent to be in contact with the front surface of the display panel 120, and the third adhesive layer AD3 may fill the space between the back cover 2010, and the rear surface, the respective sides, and the front surface of the display panel 120. Therefore, in the display device according to various exemplary embodiments of the present disclosure, the third adhesive layer AD3 having a soft property may fill the space between the back covers 1810, 1910, and 2010 and the display panel 120. Therefore, the third adhesive layer AD3 may cushion the external impacts applied to the back covers 1810, 1910, and 2010 of the display units DPc, DPd, and DPe and the display panel 120 and minimize a potential damage to the display units DPc, DPd, and DPe.

Moreover, in the display device according to various exemplary embodiments of the present disclosure, the third adhesive layer AD3 filling the space between the back covers 1810, 1910, and 2010 and the display panel 120 may minimize the permeation of the moisture and oxygen into the side of the display panel 120 to improve the reliability of the display device. Specifically, the left edge and the right edge of the back covers 1810, 1901, and 2010 may be bent to be in contact with the display panel 120, and the third adhesive layer AD3 may fill the space between the back covers 1810, 1910, and 2010 and the display panel 120. Further, the third adhesive layer AD3 may fill the space so as to enclose the side of the display panel 120 and increase the number of permeation paths of the moisture and oxygen into the sides of the display panel 120, thereby preventing or minimizing the permeation of moisture and oxygen into the sides of the display panel 120. For example, as shown in FIGS. 18 to 20, the left edge and the right edge of the back covers 1810, 1910, and 2010 may be bent to be in contact with the rear surface, the side, or the front surface of the display panel 120, and the back covers 1810, 1910, and 2010 may be disposed to enclose the respective sides of the pixel unit 123 of the display panel 120. Further, the third adhesive layer AD3 may fill the space between the respective side of the pixel unit 123 of the display panel 120 and the back covers 1810, 1910, and 2010 so that the permeation of the moisture and oxygen into the side of the pixel unit 123 may be minimized. Further, the third adhesive layer AD3 may further include an absorbent having hygroscopicity so that the moisture and oxygen permeation suppression effect may be improved by the absorbent. Therefore, in the display device according to various exemplary embodiments of the present disclosure, the left edge and the right edge of the back covers 1810, 1910, and 2010 may be bent to fill the space between the back covers 1810, 1910, and 2010 and the respective side of the display panel 120 with the third adhesive layer AD3. Therefore, the permeation of moisture and oxygen into the side of the display panel 120 may be minimized.

<Enhancement of Suppression of Permeation Using Auxiliary Encapsulation Layer>

Figure 21:
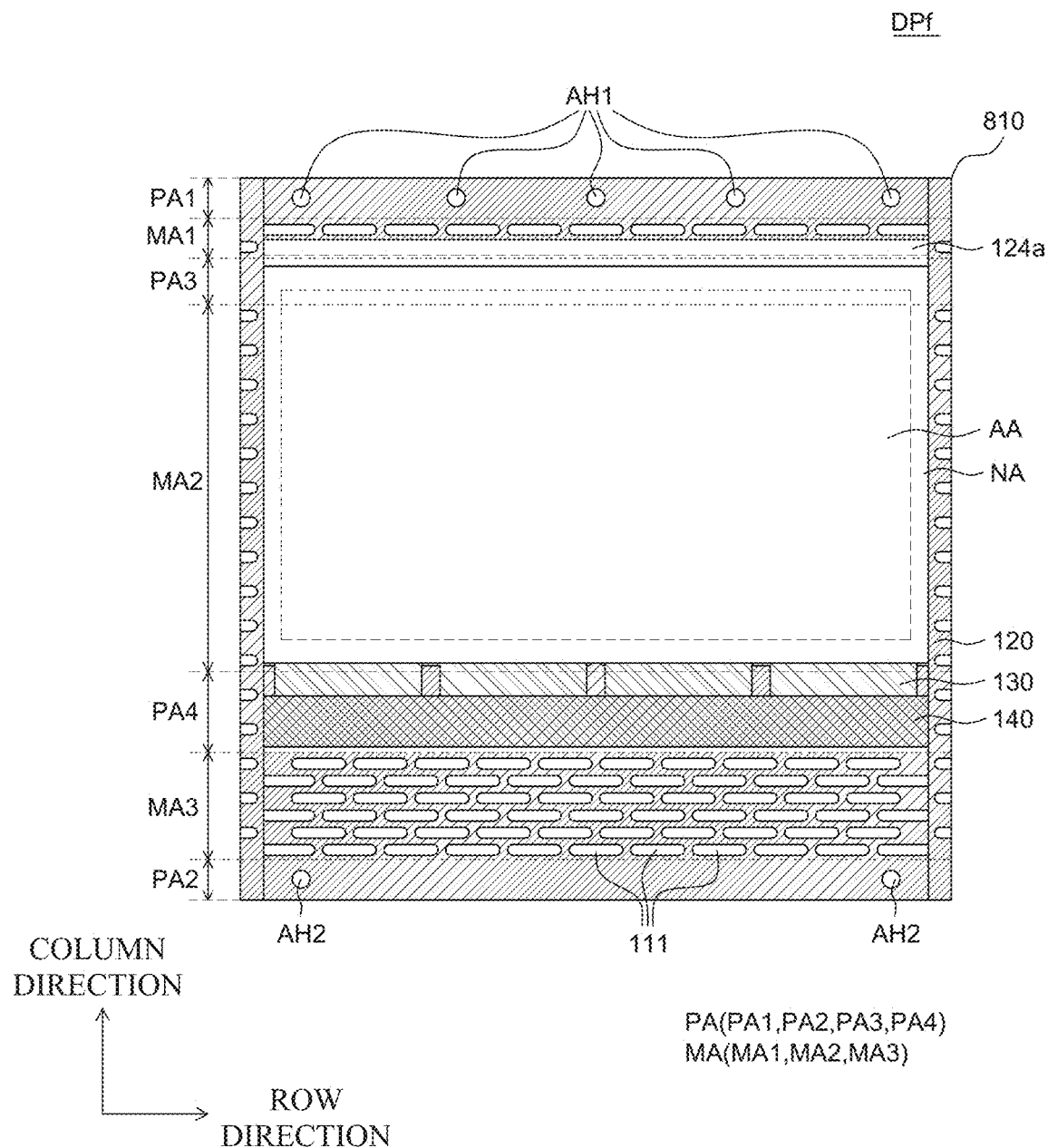
FIG. 21 is a plan view of a display unit of a display device according to still another exemplary embodiment of the present disclosure.

FIG. 21 is a plan view of a display unit of a display device according to still another exemplary embodiment of the present disclosure. With the exception of an auxiliary encapsulation layer 124*a* being added, other configurations of the example display unit DPf of FIG. 21 may be substantially the same as those of the example display unit DPd of FIG. 19. Thus, a redundant description will be omitted.

As illustrated in FIG. 21, the auxiliary encapsulation layer 124*a* may be disposed on the back cover 810 to cover an upper edge of the display panel 120. Specifically, the auxiliary encapsulation layer 124*a* may cover a part of a front surface of the back cover 810 adjacent to an upper edge of the display panel 120 and a part of a front surface of the display panel 120 adjacent to the upper edge of the display panel 120 so as to cover the upper edge of the display panel 120.

The auxiliary encapsulation layer 124*a* may be an epoxy or acrylic non-conductive material, but is not limited thereto. Further, the auxiliary encapsulation layer 124*a* may further include an absorbent. The absorbent included in the auxiliary encapsulation layer 124*a* may be particles having hygroscopicity. The absorbent may minimize the permeation of external moisture and oxygen into the display panel 120.

In the display device according to still another exemplary embodiment of the present disclosure, the auxiliary encapsulation layer 124*a* may further be provided to cover the upper edge of the display panel 120 disposed on the back cover 810 to protect the display panel 120 from the external moisture and oxygen. The left edge and the right edge of the display panel 120 disposed on the back cover 810 may be protected by the third adhesive layer AD3 but, without the auxiliary encapsulation layer 124*a*, the upper edge of the display panel 120 may be directly exposed to the outside so that oxygen and moisture may permeate thereinto. In this case, the auxiliary encapsulation layer 124*a* may be disposed to cover the upper edge of the display panel 120 to seal the upper side of the display panel 120. That is, the auxiliary encapsulation layer 124*a* may be disposed so as to enclose the upper side of the display panel 120 to block a path or to increase a number of paths through which moisture and oxygen permeate into the upper side of the display panel 120, thereby minimizing the permeation of the moisture and oxygen into the display panel 120. Further, the auxiliary encapsulation layer 124*a* may further include an absorbent which may absorb the moisture and oxygen. Therefore, in the display device according to still another exemplary embodiment of the present disclosure, the auxiliary encapsulation layer 124*a* may further be provided to cover an upper edge among edges of the display panel 120 to minimize the permeation of the moisture and oxygen into the display panel 120, thereby improving the reliability of the display panel 120.

Even though, in FIG. 21, the auxiliary encapsulation layer 124*a* is illustrated as being disposed to cover the upper edge of the display panel 120, it is not limited thereto. For example, the auxiliary encapsulation layer 124*a* may be disposed, additionally or alternatively, to cover a lower edge of the display panel 120.

<Guide of Winding and Unwinding of Display Device>

Figure 22:
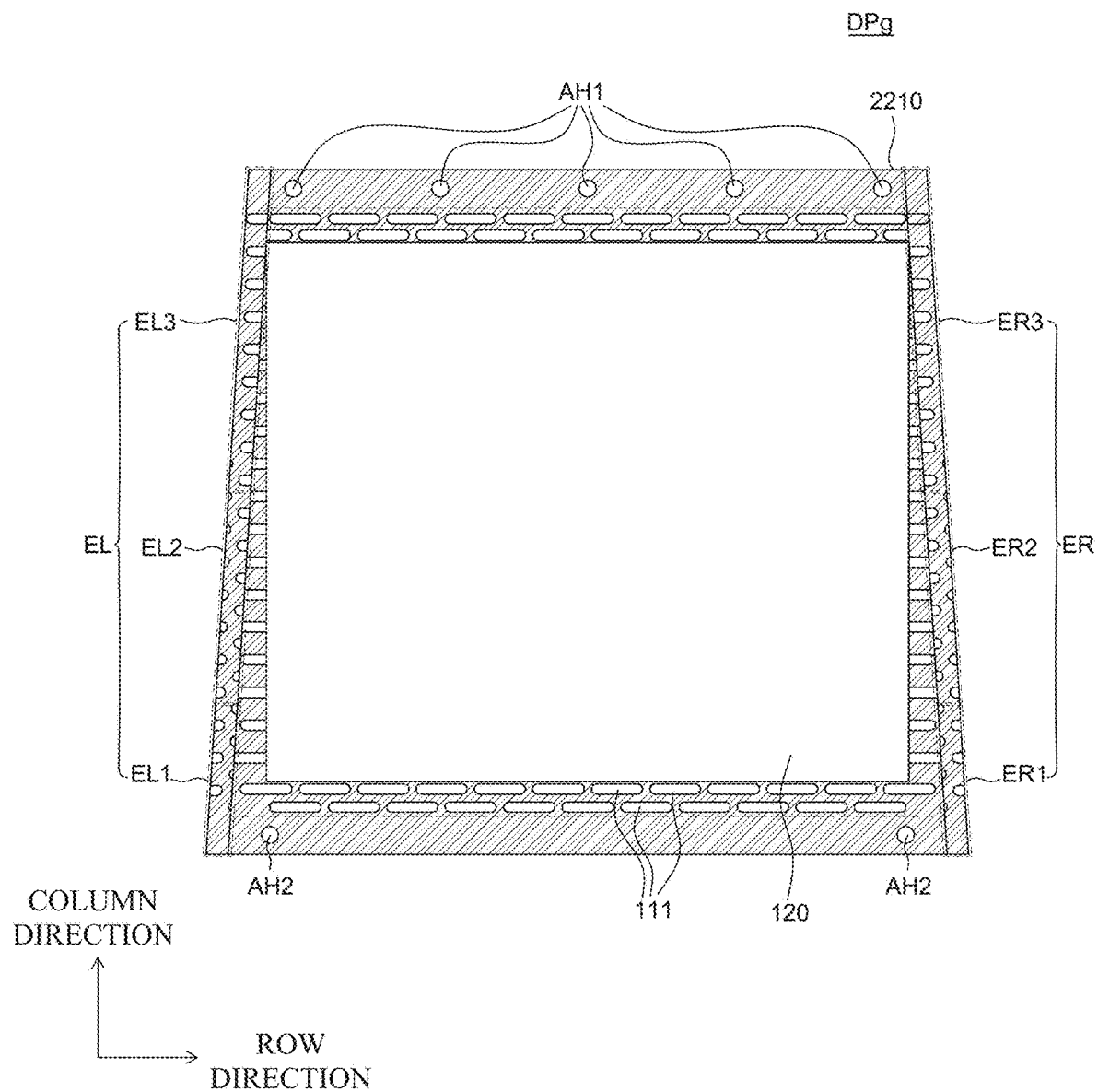
FIG. 22 is a plan view of a display unit of a display device according to still another exemplary embodiment of the present disclosure.
Figure 23:
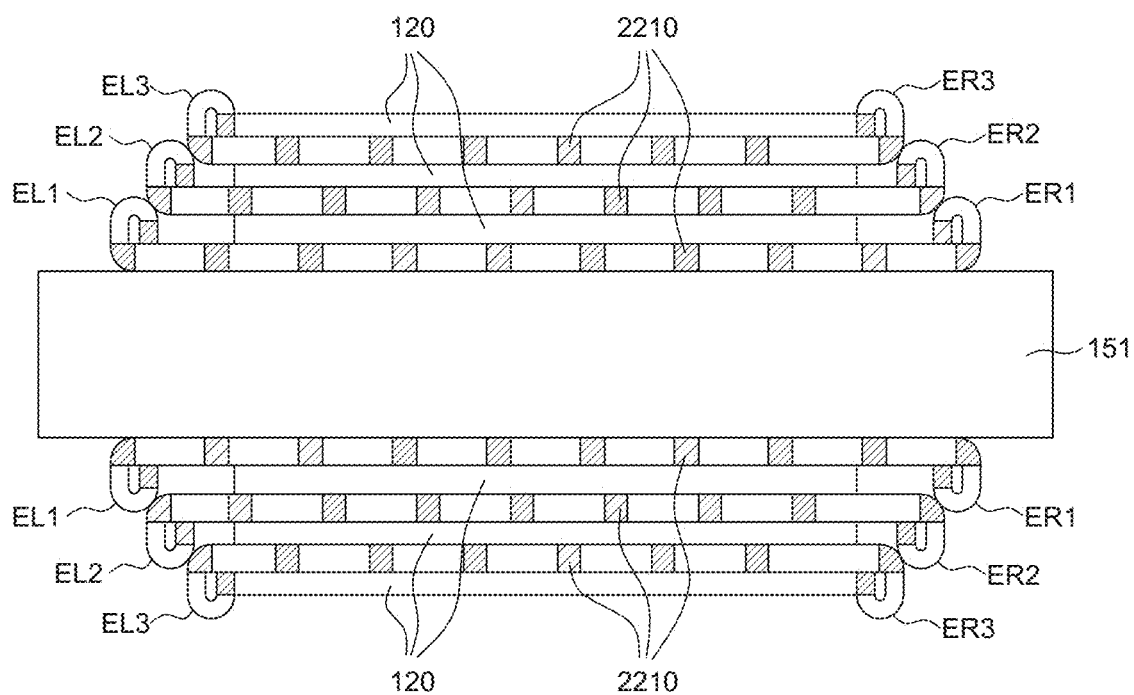
FIG. 23 is a cross-sectional view of a display unit of FIG. 22 which is wound around a roller.

FIG. 22 is a plan view of a display unit of a display device according to still another exemplary embodiment of the present disclosure. FIG. 23 is a cross-sectional view of a display unit of FIG. 22 in a state of being wound around a roller. Specifically, FIG. 23 is a front cross-sectional view of a back cover 2210, a display panel 120, and a roller 151 in a state in which the back cover 2210 and the display panel 120 are wound around the roller 151. With the exception of the back cover 2210 being different, other configurations of the example display unit DPg of FIGS. 22 and 23 may be substantially the same as the example display unit DPb of FIG. 17. Thus, a redundant description will be omitted. For the convenience of description, in FIG. 22, only the back cover 2210 and the display panel 120 among the components of the display unit DPg are schematically illustrated.

As shown in FIG. 22, the back cover 2210 may have a trapezoidal shape. A length of a lower edge of the back cover 2210 is longer than a length of an upper edge of the back cover 2210. That is, a left edge and a right edge of the back cover 2210 may be inclined with respect to the lower edge of the back cover 2210. In other words, the left edge and the right edge of the back cover 2210 may be inclined with respect to the upper edge of the back cover 2210. Therefore, a width between the left edge and the right edge of the back cover 2210 in a row direction in one part of the back cover 2210 may be different from a width between the left edge and the right edge of the back cover 2210 in another part of the back cover 2210. For example, a width between the left edge and the right edge of the back cover 2210 in an upper end of the back cover 2210 may be smaller than a width between the left edge and the right edge of the back cover 2210 in the row direction in a lower end of the back cover 2210. As described above, the back cover 2210 may have a trapezoidal shape which becomes narrower toward the upper end. However, the back cover 2210 is not limited thereto, and various shapes in which the width is increased from the lower end to the upper end may be applied to the back cover 2210.

As shown in FIG. 23, the left edge and the right edge of the back cover 2210 may be bent to be in contact with the front surface of the back cover 2210. Specifically, the left edge and the right edge of the back cover 2210 may be bent to be in contact with the front surface of the back cover 2210 to which the display panel 120 is attached. Therefore, an overall thickness of the leftmost portion EL and the rightmost portion ER of the bent back cover 2210, respectively, may be larger than a base thickness of the back cover 2210 in the remaining portions. The overall respective thickness of the leftmost portion EL and the rightmost portion ER of the bent back cover 2210 may be larger than a sum of a base thickness of the back cover 2210 and a thickness of the display panel 120. Further, the left edge and the right edge of the back cover 2210 may be bent to prevent or mitigate thin and sharp left and right edges of the back cover 2210.

With the back cover 2210 formed to have a trapezoidal shape, when the back cover 2210 is wound, the leftmost portion EL and the rightmost portion ER of the bent back cover 2210 may not interfere with other parts of the back cover 2210 being wound. Further, the leftmost portion EL and the rightmost portion ER of the bent back cover 2210 may guide the winding of the back cover 2210.

For the purpose of detailed description, it is assumed that the roller 151 makes three rotations to completely wind the back cover 2210 around the roller 151 although embodiments are not limited to this number of rotations. Under this assumption, when the roller 151 makes a first rotation, a lower end area of the back cover 2210 may be wound around the roller 151. When the roller 151 makes a second rotation, a center area of the back cover 2210 may be wound around the roller 151. When the roller 151 makes a third rotation, an upper end area of the back cover 2210 may be wound around the roller 151. The number of rotations of the roller 151 required to wind the back cover 2210 completely around the roller 151 may vary depending on the design, and the lengths of the lower edge and the upper edge of the back cover 2210 may also vary depending on the number of rotations of the roller 151, but is not limited thereto.

First, the leftmost portion EL of the bent back cover 2210 may include a first left portion EL1, a second left portion EL2, and a third left portion EL3. The rightmost portion ER of the bent back cover 2210 may include a first right portion ER1, a second right portion ER2, and a third right portion ER3.

The first left portion EL1 and the first right portion ER1 may respectively be a leftmost portion and a rightmost portion in a lower end of the back cover 2210 and, as illustrated in FIG. 23, may form a layer disposed closest to the roller 151 when the back cover 2210 is wound around the roller 151. The second left portion EL2 and the second right portion ER2 may respectively be a leftmost portion and a rightmost portion in the center portion of the back cover 2210 and, as illustrated in FIG. 23, may form a layer second closest to the roller 151 when the back cover 2210 is wound around the roller 151. The third left portion EL3 and the third right portion ER3 may respectively be a leftmost portion and a rightmost portion in an upper end of the back cover 2210 and, as illustrated in FIG. 23, may form a layer farthest away from the roller 151 when the back cover 2210 is wound around the roller 151.

As illustrated together in FIG. 23, the first left portion EL1 and the first right portion ER1 may be first wound around the roller 151. Therefore, the first left portion EL1 and the first right portion ER1 may be in direct contact with an outer circumferential surface of the roller 151.

In a state in which the first left portion EL1 and the first right portion ER1 have been wound around the roller 151, the second left portion EL2 and the second right portion ER2 may be wound around the roller 151 with the first left portion EL1 and the first right portion ER1 wound thereon. However, the second left portion EL2 and the second right portion ER2 may be disposed so as not to overlap the first left portion EL1 and the first right portion ER1, but to overlap a middle area of the back cover 2210 between the first left portion EL1 and the first right portion ER1.

The second left portion EL2 and the second right portion ER2 may be disposed closer to the lateral center of the roller 151 than the first left portion EL1 and the first right portion ER1. Specifically, as shown in FIG. 22, the width between the left edge and the right edge of the back cover 2210 in the row direction becomes smaller from the lower end to the upper end. Therefore, a width of a center portion of the back cover 2210 in which the second left portion EL2 and the second right portion ER2 are disposed may be smaller than a width of the lower end portion of the back cover 2210 in which the first left portion EL1 and the first right portion ER1 are disposed. Therefore, the width between the second left portion EL2 and the second right portion ER2 in the row direction may be smaller than a width between the first left portion EL1 and the first right portion ER1. Accordingly, the second left portion EL2 and the second right portion ER2 may be disposed within a lateral space between the first left portion EL1 and the first right portion ER1.

In a state in which the first left portion EL1, the first right portion ER1, the second left portion EL2, and the second right portion ER2 have been wound around the roller 151, the third left portion EL3 and the third right portion ER3 may be wound around the roller 151 with the first left portion EL1, the first right portion ER1, the second left portion EL2, and the second right portion ER2 wound thereon. The third left portion EL3 and the third right portion ER3 may be disposed so as not to overlap the second left portion EL2 and the second right portion ER2, but may be disposed to overlap a middle area of the back cover 2210 between the second left portion EL2 and the second right portion ER2.

The third left portion EL3 and the third right portion ER3 may be disposed to be closer to the lateral center of the roller 151 than the second left portion EL2 and the second right portion ER2. Specifically, as shown in FIG. 22, a width in the row direction of the upper end portion of the back cover 2210 in which the third left portion EL3 and the third right portion ER3 are disposed may be smaller than a width of the center portion of the back cover 2210 in which the second left portion EL2 and the second right portion ER2 are disposed. Therefore, the width between third left portion EL3 and the third right portion ER3 in the row direction may be smaller than a width between the second left portion EL2 and the second right portion ER2. Therefore, the third left portion EL3 and the third right portion ER3 may be disposed within a lateral space betwen the second left portion EL2 and the second right portion ER2.

In a state in which the back cover 2210 is wound around the roller 151, the uppermost portions of the first left portion EL1 and the first right portion ER1 are disposed to protrude beyond the display panel 120. In a state in which the back cover 2210 is wound around the roller 151, the uppermost portions of the first left portion EL1 and the first right portion ER1 may be disposed to protrude beyond the the lower surfaces of the second left portion EL2 and the second right portion ER2, respectively. Therefore, when the back cover 2210 is wound, the second left portion EL2 and the second right portion ER2 do not move outside of the first left portion EL1 and the first right portion ER1.

Further, the protruding sides of the first left portion EL1 and the first right portion ER1 may be in contact with sides of the second left portion EL2 and the second right portion ER2, respectively. Therefore, when the back cover 2210 is wound around the roller 151, the second left portion EL2 and the second right portion ER2 may be guided to be positioned between the first left portion EL1 and the first right portion ER1 while being in contact with the sides of the first left portion EL1 and the first right portion ER1. Therefore, when the back cover 2210 is wound, the first left portion EL1 and the first right portion ER1 which protrude toward the front surface of the back cover 2210 may guide the center portion of the back cover 2210 in which the second left portion EL2 and the second right portion ER2 are disposed to be stably wound around the roller 151.

Similarly, in a state in which the back cover 2210 is wound around the roller 151, the uppermost portions of the second left portion EL2 and the second right portion ER2 may be disposed to protrude beyond the lower surfaces of the third left portion EL3 and the third right portion ER3, respectively. Therefore, when the back cover 2210 is wound, the third left portion EL3 and the third right portion ER3 may be disposed only between the second left portion EL2 and the second right portion ER2, and do not move outside of the second left portion EL2 and the second right portion ER2.

Further, the protruding sides of the second left portion EL2 and the second right portion ER2 may be in contact with sides of the third left portion EL3 and the third right portion ER3, respectively. Therefore, when the back cover 2210 is wound around the roller 151, the third left portion EL3 and the third right portion ER3 may be guided to be positioned between the second left portion EL2 and the second right portion ER2 while being in contact with the sides of the second left portion EL2 and the second right portion ER2. Therefore, when the back cover 2210 is wound, the second left portion EL2 and the second right portion ER2 which protrude toward the front surface of the back cover 2210 may guide the upper end portion of the back cover 2210 in which the third left portion EL3 and the third right portion ER3 are disposed to be stably wound around the roller 151.

If the winding of the back cover 2210 is guided, the sides of the first left portion EL1 and the first right portion ER1 and the sides of the second left portion EL2 and the second right portion ER2 may be spaced apart from each other without being in contact with each other. Further, the sides of the second left portion EL2 and the second right portion ER2 and the sides of the third left portion EL3 and the third right portion ER3 may be spaced apart from each other without being in contact with each other. However, embodiments are not limited to the above specific examples.

In FIGS. 22 and 23, an entire planar shape of the back cover 2210 is illustrated to have a trapezoidal shape as an example. However, only a partial area of the back cover 2210 which is wound around or unwound from the roller 151 may be formed to have a trapezoidal shape, and embodiments are not limited thereto. For example, if only the second support area PA2, the third malleable area MA3, the fourth support area PA4, and the second malleable area MA2 of the back cover 2210 are to be wound around or unwound from the roller 151, and the first support area PA1, the first malleable area MA1, and the third support area PA3 of the back cover 2210 are to maintain a flat state, the second support area PA2, the third malleable area MA3, the fourth support area PA4, and the second malleable area MA2 of the back cover 2210 may be formed to have a trapezoidal shape. Further, the first support area PA1, the first malleable area MA1, and the third support area PA3 may be formed to have a rectangular shape in which the width between the left edge and the right edge in the row direction is constant.

In the display device according to still another exemplary embodiment of the present disclosure, the back cover 2210 may be formed to have a trapezoidal shape in which the width in the row direction becomes narrower from the lower end to the upper end. This may minimize interference between the rear surface of the back cover 2210, and the leftmost portion EL and the rightmost portion ER protruding toward the front surface of the back cover as the left edge and the right edge are bent toward the front surface of the back cover 2210, when the back cover 2210 is wound. Specifically, the left edge and the right edge of the back cover 2210 may be bent toward a surface of the back cover 2210 to which the display panel 120 is attached, and may protrude from that surface. Further, the back cover 2210 may be formed to have a trapezoidal shape in which a length of the lower edge in the row direction is longer than a length of the upper edge. Therefore, at the time of winding, the larger the number of rotations of the roller 151, the smaller the width between the left edge and the right edge of the back cover 2210 being wound around the roller 151. Therefore, even though another part of the back cover 2210 is further wound on a portion of the back cover 2210 having the leftmost portion EL and the rightmost portion ER bent toward the front surface of the back cover 2210 to protrude, the width of the back cover 2210 may be gradually narrowed to accommodate another part of the back cover 2210 being wound to be positioned between the protruding leftmost portion EL and rightmost portion ER. Therefore, in the display device according to still another exemplary embodiment of the present disclosure, the back cover 2210 may be formed to have a trapezoidal shape so that the rear surface of the back cover 2210, and the leftmost portion EL and the rightmost portion ER protruding toward the front surface of the back cover 2210 do not interfere with each other.

Further, in the display device according to another exemplary embodiment of the present disclosure, the protruding leftmost portion EL and rightmost portion ER of the back cover 2210 may guide the winding and unwinding of the back cover 2210. For example, when the roller 151 makes a first rotation, the first left portion EL1 and the first right portion ER1 of the back cover 2210 wound around the roller 151 may be disposed farthest away from the lateral center of the roller 151. Next, when the roller 151 makes a second rotation, the second left portion EL2 and the second right portion ER2 of the back cover 2210 wound around the roller 151 may be disposed between the first left portion EL1 and the first right portion ER1, without moving laterally outside the first left portion EL1 or the first right portion ER1. When the roller 151 makes a third rotation, the third left portion EL3 and the third right portion ER3 of the back cover 2210 wound around the roller 151 may be disposed between the second left portion EL2 and the second right portion ER2, without moving laterally outside the second left portion EL2 or the second right portion ER2. As described above, the left edge and the right edge of the back cover 2210 wound around the roller 151 may each be wound so as not to overlap itself. In this case, the first left portion EL1 and the first right portion ER1 protrude beyond the lower surfaces of the second left portion EL2 and the second right portion ER2 to guide the second left portion EL2 and the second right portion ER2 to be positioned between the first left portion EL1 and the first right portion ER1 without laterally moving outside the space between the first left portion EL1 and the first right portion ER1. Similarly, the second left portion EL2 and the second right portion ER2 protrude beyond the lower surfaces of the third left portion EL3 and the third right portion ER3 to guide the third left portion EL3 and the third right portion ER3 to positioned between the second left portion EL2 and the second right portion ER2. Therefore, in the display device according to still another exemplary embodiment of the present disclosure, the leftmost portion EL and the rightmost portion ER protruding toward the front surface of the back cover 2210 may guide the back cover 2210 to be wound around and unwound from the roller 151, and prevent or suppress the back cover 2210 from deviating from the designed position.

Moreover, in a display device according to still another exemplary embodiment of the present disclosure, the left edge and the right edge of the back cover 2210 may be bent to prevent or minimize sharp edges. Specifically, the back cover 2210 may be formed of a material which is very thin and has a high rigidity, and the left edge and the right edge of the back cover 2210 may otherwise become very sharp. Therefore, the left edge and the right edge of the back cover 2210 may be bent toward the front surface of the back cover 2210, that is, a surface of the back cover 2210 to which the display panel 120 is attached. Since the leftmost portion EL and the rightmost portion ER of the back cover 2210 in which the left edge and the right edge are bent may have a round shape to prevent or minimize sharp edges of the back cover 2210 to prevent or minimize the risk of injury to the user.

Figure 24:
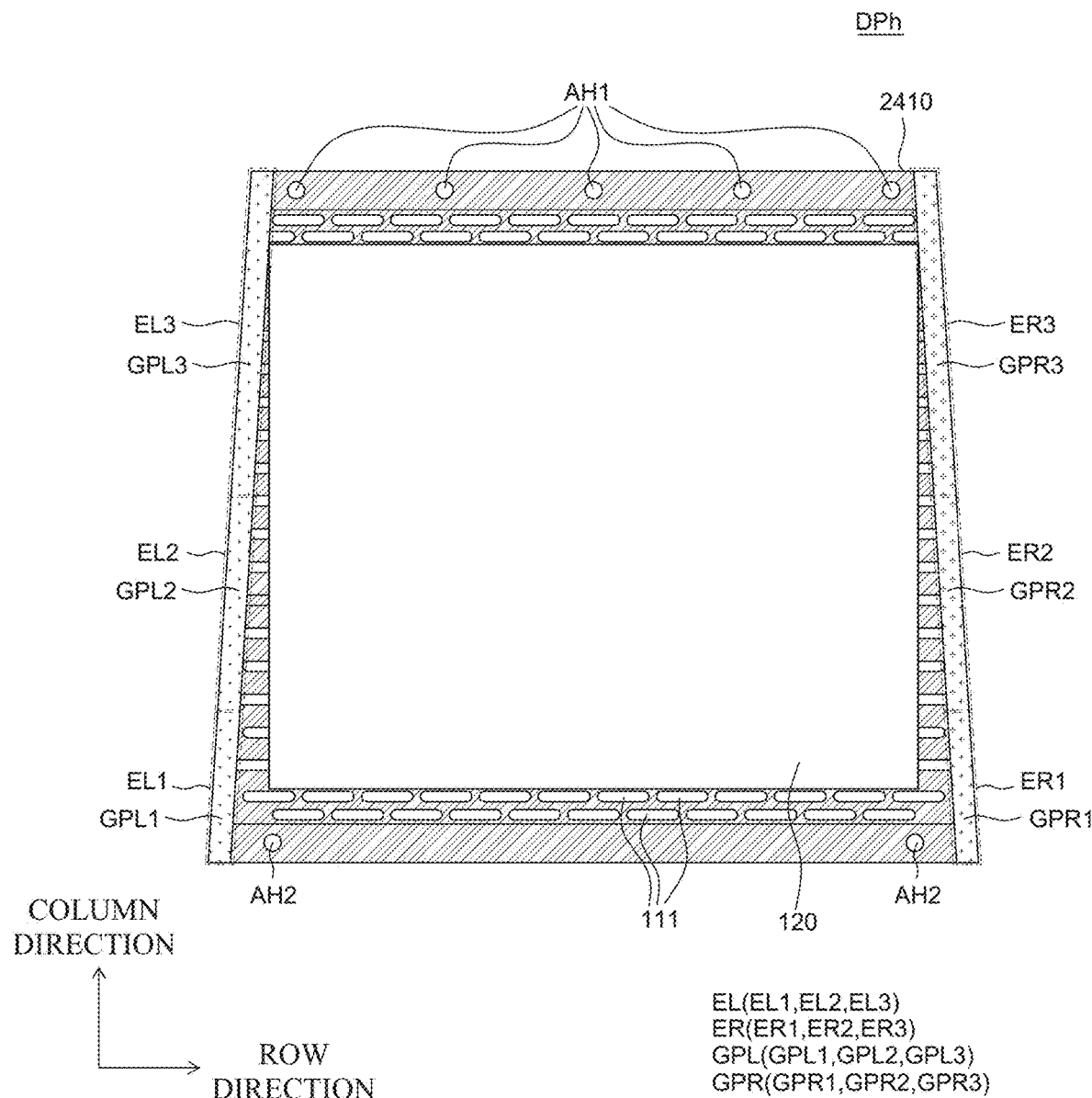
FIG. 24 is a plan view of a display unit of a display device according to still another exemplary embodiment of the present disclosure.
Figure 25:
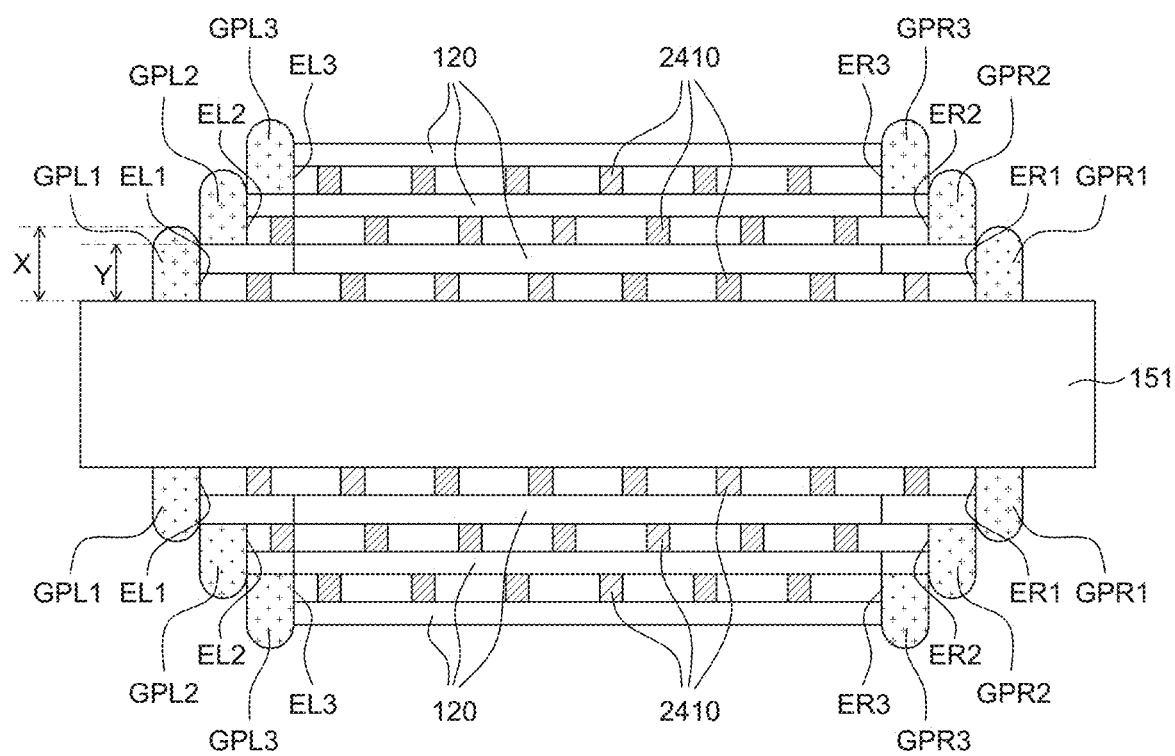
FIG. 25 is a cross-sectional view of a display unit of FIG. 24 which is wound around a roller.

FIG. 24 is a plan view of a display unit of a display device according to still another exemplary embodiment of the present disclosure. FIG. 25 is a cross-sectional view of a display unit of FIG. 24 which is wound around a roller. With the exception of a back cover 2410 being different and guide units GPL and GPR being added, other configurations of an example display unit DPh of FIGS. 24 and 25 may be substantially the same as the example display unit DPg of FIGS. 22 and 23. Thus, a redundant description will be omitted.

As illustrated in FIG. 24, a left guide unit GPL may be disposed at a left edge of the back cover 2410, and a right guide unit GPR may be disposed at a right edge of the back cover 2410. The left guide unit GPL may be disposed to enclose the left edge of the back cover 2410. The right guide unit GPR may be disposed to enclose the right edge of the back cover 2410. The left guide unit GPL and the right guide unit GPR may be disposed to be in contact with the left edge and the right edge of the back cover 2410, but are not limited to this example configuration.

The left guide unit GPL may include a first left guide unit GPL1, a second left guide unit GPL2, and a third left guide unit GPL3. The first to the third left guide units GPL1, GPL2, GPL3 may be three portions of a single contiguous left guide unit GPL, but are not limited thereo. The right guide unit GPR may include a first right guide unit GPR1, a second right guide unit GPR2, and a third right guide unit GPR3. The first to the third right guide units GPR1, GPR2, GPR3 may be three portions of a single contiguous right guide unit GPR, but are not limited thereto.

The first left guide unit GPL1 and the first right guide unit GPR1 may be disposed to enclose a first left portion EL1 and a first right portion ER1, respectively, at a lower end portion of the back cover 2410. The second left guide unit GPL2 and the second right guide unit GPR2 may be disposed to enclose a second left portion EL2 and a second right portion ER2, respectively, in a center portion of the back cover 2410. The third left guide unit GPL3 and the third right guide unit GPR3 may be disposed to enclose a third left portion EL3 and a third right portion ER3, respectively, at an upper end portion of the back cover 2410.

In addition, the left guide unit GPL and the right guide unit GPR may be formed of a material having a flexibility to be wound around the roller 151 together with the back cover 2410. For example, the left guide unit GPL and the right guide unit GPR may be formed of polymer or rubber, but are not limited thereto.

Further, the left guide unit GPL and the right guide unit GPR may enclose the thin and possibly sharp left edge and right edge of the back cover 2410. At least a part of outer surfaces of the left guide unit GPL and the right guide unit GPR may be formed in a shape of a gentle curve. Therefore, sharp edges may be prevented or minimized in the back cover 2410.

As illustrated in FIG. 25, lower surfaces of the left guide unit GPL and the right guide unit GPR may be disposed on the same plane as the rear surface of the back cover 2410. That is, the lower surfaces of the left guide unit GPL and the right guide unit GPR may be wound while being in close contact with the surface of the roller 151 without forming a step with the rear surface of the back cover 2410.

The thickness of the left guide unit GPL and the right guide unit GPR may be larger than a sum of the thicknesses of the back cover 2410 and the display panel 120. For example, a first height X from the rear surface of the back cover 2410, which also serves as the lower surface of the left guide unit GPL, to an upper end of the left guide unit GPL is larger than a second height Y from the rear surface of the back cover 2410 to the front surface of the display panel 120. Further, a first height X from the rear surface of the back cover 2410, which also serves as the lower surface of the right guide unit GPR, to an upper end of the right guide unit GPR is larger than a second height Y from the rear surface of the back cover 2410 to the front surface of the display panel 120.

The first height X, which is the thickness of the left guide unit GPL or the right guide unit GPR, may be equal to or smaller than twice the second height Y, which is the combined thicknesses of the back cover 2410 and the display panel 120. For example, the second height Y, which is the combined thicknesses of the back cover 2410 and the display panel 120, and the first height X which is the thickness of the left guide unit GPL or the right guide unit GPR may satisfy the following Equation 2:

$$Y < X \leq Y \times 2 \qquad \text{[Equation 2]}$$

Therefore, the thickness of each of the left guide unit GPL and the right guide unit GPR may be larger than the combined thicknesses of the back cover 2410 and the display panel 120, but may be equal to or smaller than twice the combined thicknesses of the back cover 2410 and the display panel 120.

The first left guide unit GPL1 and the first right guide unit GPR1 may be first wound around the roller 151. Specifically, a lower edge of the back cover 2410 may be fastened with the roller 151, and the left edge and the right edge of the lower end portion of the back cover 2410 may be first wound around the roller 151. Therefore, the first left guide unit GPL1 and the first right guide unit GPR1 which enclose the left edge and the right edge of the lower end portion of the back cover 2410 may also first wound around the roller 151 to be in contact with the outer circumferential surface of the roller 151.

With the first left guide unit GPL1 and the first right guide unit GPR1 in a state of being wound around the roller 151, the second left guide unit GPL2 and the second right guide unit GPR2 may be wound on a lower end portion of the back cover 2410 between the first left guide unit GPL1 and the first right guide unit GPR1. In this case, the second left guide unit GPL2 and the second right guide unit GPR2 may be disposed not to overlap the first left guide unit GPL1 and the first right guide unit GPR1, but to overlap a lower end portion of the back cover 2410 between the first left guide unit GPL1 and the first right guide unit GPR1.

The second left guide unit GPL2 and the second right guide unit GPR2 may be disposed to be closer to the lateral center of the roller 151 than the first left guide unit GPL1 and the first right guide unit GPR1. Specifically, the back cover 2410 may have trapezoidal shape in which a width becomes narrower from the lower end to the upper end. Therefore, the width between the first left guide unit GPL1 and the first right guide unit GPR1 which enclose the left edge and the right edge in a lower end area of the back cover 2410 may be larger than the width between the second left guide unit GPL2 and the second right guide unit GPR2 which enclose the left edge and the right edge in a center area of the back cover 2410. Therefore, the second left guide unit GPL2 and the second right guide unit GPR2 may be disposed to be closer to the lateral center of the back cover 2410 than the first left guide unit GPL1 and the first right guide unit GPR1.

With the first left guide unit GPL1 and the first right guide unit GPR1, the second left guide unit GPL2, and the second right guide unit GPR2 in a state of being wound around the roller 151, the third left guide unit GPL3 and the third right guide unit GPR3 may be wound on the center portion of the back cover 2410 bewteen the second left guide unit GPL2 and the second right guide unit GPR2. Further, the third left guide unit GPL3 and the third right guide unit GPR3 may be disposed not to overlap the second left guide unit GPL2 and the second right guide unit GPR2, but to overlap the center portion of the back cover 2410 between the second left guide unit GPL2 and the second right guide unit GPR2.

The third left guide unit GPL3 and the third right guide unit GPR3 may be disposed to be closer to the lateral center of the roller 151 than the second left guide unit GPL2 and the second right guide unit GPR2. Specifically, a width of the upper end portion of the back cover 2410 in which the third left guide unit GPL3 and the third right guide unit GPR3 are disposed may be smaller than a width of the center portion of the back cover 2410 in which the second left guide unit GPL2 and the second right guide unit GPR2. Therefore, the third left guide unit GPL3 and the third right guide unit GPR3 may be disposed to be closer to the lateral center of the back cover 2410 than the second left guide unit GPL2 and the second right guide unit GPR2.

When the back cover 2410 is wound around the roller 151, the uppermost portions of the first left guide unit GPL1 and the first right guide unit GPR1 protrude from the outer circumferential surface of the roller 151 beyond the respective lower surfaces of the second left guide unit GPL2 and the second right guide unit GPR2, respectively. Therefore, when the back cover 2410 is wound, the second left guide unit GPL2 and the second right guide unit GPR2 may be disposed between the first left guide unit GPL1 and the first right guide unit GPR1, without moving laterally outside the first left guide unit GPL1 or the first right guide unit GPR1.

Further, the protruding sides of the first left guide unit GPL1 and the first right guide unit GPR1 may be in contact with outer sides of the second left guide unit GPL2 and the second right guide unit GPR2, respectively. Therefore, when the back cover 2410 is wound around the roller 151, the second left guide unit GPL2 and the second right guide unit GPR2 may be guided to be disposed between the first left guide unit GPL1 and the first right guide unit GPR1 while being in contact with the respective inner sides of the first left guide unit GPL1 and the first right guide unit GPR1. Therefore, when the back cover 2410 is wound, the first left guide unit GPL1 and the first right guide unit GPR1 which protrude toward the front surface of the back cover 2410 may guide the center portion of the back cover 2410 in which the second left guide unit GPL2 and the second right guide unit GPR2 are disposed to be stably wound around the roller 151.

Similarly, in a state in which the back cover 2410 is wound around the roller 151, the uppermost portions of the second left guide unit GPL2 and the second right guide unit GPR2 may protrude beyond the lower surfaces of the third left guide unit GPL3 and the third right guide unit GPR3, respectively. Therefore, when the back cover 2410 is wound, the third left guide unit GPL3 and the third right guide unit GPR3 may be disposed between the second left guide unit GPL2 and the second right guide unit GPR2, without moving laterally outside of the second left guide unit GPL2 or the second right guide unit GPR2.

Further, the protruding sides of the second left guide unit GPL2 and the second right guide unit GPR2 may be in contact with outer sides of the third left guide unit GPL3 and the third right guide unit GPR3, respectively. Therefore, when the back cover 2410 is wound around the roller 151, the third left guide unit GPL3 and the third right guide unit GPR3 may be guided to be disposed between the second left guide unit GPL2 and the second right guide unit GPR2 while being in contact with the inner sides of the second left guide unit GPL2 and the second right guide unit GPR2, respectively. Therefore, when the back cover 2410 is wound, the second left guide unit GPL2 and the second right guide unit GPR2 which protrude toward the front surface of the back cover 2410 may guide the upper end portion of the back cover 2410 in which the third left guide unit GPL3 and the third right guide unit GPR3 are disposed to be stably wound around the roller 151.

In the display device according to still another exemplary embodiment of the present disclosure, a left guide unit GPL and a right guide unit GPR may be provided to enclose the thin and possibly sharp left edge and right edge of the back cover 2410, respectively. Otherwise, there is a risk that users or operators of the display device may be injured by the thin and sharp edge of the back cover 2410. Further, the thin back cover 2410 may be vulnerable to impacts from the outside so that the back cover 2410 may be deformed. In this case, the left guide unit GPL and the right guide unit GPR which enclose the thin and sharp edges of the back cover 2410 may be formed to have a gentle curved surface, may be formed of a material which is more flexible than the back cover 2410, and may be formed to be thicker than the back cover 2410. Therefore, it is possible to prevent or mitigate the thin and sharp edges of the back cover 2410. Further, the left guide unit GPL and the right guide unit GPR may be thicker than the back cover 2410 and the display panel 120 combined so that the rigidity of the left edge and the right edge of the back cover 2410 may be enhanced. Therefore, even if the external force is applied to the side of the back cover 2410, the deformation of the back cover 2410 may be minimized.

Further, in the display device according to still another exemplary embodiment of the present disclosure, since the back cover 2410 is formed to have a trapezoidal shape, the left guide unit GPL (including, e.g., GPL1, GPL2, and GPL3) and the right guide unit GPR (including, e.g., GPR1, GPR2, and GPR3) which protrude toward the front surface of the back cover 2410 may be wound around the roller 151 without interfering with each other. The back cover 2410 may have a trapezoidal shape in which a length of a lower edge in the row direction is larger than a length of an upper edge in the row direction. Specifically, the back cover 2410 may have a trapezoidal shape in which a width becomes narrower from the lower end to the upper end. In this case, the lower edge of the back cover 2410 may be fastened with the roller 151 to be wound around the roller 151 from the lower end of the back cover 2410. Therefore, the first left guide unit GPL1 and the first right guide unit GPR1 may be first wound around the roller 151, and then the second left guide unit GPL2 and the second right guide unit GPR2 may be wound. Further, the width between the first left guide unit GPL1 and the first right guide unit GPR1 is larger than the width between the second left guide unit GPL2 and the second right guide unit GPR2. Therefore, the first left guide unit GPL1 and the first right guide unit GPR1 may not overlap the second left guide unit GPL2 and the second right guide unit GPR2. Next, after the second left guide unit GPL2 and the second right guide unit GPR2 are wound, the third left guide unit GPL3 and the third right guide unit GPR3 may be wound. Further, the width between the second left guide unit GPL2 and the second right guide unit GPR2 may be larger than the width between the third left guide unit GPL3 and the third right guide unit GPR3. Therefore, the second left guide unit GPL2 and the second right guide unit GPR2 may not overlap the third left guide unit GPL3 and the third right guide unit GPR3. Therefore, in the display device according to still another exemplary embodiment of the present disclosure, when the back cover 2410 is wound around the roller 151, even if another part of the back cover 2410 is further wound with the left guide unit GPL (including, e.g., GPL1, GPL2, and GPL3) and the right guide unit GPR (including, e.g., GPR1, GPR2, and GPR3) protruding toward the front surface of the back cover 2410, the width between the left guide unit GPL and the right guide unit GPR becomes smaller from the lower end to the upper end of the back cover 2410. Therefore, the rear surface of the back cover 2410 and the left guide unit GPL and the right guide unit GPR do not interfere with each other.

In addition, in the display device according to still another exemplary embodiment of the present disclosure, the left guide unit GPL (including, e.g., GPL1, GPL2, and GPL3) and the right guide unit GPR (including, e.g., GPR1, GPR2, and GPR3) may be disposed to guide the back cover 2410 to be wound and unwound. Specifically, with the back cover 2410 in a state of being wound, the first left guide unit GPL1 and the second left guide unit GPL2 on the first left guide unit GPL1 may be wound without overlapping each other while the inner side of the first left guide unit GPL1 is in contact with the outer side of the second left guide unit GPL2. Further, an upper surface of the first left guide unit GPL1 may be disposed to be higher than a lower surface of the second left guide unit GPL2 with respect to the outer circumferential surface of the roller 151. Therefore, the second left guide unit GPL2 may be guided to be inside the first left guide unit GPL1 by a part of the upper end of the first left guide unit GPL1 without moving outside of the first left guide unit GPL1. Further, an upper surface of the first right guide unit GPR1 may be disposed to be higher than a lower surface of the second right guide unit GPR2, from the outer circumferential surface of the roller 151. The first right guide unit GPR1 and the second right guide unit GPR2 may be wound with the inner side of the first right guide unit GPR1 and the outside of the second right guide unit GPR2 in contact with each other. Therefore, the second right guide unit GPR2 may be guided to be inside the first right guide unit GPR1 by a part of the upper end of the first right guide unit GPR1 without moving outside of the first right guide unit GPR1. Likewise, the second left guide unit GPL2 and the second right guide unit GPR2 may guide the third left guide unit GPL3 and the third right guide unit GPR3, respectively, to be disposed between the second left guide unit GPL2 and the second right guide unit GPR2. Therefore, in the display device according to still another exemplary embodiment of the present disclosure, as the left guide unit GPL (including, e.g., GPL1, GPL2, and GPL3) and the right guide unit GPR (including, e.g., GPR1, GPR2, and GPR3) are wound with their respective inner and outer sides in contact with each other, it is possible to guide the back cover 2410 to be wound and unwound. Therefore, when the back cover 2410 is wound around or unwound from the roller 151, it is possible to minimize deviation of the back cover 2410 from a designed position while being wound or unwound.

Figure 26:
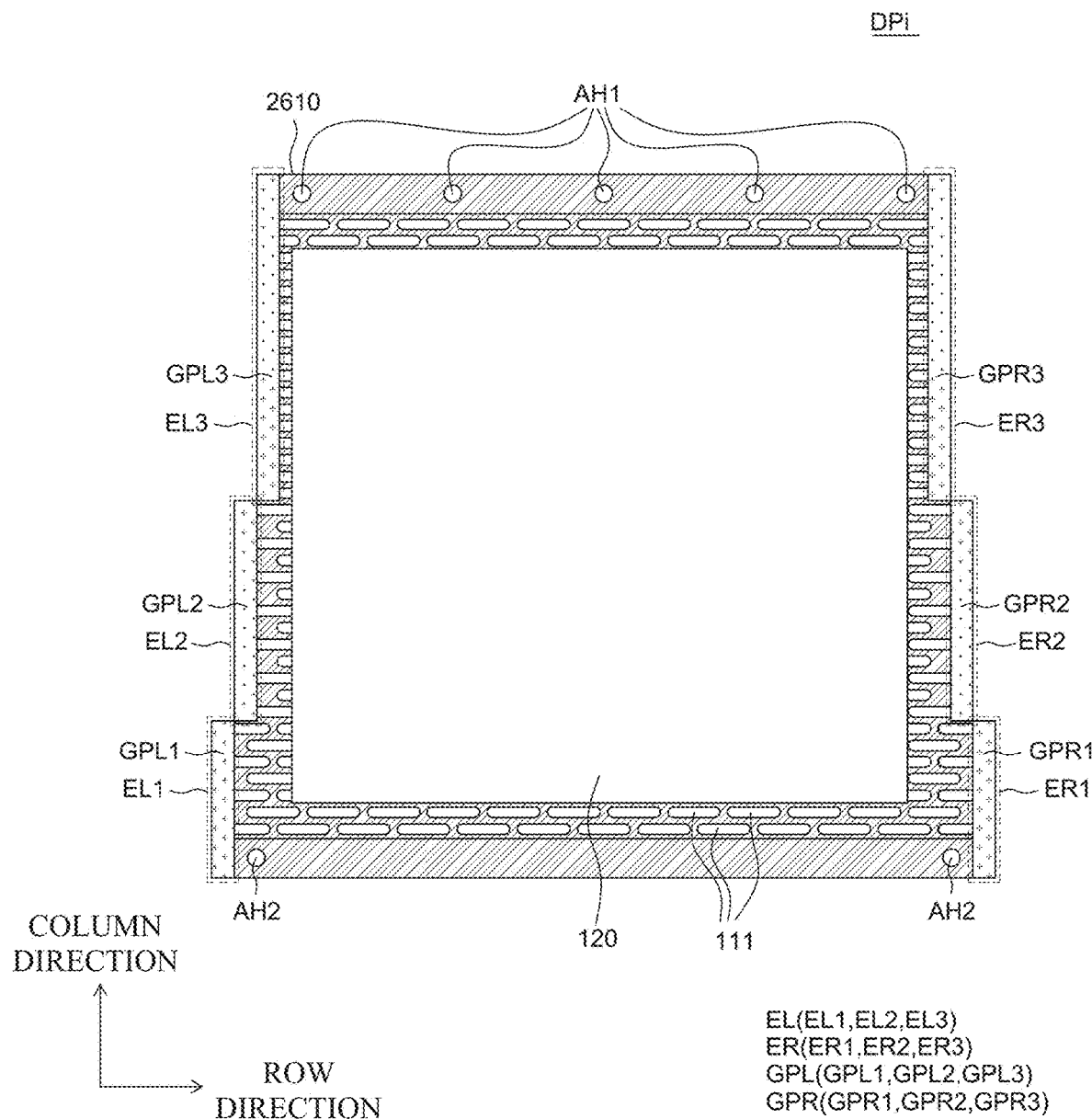
FIG. 26 is a plan view of a display unit of a display device according to still another exemplary embodiment of the present disclosure.

FIG. 26 is a plan view of a back cover of a display device according to still another exemplary embodiment of the present disclosure. With the exception of a back cover 2610 being different, other configurations of the example display unit DPi of FIG. 26 may be substantially the same as the example display unit DPh of FIGS. 24 and 25. Thus, a redundant description will be omitted.

As shown in FIG. 26, a left edge and a right edge of the back cover 2610 may be formed to have a stepped shape. Further, a width between a first left portion EL1 and a first right portion ER1 of the back cover 2610 may be constant. Likewise, a width between a second left portion EL2 and a second right portion ER2 of the back cover 2610 may be constant, and a width between a third left portion EL3 and a third right portion ER3 of the back cover 2610 may be constant. Therefore, a width between a first left guide unit GPL1 and a first right guide unit GPR1 may also be constant, a width between a second left guide unit GPL2 and a second right guide unit GPR2 may also be constant, and a width between a third left guide unit GPL3 and a third right guide unit GPR3 may also be constant.

A width between the first left portion EL1 and the first right portion ER1 in the row direction at a lower edge of the back cover 2610 may be larger than a width between the third left portion EL3 and the third right portion ER3 at an upper edge of the back cover 2610. The width between the first left portion EL1 and the first right portion ER1 of the back cover 2610 in the row direction may be the largest, and the width between the third left portion EL3 and the third right portion ER3 of the back cover 2610 in the row direction may be the smallest. That is, the width between the first left portion EL1 and the first right portion ER1 of the back cover 2610, the width between the second left portion EL2 and the second right portion ER2 of the back cover 2610, and the width between the third left portion EL3 and the third right portion ER3 of the back cover 2610 may become smaller in this order. Further, the width between the first left guide unit GPL1 and the first right guide unit GPR1, the width between the second left guide unit GPL2 and the second right guide unit GPR2, and the width between the third left guide unit GPL3 and the third right guide unit GPR3 may become smaller in this order.

Since the width between the first left guide unit GPL1 and the first right guide unit GPR1 is larger than the width between the second left guide unit GPL2 and the second right guide unit GPR2, the first left guide unit GPL1 and the first right guide unit GPR1 may not interfere with the rear surface of the back cover 2610. Specifically, the first left guide unit GPL1 and the first right guide unit GPR1 may be first wound around the roller 151. Next, with the first left guide unit GPL1 and the first right guide unit GPR1 in a state of being wound around the roller 151, the second left guide unit GPL2 and the second right guide unit GPR2 may be wound on a lower end portion of the back cover 2610 between the first left guide unit GPL1 and the first right guide unit GPR1. In this case, since the width between the first left guide unit GPL1 and the first right guide unit GPR1 is larger than the width between the second left guide unit GPL2 and the second right guide unit GPR2, the second left guide unit GPL2 and the second right guide unit GPR2 may not overlap the first left guide unit GPL1 and the first right guide unit GPR1. Further, the second left guide unit GPL2 and the second right guide unit GPR2 may be disposed to overlap a lower end portion of the back cover 2610 between the first left guide unit GPL1 and the first right guide unit GPR1. Therefore, the first left guide unit GPL1 and the first right guide unit GPR1 may be disposed outside the second left guide unit GPL2 and the second right guide unit GPR2 in the center portion of the back cover 2610 so as not to interfere with the rear surface of the center portion of the back cover 2610.

Since the width between the second left guide unit GPL2 and the second right guide unit GPR2 is larger than the width between the third left guide unit GPL3 and the third right guide unit GPR3, the second left guide unit GPL2 and the second right guide unit GPR2 may not interfere with the rear surface of the back cover 2610. Specifically, with the second left guide unit GPL2 and the second right guide unit GPR2 in a state of being wound around the roller 151, the third left guide unit GPL3 and the third right guide unit GPR3 may be wound on the center portion of the back cover 2610 between the second left guide unit GPL2 and the second right guide unit GPR2. In this case, since the width between the second left guide unit GPL2 and the second right guide unit GPR2 is larger than the width between the third left guide unit GPL3 and the third right guide unit GPR3, the third left guide unit GPL3 and the third right guide unit GPR3 may not overlap the second left guide unit GPL2 and the second right guide unit GPR2. Further, the third left guide unit GPL3 and the third right guide unit GPR3 may be disposed to overlap the center portion of the back cover 2610 between the second left guide unit GPL2 and the second right guide unit GPR2. Therefore, the second left guide unit GPL2 and the second right guide unit GPR2 may be disposed outside the third left guide unit GPL3 and the third right guide unit GPR3 in the upper end portion of the back cover 2610 so as not to interfere with the rear surface of the upper end portion of the back cover 2610.

Also, lengths of the second left guide unit GPL2 and the second right guide unit GPR2 in the column direction may be larger than lengths of the first left guide unit GPL1 and the first right guide unit GPR1, respectively. Further, lengths of the third left guide unit GPL3 and the third right guide unit GPR3 in the column direction may be larger than the lengths of the second left guide unit GPL2 and the second right guide unit GPR2, respectively.

In this case, the respective lengths in the column direction of the first left guide unit GPL1 and the first right guide unit GPR1, of the second left guide unit GPL2 and the second right guide unit GPR2, and of the third left guide unit GPL3 and the third right guide unit GPR3 may be determined based on a length in the column direction of the back cover 2610 needed to wind around the roller 151 once. Specifically, the more the back cover 2610 is already wound around the roller, the larger the length of the back cover 2610 required to wind around the roller 151 once more due to the increased thickness of the wound back cover 2610 and display panel 120.

For example, the respective lengths of the first left guide unit GPL1 and the first right guide unit GPR1 in the column direction may be equal to the length of the back cover 2610 wound once around the roller 151. In this case, a circumference of the roller 151, determined based on a radius of the roller 151 around which the back cover 2610 is wound, may correspond to the respective lengths of the first left guide unit GPL1 and the first right guide unit GPR1. That is, the respective lengths of the first left guide unit GPL1 and the first right guide unit GPR1 may be designed based on the length of the back cover 2610 wound once around the roller 151.

The respective lengths of the second left guide unit GPL2 and the second right guide unit GPR2 may be equal to a second winding length of the back cover 2610 around the roller 151. In this case, since the lower end portion of the back cover 2610 is already wound around the roller 151, the respective lengths of the second left guide unit GPL2 and the second right guide unit GPR2 may correspond to the circumference of the roller 151 with the lower end portion of the back cover 2610 wound around the roller 151. Therefore, the respective lengths of the second left guide unit GPL2 and the second right guide unit GPR2 may be larger than the respective lengths of the first left guide unit GPL1 and the first right guide unit GPR1. That is, the respective lengths of the second left guide unit GPL2 and the second right guide unit GPR2 may be designed based on the length of the back cover 2610 wound around the roller 151 the second time.

The respective lengths of the third left guide unit GPL3 and the third right guide unit GPR3 may be equal to a third winding length of the back cover 2610 around the roller 151. Since the lower end portion and the center portion of the back cover 2610 are already wound around the roller 151, the respective lengths of the third left guide unit GPL3 and the third right guide unit GPR3 correspond to the circumference of the roller 151 with the lower end portion and the center portion of the back cover 2610 wound around the roller 151. Therefore, the respective lengths of the third left guide unit GPL3 and the third right guide unit GPR3 may be larger than the respective lengths of the second left guide unit GPL2 and the second right guide unit GPR2. That is, the respective lengths of the third left guide unit GPL3 and the third right guide unit GPR3 may be designed based on a length of the back cover 2610 wound around the roller 151 the third time.

In FIG. 26, the back cover 2610 is illustrated as divided into a lower end portion, a center portion, and an upper end portion based on an example case in which the back cover 2610 is wound three times around the roller 151. However, embodiments are not limited to this particular example, and the back cover 2610 may be divided into a larger or smaller number of areas depending on the number of times that the back cover 2610 is wound around the roller 151.

In the display device according to still another exemplary embodiment of the present disclosure, the left edge and the right edge of the back cover 2610 each may be formed to have a stepped shape. Therefore, the left guide unit GPL (including, e.g., GPL1, GPL2, and GPL3) and the right guide unit GPR (including, e.g., GPR1, GPR2, and GPR3) protruding toward the front surface of the back cover 2610 may be wound around the roller 151 without interfering with each other. Therefore, the first left guide unit GPL1 and the first right guide unit GPR1 may first be wound around the roller 151, and then the second left guide unit GPL2 and the second right guide unit GPR2 may be wound. Further, the width between the first left guide unit GPL1 and the first right guide unit GPR1 in the row direction may be larger than the width between the second left guide unit GPL2 and the second right guide unit GPR2. Therefore, the first left guide unit GPL1 and the first right guide unit GPR1 may not overlap the second left guide unit GPL2 and the second right guide unit GPR2, respectively. Next, with the second left guide unit GPL2 and the second right guide unit GPR2 in a state of being wound, the third left guide unit GPL3 and the third right guide unit GPR3 may be wound as a third turn. Further, the width between the second left guide unit GPL2 and the second right guide unit GPR2 in the row direction may be larger than the width between the third left guide unit GPL3 and the third right guide unit GPR3. Therefore, the second left guide unit GPL2 and the second right guide unit GPR2 may not overlap the third left guide unit GPL3 and the third right guide unit GPR3, respectively. Accordingly, in the display device according to still another exemplary embodiment of the present disclosure, the back cover 2610 may have a stepped shape, so that the rear surface of the back cover 2610 and the left guide unit GPL and the right guide unit GPR may not interfere with each other.

In the display device according to still another exemplary embodiment of the present disclosure, the left edge and the right edge of the back cover 2610 may have a stepped shape based on the length in the column direction of the back cover 2610 wound once around the roller 151. Therefore, the left guide unit GPL and the right guide unit GPR protruding toward the front surface of the back cover 2610 may guide the back cover 2610 to be wound and unwound. For example, when the roller 151 makes one rotation, the first left guide unit GPL1 and the first right guide unit GPR1 of the back cover 2610 may be wound around the roller 151. When the roller 151 makes a second rotation, the second left guide unit GPL2 and the second right guide unit GPR2 of the back cover 2610 may be wound on the lower end portion of the back cover 2610 between the first left guide unit GPL1 and the first right guide unit GPR1. In this case, the width between the first left guide unit GPL1 and the first right guide unit GPR1 in the row direction may be larger than the width between the second left guide unit GPL2 and the second right guide unit GPR2. Therefore, the second left guide unit GPL2 and the second right guide unit GPR2 may be disposed between the first left guide unit GPL1 and the first right guide unit GPR1. When the roller 151 makes a third rotation, the third left guide unit GPL3 and the third right guide unit GPR3 of the back cover 2610 may be wound on the center portion of the back cover 2610 between the second left guide unit GPL2 and the second right guide unit GPR2. Further, the width between the second left guide unit GPL2 and the second right guide unit GPR2 may be larger than the width between the third left guide unit GPL3 and the third right guide unit GPR3. Therefore, the third left guide unit GPL3 and the third right guide unit GPR3 may be disposed between the second left guide unit GPL2 and the second right guide unit GPR2. In this case, the first left guide unit GPL1 and the first right guide unit GPR1 protrude beyond than the lower surface of the second left guide unit GPL2 and the second right guide unit GPR2 to guide the second left guide unit GPL2 and the second right guide unit GPR2 to be disposed between the first left guide unit GPL1 and the first right guide unit GPR1. Similarly, the second guide unit GPL2 and the second right guide unit GPR2 protrude beyond than the lower surface of the third left guide unit GPL3 and the third right guide unit GPR3 to guide the third left guide unit GPL3 and the third right guide unit GPR3 to be disposed between the second left guide unit GPL2 and the second right guide unit GPR2. Therefore, in the display device according to still another exemplary embodiment of the present disclosure, the left guide unit GPL and the right guide unit GPR protruding toward the front surface of the back cover 2610 may guide the back cover 2610 to be wound around or unwound from the roller 151.

The exemplary embodiments of the present disclosure also include at least the following:

In an example embodiment according to one aspect of the present disclosure, a display device may comprise: a display panel including a display area on which a plurality of display elements is disposed and a non-display area on which one or more wires for driving the plurality of display elements are disposed; a back cover attached to one surface of the display panel and having a plurality of openings; a roller unit which winds or unwinds the back cover and the display panel; and a lifting unit which moves the back cover and the display panel in a vertical direction. Further, the plurality of openings may overlap the display panel, each of the plurality of openings may be disposed to be staggered with one or more of the openings in an adjacent row, a size of the back cover may be larger than a size of the display panel, and each of a plurality of edges of the back cover may correspond to a respective one of a plurality of edges of the display panel and may protrude outside of the respective one of the plurality of edges of the display panel.

In an example embodiment, the above display device may further comprise a housing unit which accommodates the back cover and the display panel.

In an example embodiment, the back cover may include: a first support area at an upper area of the back cover; a second support area fastened with the roller unit at a lower area of the back cover; and a malleable area between the first support area and the second support area. The plurality of openings may be disposed in the malleable area.

In an example embodiment, the malleable area may include; a first malleable area extending from the first support area toward the lower area of the back cover; a third malleable area extending from the second support area toward the upper area of the back cover; and a second malleable area between the first malleable area and the third malleable area. The back cover may further include: a third support area between the first malleable area and the second malleable area; and a fourth support area between the second malleable area and the third malleable area.

In an example embodiment, the above display device may further comprise: a flexible film disposed at one end of the display panel; and a printed circuit board connected to the flexible film. The display panel may be disposed in the third support area and the second malleable area. The flexible film and the printed circuit board may overlap the fourth support area.

In an example embodiment, with the back cover and the display panel fully wound around the roller unit, the third support area may be flat.

In an example embodiment, a first fastening hole may be disposed in the first support area to fasten the first support area and the lifting unit with each other, and a second fastening hole may be disposed in the second support area to fasten the second support area and the roller unit with each other. Each of the first fastening hole and the second fastening hole may have a shape different from a shape of the plurality of openings.

In an example embodiment, the lifting unit may include a head bar fastened to the first fastening hole in the first support area. With the head bar fastened to the first fastening hole, a stress concentrated on the first fastening hole may be relieved in the first malleable area.

In an example embodiment, the lifting unit may include a head bar fastened to the first fastening hole of the first support area and bent in an inverted L shape. The first malleable area may be bent in the same shape as the head bar.

In an example embodiment, the malleable area may include a plurality of reinforcement areas which extends in a length direction of the plurality of openings and is disposed to be spaced apart from each other. The plurality of openings may be disposed in an area of the malleable area other than the plurality of reinforcement areas.

In an example embodiment, a maximum width MW of each of the plurality of reinforcement areas for a width direction of the plurality of openings may be determined by a following equation: $MW-2\times[\sqrt{(R+t1+t2\times a)^2-(R+t1)^2}]$, wherein t1 is a thickness of the back cover, t2 is a thickness of an adhesive layer disposed between the back cover and the display panel, "a" is a compressibility of the adhesive layer, and R is a radius of a roller of the roller unit.

In an example embodiment, the back cover may further include a plurality of protrusions in the plurality of reinforcement areas on a surface of the back cover opposite to a surface facing the display panel.

In an example embodiment, the plurality of protrusions may have at least one of a rectangular shape, a sine wave shape, and a zigzag pattern.

In an example embodiment, a distance between an uppermost portion and a lowermost portion of the plurality of protrusions may be equal to or smaller than the maximum width of the plurality of reinforcement areas.

In an example embodiment, the malleable area may include an edge reinforcement area extending in a width direction of the plurality of openings and defined at an edge of the malleable area. A width of one of the openings in the edge reinforcement area may be smaller than a width of one of the openings in the malleable area outside the edge reinforcement area.

In an example embodiment, the plurality of openings may have at least one of a rectangular shape, an oval shape, a ribbon shape, a dumbbell shape, and a rhombus shape.

In an example embodiment according to another aspect of the present disclosure, a display device may comprise: a display panel including a display area on which a plurality of display elements is disposed and a non-display area on which one or more wires for driving the plurality of display elements are disposed; a back cover supporting the display panel and having a plurality of openings; a housing unit configured to accommodate the display panel and the back cover; a roller unit configured to wind or unwind the display panel and the back cover in a column direction; and a lifting unit configured to move the display panel and the back cover in or out of the housing unit. Further, a width of the plurality of openings in the column direction may be smaller than a width of the plurality of openings in a row direction, a size of the back cover may be larger than a size of the display panel, and each of a plurality of edges of the back cover may correspond to a respective one of a plurality of edges of the display panel and may protrude outside of the respective one of the plurality of edges of the display panel.

In an example embodiment, boundaries of the plurality of openings may extend in a direction different from the row direction.

In an example embodiment, boundaries of the plurality of openings may have a curved surface.

In an example embodiment, the back cover may include: a first support area at one end of the back cover fastened with the lifting unit; a second support area at the other end of the back cover fastened with the roller unit; a first malleable area extending from the first support area toward the second support area; a third support area extending from the first malleable area toward the second support area; a second malleable area extending from the third support area toward the second support area; a fourth support area extending from the second malleable area toward the second support area; and a third malleable area between the fourth support area and the second support area. The plurality of openings may be disposed in the first malleable area, the second malleable area, and the third malleable area.

In an example embodiment, the above display device may further comprise a flexible film and a printed circuit board which are electrically connected to the display panel and overlap the fourth support area. The display panel may overlap the third support area and the second malleable area.

In an example embodiment, with the back cover in a fully unwound state, the first support area, the first malleable area, the third support area, and the second malleable area may be disposed outside the housing unit, and the fourth support area, the third malleable area, and the second support area may be disposed in the housing unit.

In an example embodiment, the second malleable area may include a plurality of reinforcement areas extending in the row direction and disposed to be spaced apart from each other. The plurality of openings may be disposed in an area of the second malleable area other than the plurality of reinforcement areas.

In an example embodiment, a width of the plurality of reinforcement areas in the column direction may be smaller than a distance between the plurality of reinforcement areas in the column direction.

In an example embodiment, the back cover may further include a plurality of protrusions each protruding from one surface of a respective one of the plurality of reinforcement areas. The display panel may be disposed on an opposite surface of the one surface.

In an example embodiment, the plurality of protrusions may be configured to be integrated with the plurality of reinforcement areas.

In an example embodiment according to yet another aspect of the present disclosure, a rollable display device may comprise: a flexible display panel including a display area on which a plurality of display elements is disposed and a non-display area on which one or more wires for driving the plurality of display elements are disposed; a back cover which is larger than the flexible display panel and is attached to one surface of the flexible display panel; a roller unit which winds or unwinds the back cover and the flexible display panel; and a lifting unit which moves the back cover and the display panel in a vertical direction. The back cover may include a first support area, a second support area, and a malleable area disposed between the first support area and the second support area and having a plurality of openings. The flexible display panel may be disposed in the malleable area. Each of a plurality of edges of the back cover may protrude outside of the non-display area of the flexible display panel.

In an example embodiment, the back cover may further include: a second malleable area disposed between the first support area and the malleable area; a third malleable area disposed between the second support area and the malleable area; a third support area disposed between the second malleable area and the malleable area; and a fourth support area disposed between the third malleable area and the malleable area. The plurality of openings may be further disposed in the second malleable area and the third malleable area.

In an example embodiment, the above rollable display device may further comprise a flexible film disposed at one end of the flexible display panel, and a printed circuit board connected to the flexible film. The flexible display panel may be disposed in the third support area and the malleable area. The flexible film and the printed circuit board may be disposed in the fourth support area.

In an example embodiment, a first fastening hole may be disposed in the first support area to fasten the first support area and the lifting unit with each other.

In an example embodiment, a second fastening hole may be disposed in the second support area to fasten the second support area and the roller unit with each other.

In an example embodiment, the malleable area may include a plurality of reinforcement areas extending in a length direction of the plurality of openings and disposed to be spaced apart from each other. The plurality of openings may be disposed in an area of the malleable area other than the plurality of reinforcement areas.

In an example embodiment, the back cover may further include a plurality of protrusions in the plurality of reinforcement areas and on a surface of the back cover opposite to a surface facing the flexible display panel.

In an example embodiment, a width of the plurality of openings in a column direction may be smaller than a width of the plurality of openings in a row direction.

In an example embodiment, the malleable area may include an edge reinforcement area extending in a width direction of the plurality of openings and defined at an edge of the malleable area. A width of one of the openings in the edge reinforcement area may be smaller than a width of one of the openings in the malleable area outside the edge reinforcement area.

Although the exemplary embodiments of the present disclosure are described above in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only and are not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following appended claims, and all the technical concepts in the equivalent scope thereof should be construed as falling within the scope of the present disclosure.

It will be apparent to those skilled in the art that various modifications and variations can be made in the display device of the present disclosure without departing from the spirit or scope of the disclosure. Thus, it is intended that the present disclosure cover the modifications and variations of this disclosure provided they come within the scope of the appended claims and their equivalents.

What is claimed is:

1. A display device, comprising:
   a display panel including a display area on which a plurality of display elements is disposed and a non-display area on which one or more wires for driving the plurality of display elements are disposed;
   a back cover attached to one surface of the display panel and having a plurality of openings;
   a roller configured to rotate in a first direction to wind the back cover and the display panel around the roller or in a second direction opposite the first direction to unwind the back cover and the display panel from the roller, the roller being a cylindrically-shaped roller with a flat surface along a length direction of the roller; and
   a lifting unit which moves the back cover and the display panel in a vertical direction, wherein: the plurality of openings overlaps the display panel, each of the plurality of openings is disposed to be staggered with one or more of the openings in an adjacent row, a size of the back cover is larger than a size of the display panel, and each of a plurality of edges of the back cover corresponds to a respective one of a plurality of edges of the display panel and protrudes outside of the respective one of the plurality of edges of the display panel.

2. The display device according to claim 1, further comprising:
   a housing which accommodates the back cover and the display panel.

3. The display device according to claim 2, wherein the back cover includes:
   a first support area at an upper area of the back cover;
   a second support area fastened with the roller at a lower area of the back cover; and
   a malleable area between the first support area and the second support area,
   wherein the plurality of openings is disposed in the malleable area.

4. The display device according to claim 3, wherein the malleable area includes:
   a first malleable area extending from the first support area toward the lower area of the back cover;
   a third malleable area extending from the second support area toward the upper area of the back cover; and
   a second malleable area between the first malleable area and the third malleable area, and
   wherein the back cover further includes:
   a third support area between the first malleable area and the second malleable area; and
   a fourth support area between the second malleable area and the third malleable area.

5. The display device according to claim 4, further comprising:
   a flexible film disposed at one end of the display panel; and
   a printed circuit board connected to the flexible film,
   wherein the display panel is disposed in the third support area and the second malleable area, and
   wherein the flexible film and the printed circuit board overlap the fourth support area.

6. The display device according to claim 5, wherein, with the back cover and the display panel fully wound around the roller, the third support area is flat.

7. The display device according to claim 4, wherein:
   a first fastening hole is disposed in the first support area to fasten the first support area and the lifting unit with each other,
   a second fastening hole is disposed in the second support area to fasten the second support area and the roller with each other, and
   each of the first fastening hole and the second fastening hole has a shape different from a shape of the plurality of openings.

8. The display device according to claim 7, wherein the lifting unit includes a head bar fastened to the first fastening hole in the first support area, and wherein, with the head bar fastened to the first fastening hole, a stress concentrated on the first fastening hole is relieved in the first malleable area.

9. The display device according to claim 7, wherein the lifting unit includes a head bar fastened to the first fastening hole of the first support area and bent in an inverted L shape, and
wherein the first malleable area is bent in the same shape as the head bar.

10. The display device according to claim 3, wherein the malleable area includes a plurality of reinforcement areas which extends in a length direction of the plurality of openings and is disposed to be spaced apart from each other, and
wherein the plurality of openings is disposed in an area of the malleable area other than the plurality of reinforcement areas.

11. The display device according to claim 10, wherein a maximum width MW of each of the plurality of reinforcement areas for a width direction of the plurality of openings is determined by a following equation:

$$MW=2\times[\sqrt{(R+t1+t2\times a)^2-(R+t1)^2}],$$

wherein t1 is a thickness of the back cover, t2 is a thickness of an adhesive layer disposed between the back cover and the display panel, "a" is a compressibility of the adhesive layer, and R is a radius of a roller.

12. The display device according to claim 10, wherein the back cover further includes a plurality of protrusions in the plurality of reinforcement areas on a surface of the back cover opposite to a surface facing the display panel.

13. The display device according to claim 12, wherein the plurality of protrusions has at least one of a rectangular shape, a sine wave shape, and a zigzag pattern.

14. The display device according to claim 13, wherein a distance between an uppermost portion and a lowermost portion of the plurality of protrusions is equal to or smaller than a maximum width of the plurality of reinforcement areas.

15. The display device according to claim 3, wherein the malleable area includes an edge reinforcement area extending in a width direction of the plurality of openings and defined at an edge of the malleable area, and
wherein a width of one of the openings in the edge reinforcement area is smaller than a width of one of the openings in the malleable area outside the edge reinforcement area.

16. The display device according to claim 1, wherein the plurality of openings has at least one of a rectangular shape, an oval shape, a ribbon shape, a dumbbell shape, and a rhombus shape.

17. The rollable display device according to claim 1, wherein a lower area of the back cover is fastened to the flat surface of the roller.

18. The rollable display device according to claim 1, wherein the back cover comprises at least one other opening disposed at least partly in an area of the back cover protruding outside of one of the plurality of edges of the display panel.

19. A display device, comprising:
a display panel including a display area on which a plurality of display elements is disposed and a non-display area on which one or more wires for driving the plurality of display elements are disposed;
a back cover supporting the display panel and having a plurality of openings;
a housing configured to accommodate the display panel and the back cover;
a roller configured to rotate in a first direction to wind the display panel and the back cover around the roller or in a second direction opposite the first direction to unwind the display panel and the back cover from the roller, the back cover including a lower portion that contacts the roller in a wound state and does not contact the roller in an unwound state, the lower portion being adjacent to the roller in the unwound state; and
a lifting unit configured to move the display panel and the back cover in or out of the housing,
wherein:
a width of one of the plurality of openings in a column direction is smaller than a width of the one of the plurality of openings in a row direction,
a size of the back cover is larger than a size of the display panel, and
each of a plurality of edges of the back cover corresponds to a respective one of a plurality of edges of the display panel and protrudes outside of the respective one of the plurality of edges of the display panel.

20. The display device according to claim 19, wherein a boundary of the one of the plurality of openings has no straight line segment that is parallel with the row direction.

21. The display device according to claim 19, wherein boundaries of the plurality of openings have a curved surface.

22. The display device according to claim 19, wherein the back cover includes:
a first support area at one end of the back cover fastened with the lifting unit;
a second support area at the other end of the back cover fastened with the roller;
a first malleable area extending from the first support area toward the second support area;
a third support area extending from the first malleable area toward the second support area;
a second malleable area extending from the third support area toward the second support area;
a fourth support area extending from the second malleable area toward the second support area; and
a third malleable area between the fourth support area and the second support area, the third malleable area including the lower portion,
wherein the plurality of openings is disposed in the first malleable area, the second malleable area, and the third malleable area.

23. The display device according to claim 22, further comprising:
a flexible film and a printed circuit board which are electrically connected to the display panel and overlap the fourth support area,
wherein the display panel overlaps the third support area and the second malleable area.

24. The display device according to claim 22, wherein, with the back cover in a fully unwound state:
the first support area, the first malleable area, the third support area, and the second malleable area are disposed outside the housing, and
the fourth support area, the third malleable area, and the second support area are disposed in the housing.

25. The display device according to claim 22, wherein the second malleable area includes a plurality of reinforcement areas extending in the row direction and disposed to be spaced apart from each other, and wherein the plurality of openings is disposed in an area of the second malleable area other than the plurality of reinforcement areas.

26. The display device according to claim 25, wherein a width of the plurality of reinforcement areas in the column direction is smaller than a distance between the plurality of reinforcement areas in the column direction.

27. The display device according to claim 25, wherein the back cover further includes a plurality of protrusions each protruding from one surface of a respective one of the plurality of reinforcement areas, and
wherein the display panel is disposed on an opposite surface of the one surface.

28. The display device according to claim 27, wherein the plurality of protrusions is configured to be integrated with the plurality of reinforcement areas.

29. The rollable display device according to claim 19, wherein the roller has a cylindrical shape with a flat surface along a length direction of the roller, and a lower area of the back cover is connected to the flat surface of the roller.

30. The rollable display device according to claim 19, wherein the back cover comprises at least one other opening disposed at least partly in an area of the back cover protruding outside of one of the plurality of edges of the display panel.

31. A rollable display device, comprising:
a flexible display panel including a display area on which a plurality of display elements is disposed and a non-display area on which one or more wires for driving the plurality of display elements are disposed;
a back cover which is larger than the flexible display panel and is attached to one surface of the flexible display panel;
a roller unit which winds or unwinds the back cover and the flexible display panel; and
a lifting unit which moves the back cover and the display panel in a vertical direction,
wherein:
the back cover includes a first support area, a second support area, and a malleable area disposed between the first support area and the second support area and having a plurality of openings;
the flexible display panel is disposed in the malleable area;
each of a plurality of edges of the back cover protrudes outside of the non-display area of the flexible display panel; and
the openings include:
a plurality of first openings overlapping with the flexible display panel, and
at least one second opening disposed at least partly in an area of the back cover extending beyond a lateral edge of the flexible display panel.

32. The rollable display device according to claim 31, wherein the back cover further includes:

a second malleable area disposed between the first support area and the malleable area;
a third malleable area disposed between the second support area and the malleable area;
a third support area disposed between the second malleable area and the malleable area; and
a fourth support area disposed between the third malleable area and the malleable area,
wherein the plurality of openings is further disposed in the second malleable area and the third malleable area.

33. The rollable display device according to claim 32, further comprising:
a flexible film disposed at one end of the flexible display panel; and
a printed circuit board connected to the flexible film,
wherein the flexible display panel is disposed in the third support area and the malleable area, and
wherein the flexible film and the printed circuit board are disposed in the fourth support area.

34. The rollable display device according to claim 32, wherein a first fastening hole is disposed in the first support area to fasten the first support area and the lifting unit with each other.

35. The rollable display device according to claim 32, wherein a second fastening hole is disposed in the second support area to fasten the second support area and the roller unit with each other.

36. The rollable display device according to claim 31, wherein the malleable area includes a plurality of reinforcement areas extending in a length direction of the plurality of openings and disposed to be spaced apart from each other, and
wherein the plurality of openings is disposed in an area of the malleable area other than the plurality of reinforcement areas.

37. The rollable display device according to claim 36, wherein the back cover further includes a plurality of protrusions in the plurality of reinforcement areas and on a surface of the back cover opposite to a surface facing the flexible display panel.

38. The rollable display device according to claim 31, wherein a width of one of the plurality of openings in a column direction is smaller than a width of the one of the plurality of openings in a row direction.

39. The rollable display device according to claim 31, wherein the malleable area includes an edge reinforcement area extending in a width direction of the plurality of openings and defined at an edge of the malleable area, and
wherein a width of one of the openings in the edge reinforcement area is smaller than a width of one of the openings in the malleable area outside the edge reinforcement area.

* * * * *